(12) United States Patent
Ito

(10) Patent No.: US 9,099,628 B2
(45) Date of Patent: Aug. 4, 2015

(54) SEMICONDUCTOR LIGHT EMITTING DEVICE HAVING PATTERNS

(71) Applicant: ROHM CO., LTD., Kyoto (JP)

(72) Inventor: Yohei Ito, Kyoto (JP)

(73) Assignee: ROHM CO., LTD., Kyoto (JP)

(*) Notice: Subject to any disclaimer, the term of this patent is extended or adjusted under 35 U.S.C. 154(b) by 0 days.

(21) Appl. No.: 14/109,075

(22) Filed: Dec. 17, 2013

(65) Prior Publication Data

US 2014/0166975 A1 Jun. 19, 2014

(30) Foreign Application Priority Data

Dec. 19, 2012 (JP) .................................. 2012-276461

(51) Int. Cl.
*H01L 29/06* (2006.01)
*H01L 33/60* (2010.01)
*H01L 33/22* (2010.01)
*H01L 33/38* (2010.01)

(52) U.S. Cl.
CPC ................ *H01L 33/60* (2013.01); *H01L 33/22* (2013.01); *H01L 33/38* (2013.01)

(58) Field of Classification Search
CPC .......... H01L 33/32; H01L 33/06; B82Y 20/00
USPC ................................ 257/13, E33.001; 438/20
See application file for complete search history.

(56) References Cited

U.S. PATENT DOCUMENTS

| | | | |
|---|---|---|---|
| 5,376,580 A | 12/1994 | Kish et al. | |
| 8,723,158 B2 * | 5/2014 | Jang et al. | ........................ 257/13 |
| 2005/0155507 A1 * | 7/2005 | Vaidyanathan et al. | ....... 101/483 |

FOREIGN PATENT DOCUMENTS

| | | |
|---|---|---|
| JP | 06-302857 A | 10/1994 |
| JP | 2005-347497 A | 12/2005 |

* cited by examiner

*Primary Examiner* — Jami M Valentine
(74) *Attorney, Agent, or Firm* — Rabin & Berdo, P.C.

(57) ABSTRACT

A semiconductor light emitting device includes a substrate structure; a semiconductor layer disposed on the substrate structure, the semiconductor layer including a light emitting layer; and an electrode formed on a surface of the semiconductor layer, wherein a relatively coarse uneven portion and a relatively fine uneven portion are formed by a frost process on a surface of the semiconductor layer at a side of the electrode.

31 Claims, 54 Drawing Sheets

SEMICONDUCTOR LIGHT EMITTING DEVICE HAVING PATTERNS

CROSS-REFERENCE TO RELATED APPLICATION

This application is based upon and claims the benefit of priority from Japanese Patent Application No. 2012-276461, filed on Dec. 19, 2012, the entire contents of which are incorporated herein by reference.

TECHNICAL FIELD

The present disclosure relates to a semiconductor light emitting device, and more particularly, relates to a semiconductor light emitting device achieving improved brightness.

BACKGROUND

Efficiency of light extraction can be improved by performing a frost process on a surface of a semiconductor light emitting device such as a light emitting diode (LED).

In addition, a structure has been suggested in which a metallic reflective layer is formed as a reflective layer of light between a substrate and an active layer including a multi-quantum well (MQW) layer so as to achieve high brightness of an LED. For example, a bonding (or adhering) technique for the substrate in the light emitting diode layer has been employed as a method of forming the above metallic reflective layer.

Further, a method has been used in which a distributed Bragg reflector (DBR) layer is inserted as a reflective layer of light between a substrate and an active (e.g., MQW) layer so as to achieve high brightness of an LED.

SUMMARY

The present disclosure provides some embodiments of a semiconductor light emitting device achieving improved brightness by performing a frost process on a LED device surface a plurality of times.

According to one aspect of the present disclosure, there is provided a semiconductor light emitting device that includes a substrate structure, a semiconductor layer disposed on the substrate structure, the semiconductor layer including a light emitting layer, and an electrode formed on a surface of the semiconductor layer. A relatively coarse uneven portion and a relatively fine uneven portion are formed by a frost process on a surface of the semiconductor layer at a side of the electrode.

DETAILED DESCRIPTION

Figure 1:
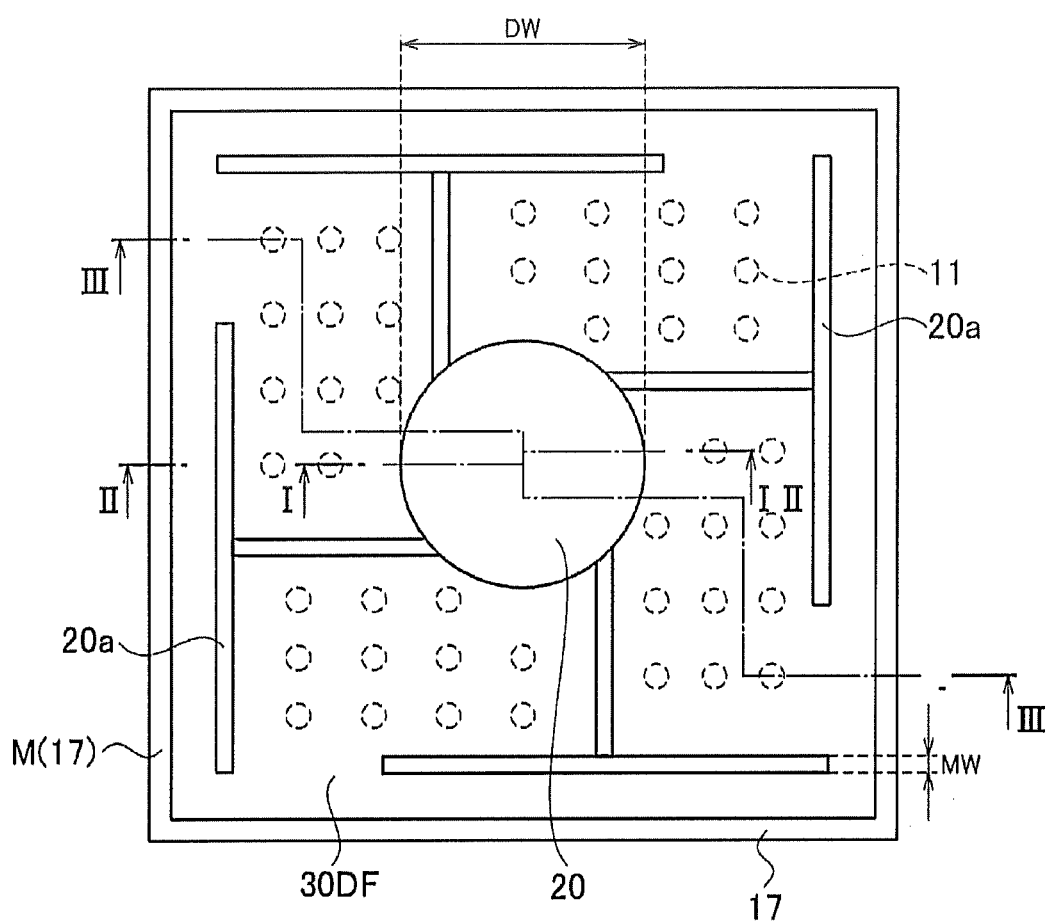
FIG. 1 schematically illustrates a plane pattern configuration of a semiconductor light emitting device according to a first embodiment.

A first embodiment of the present disclosure will be described in detail below with reference to the drawings. In the following description of the drawings, the same or similar parts are denoted by the same or similar reference numerals. However, it should be noted that the drawings are schematic, a relation between the thickness and the planar dimension, a ratio of the thickness of each layer and the like are different from the actual ones. Therefore, specific thicknesses and dimensions should be determined by referring to the following description. Furthermore, it is a matter of course that portions having dimensional relations and ratios different from one another among the drawings are also included.

Furthermore, the first to fourth embodiments which will be described below illustrate apparatuses and methods for embodying the technical idea of the present disclosure, and the embodiments of the present disclosure are not intended to specify materials, shapes, structures, arrangements, and the like of the components to the following. Various modifications can be made to the embodiments of the present disclosure within the scope of the claims.

In addition, in the following description, a $(Al_xGa_{1-x})_yIn_{1-y}P$ ($0 \le x < 1$, $0 < y \le 1$) layer is simply expressed by an AlInGaP layer, and a $Ga_yIn_{1-y}P$ ($0 < y \le 1$) layer (i.e., when x=0) is simply expressed by an InGaP layer.

First Embodiment

Device Structure

Figure 2:
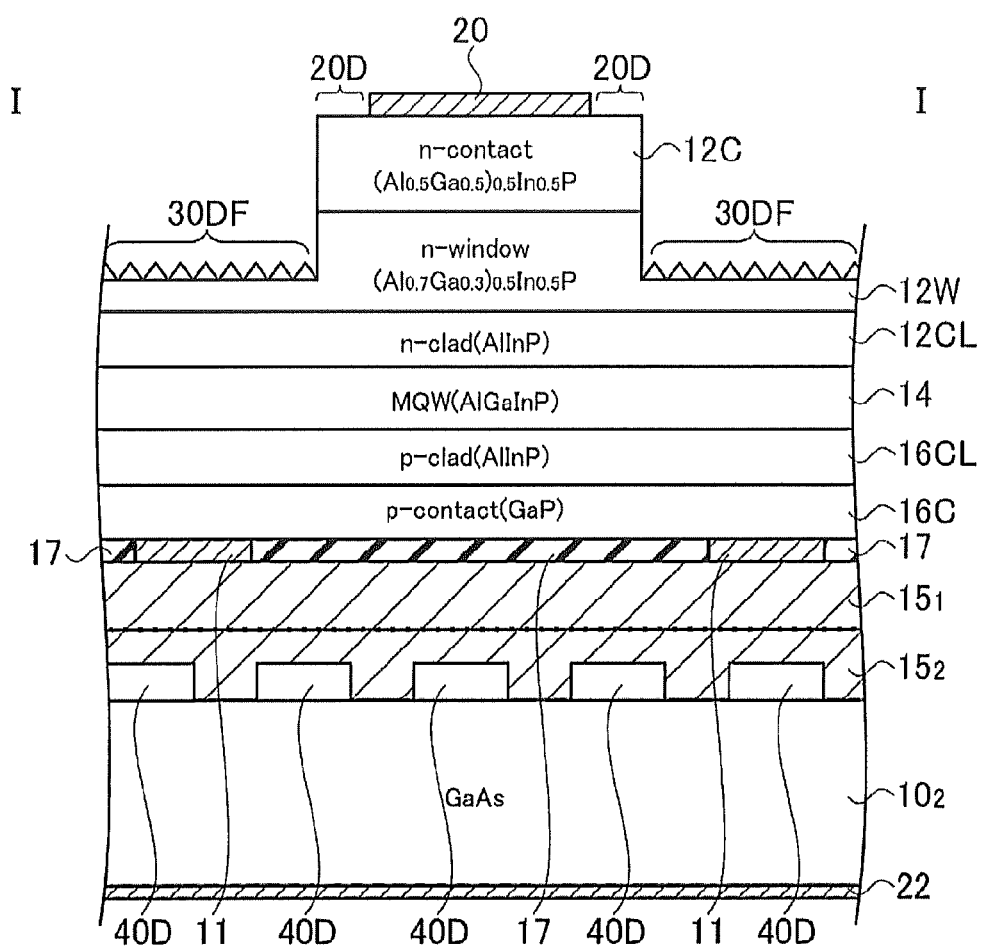
FIG. 2 schematically illustrates a structure taken along a line I-I of FIG. 1, in a cross-sectional view.
Figure 3:
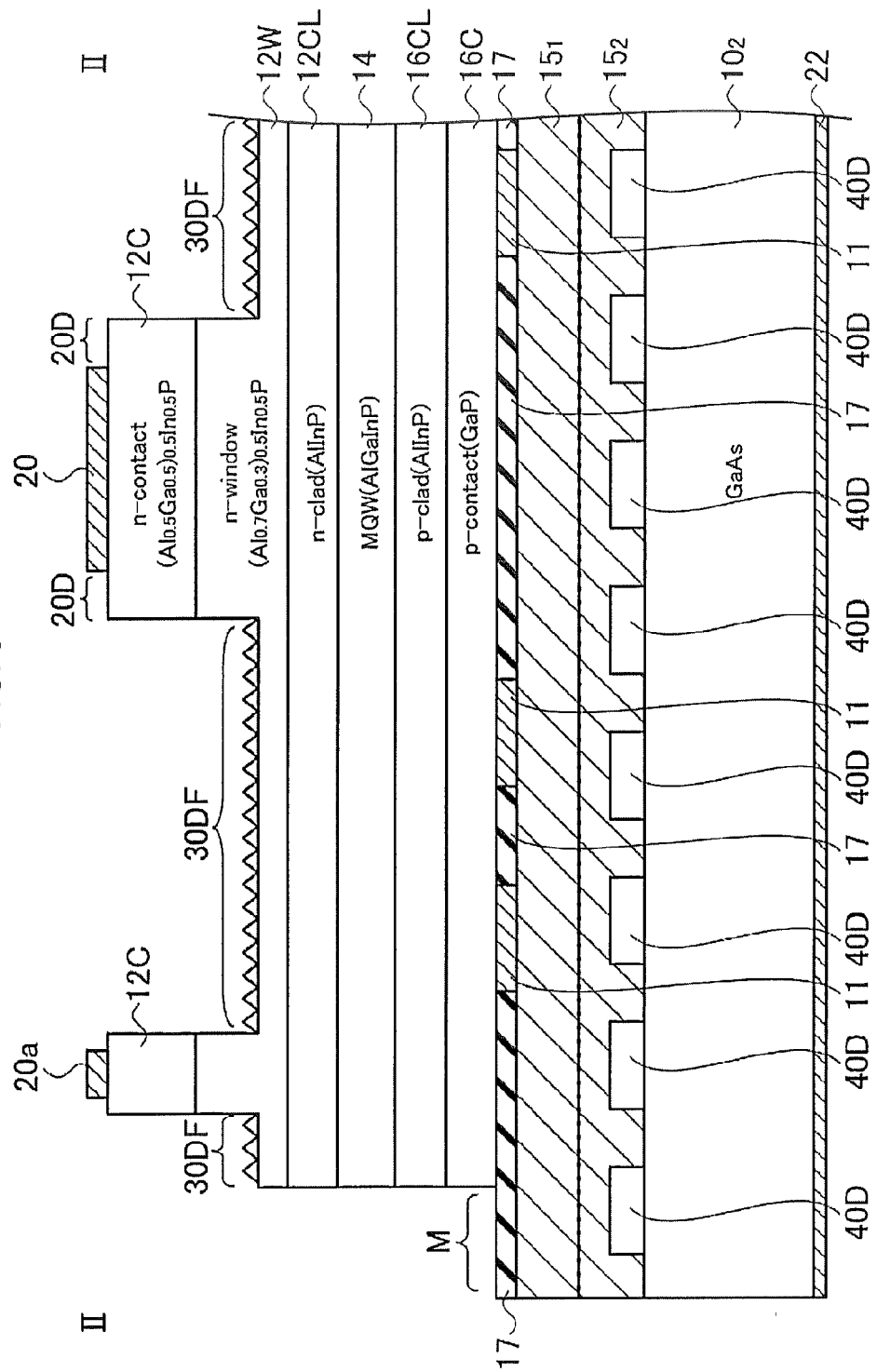
FIG. 3 schematically illustrates a structure taken along a line II-II in FIG. 1, in cross-sectional view.
Figure 4:
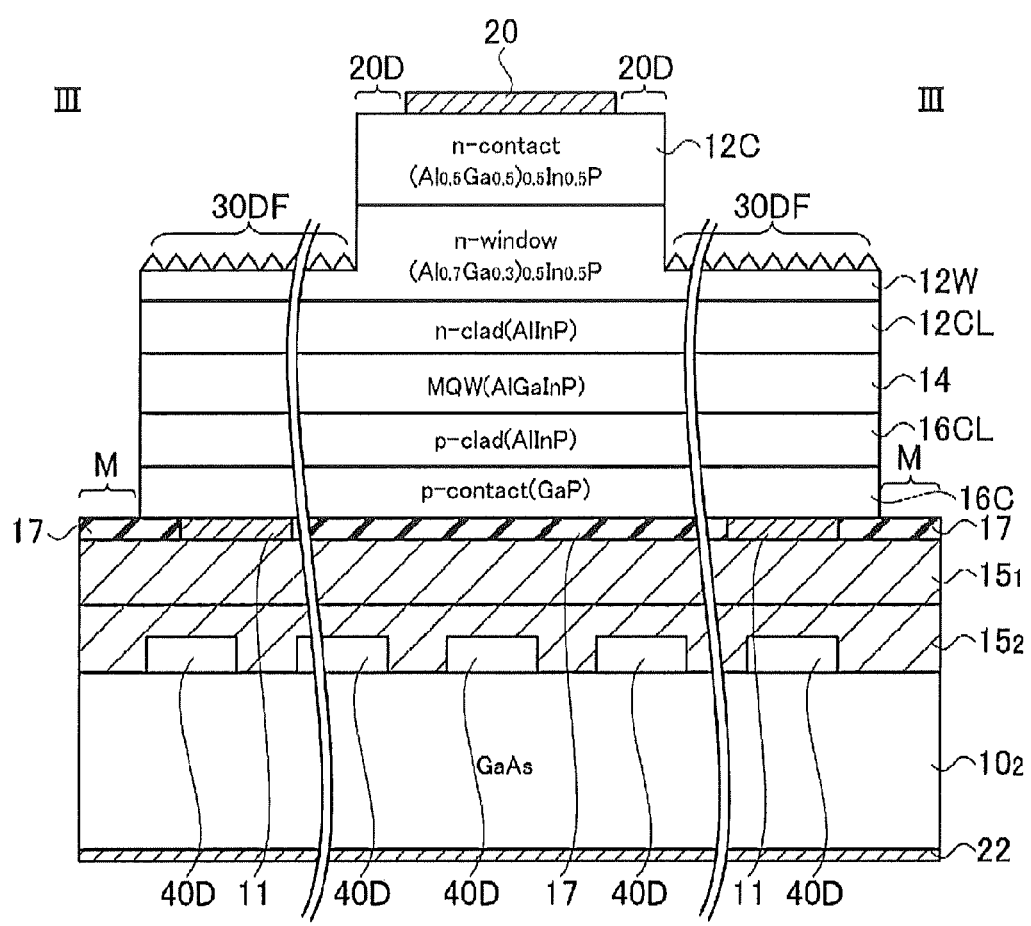
FIG. 4 schematically illustrates a structure taken along a line III-III in FIG. 1, in cross-sectional view.

FIG. 1 schematically illustrates a plane pattern configuration of a semiconductor light emitting device according to a first embodiment. FIG. 2 schematically illustrates a structure taken along a line I-I of FIG. 1, in a cross-sectional view. FIG. 3 schematically illustrates a structure taken along a line II-II in FIG. 1, in cross-sectional view. FIG. 4 schematically illustrates a structure taken along a line III-III in FIG. 1, in cross-sectional view.

As illustrated in FIGS. 1 to 4, the semiconductor light emitting device according to the first embodiment includes a substrate structure (i.e., a substrate $10_2$), a first clad layer 16CL of a first conductivity type disposed on the substrate structure (i.e., the substrate $10_2$), a multi-quantum well layer 14 disposed on the first clad layer 16CL, a second clad layer 12CL of a second conductivity type disposed on the multi-quantum well layer 14, a window layer 12W of the second conductivity type disposed on the second clad layer 12CL, a contact layer 12C of the second conductivity type disposed on the window layer 12W, and a frost-processed layer 30DF disposed on a surface or an etched surface of the contact layer 12C or the window layer 12W.

The frost-processed layer 30DF may be formed by wet etching a plurality of times on the surface or the etched surface of the contact layer 12C or the window layer 12W.

Further, the frost-processed layer 30DF may be formed by wet etching two times on the surface or the etched surface of the contact layer 12C or the window layer 12W under a condition that an etching temperature of a second frost process is lower than an etching temperature of a first frost process.

Furthermore, in the semiconductor light emitting device according to the first embodiment, the substrate structure may include a substrate $10_2$, metal layers $15_1$ and $15_2$ disposed on the substrate $10_2$, a metallic contact layer 11, and an insulating layer 17. The metallic contact layer 11 and the insulating layer 17 are patterned and disposed on the metal layer $15_2$.

(Plane Pattern Configuration)

As illustrated in FIG. 1, in the semiconductor light emitting device according to the first embodiment, for example, the double frost-processed layer 30DF formed on the window layer 12W of the second conductivity type (e.g., n-type) has a rectangular plane pattern, and surface electrode layers 20 and 20a include a central portion surface electrode layer 20 disposed in a central portion on the rectangular plane pattern and T-shaped surface electrode layers 20a which are connected to the surface electrode layer 20 and extend from the surface electrode layer 20 in four directions of four sides of the rectangle.

For example, a diameter DW of the surface electrode layer 20 of the central portion is approximately 100 μm and a width MW of a stripe of the T-shaped surface electrode layer 20a is approximately 7 μm. Furthermore, the internal ODR (omni-directional reflector) metal layer 11 is illustrated by a dashed line, whose diameter is, for example, approximately 12 μm and whose number is, for example, approximately 44. In the semiconductor light emitting device according to the first embodiment, since current conducts between the internal ODR metal layer 11 and the surface electrode layers 20 and 20a on a surface side, light emission can be efficiently performed.

Furthermore, as illustrated in FIG. 1, in the semiconductor light emitting device according to the first embodiment, a peripheral portion has a mesa structure M and the insulating layer 17 is exposed.

If a pattern width of the ODR metal layer 11 is wide, a substantial light emitting region is limited and thus, area efficiency and light emitting efficiency decrease. On the other hand, if the pattern width of the ODR metal layer 11 is narrow, area resistance of the ODR metal layer 11 increases and thus, a forward voltage Vf of the LED increases. In light of the above, the pattern width and the pattern structure can be optimized. Some pattern examples include a honeycomb pattern structure based on a hexagon and a circular dot pattern structure based on a circular dot shape.

Further, the schematic plane pattern structure of the ODR metal layer 11 is not limited to the hexagonal honeycomb pattern and the circular dot pattern, and it is also possible to apply a random pattern in which a triangular pattern, a rectangular pattern, a hexagonal pattern, an octagonal pattern, a circular dot pattern, and the like are randomly arranged.

The schematic plane pattern structure of the ODR metal layer 11 needs to secure the metal wiring pattern width to the extent that the forward voltage Vf of the LED does not increase and also secure an area of a light-guiding region not to decrease light emission brightness of the LED.

As illustrated in FIGS. 1 to 4, the schematic cross-sectional structure of the semiconductor light emitting device according to the first embodiment may include the substrate $10_2$, the p-type contact layer 16C disposed on the substrate $10_2$, the p-type clad layer 16CL disposed on the p-type contact layer 16C, the MQW layer 14 disposed on the p-type clad layer 16CL, the n-type clad layer 12CL disposed on the MQW layer 14, the n-type window layer 12W disposed on the n-type clad layer 12CL, and the n-type contact layer 12C disposed on the n-type window layer 12W.

The double frost-processed layer 30DF having an uneven shape is formed through a double frost process on the surface or the etched stepped surface of the n-type window layer 12W.

The substrate $10_2$ may be formed of GaAs and step structures 40D are formed on the surface of the substrate $10_2$ at a predetermined pattern pitch. The step structure 40D may be formed by etching the substrate $10_2$ or as an air gap structure.

The metal layer $15_2$ is disposed on the substrate $10_2$ and the step structure 40D. In addition, the metal layer $15_2$ adheres to the metal layer $15_1$ by bonding.

The insulating layer 17 and the ODR metal layer 11 are disposed on the metal layer $15_1$ in a predetermined pattern.

A back electrode layer 22 is disposed on a back side of the substrate $10_2$ and the surface electrode layers 20 and 20a are disposed on a surface of the n-type contact layer (e.g., $(Al_{0.5}Ga_{0.5})_{0.5}In_{0.5}P$ layer) 12C. For example, the surface electrode layers 20 and 20a and the back electrode layer 22 may be formed as Au layers.

For example, the p-type contact layer 16C may be formed as a GaP layer with a film thickness of approximately 900 nm.

For example, the p-type clad layer 16CL may be formed as an AlInP layer with a film thickness of approximately 400 nm and an AlInP layer with a film thickness of approximately 400 nm.

The MQW layer 14 may be formed of pairs of InGaP/$(Al_{0.03}Ga_{0.97})_{0.5}In_{0.5}P$. The number of pairs may be approximately 100, film thicknesses of a well and a barrier may be approximately 3.5 nm and approximately 3 nm, respectively, and an overall thickness of the MQW layer 14 may be approximately 650 nm.

For example, the n-type clad layer 12CL may be formed as an AlInP layer with a film thickness of approximately 800 nm.

For example, the n-type window layer 12W may be formed as an $(Al_{0.7}Ga_{0.3})_{0.5}In_{0.5}P$ layer with a film thickness of approximately 900 nm.

For example, the n-type contact layer 12C may be formed of the $(Al_{0.5}Ga_{0.5})_{0.5}In_{0.5}P$ layer having the film thickness of approximately 900 nm.

The frost-processed layer 30DF may be formed of the same material as the n-type window layer 12W, that is, the AlInGaP (specifically, $(Al_{0.7}Ga_{0.3})_{0.5}In_{0.5}P$).

Furthermore, although not illustrated, an n-type guide layer (e.g., a $(Al_{0.85}Ga_{0.15})_{0.5}In_{0.5}P$ layer having a thickness of approximately 90 nm) may be inserted between the n-type clad layer 12CL and the MQW layer 14, a p-type guide layer (e.g., a $(Al_{0.85}Ga_{0.15})_{0.5}In_{0.5}P$ layer having a thickness of approximately 90 nm) may be inserted between the p-type clad layer 16CL and the MQW layer 14, and an overall thickness of the epitaxial structure from the p-type contact layer 16C to the n-type contact layer 12C may be approximately 5,130 nm.

Figure 5:
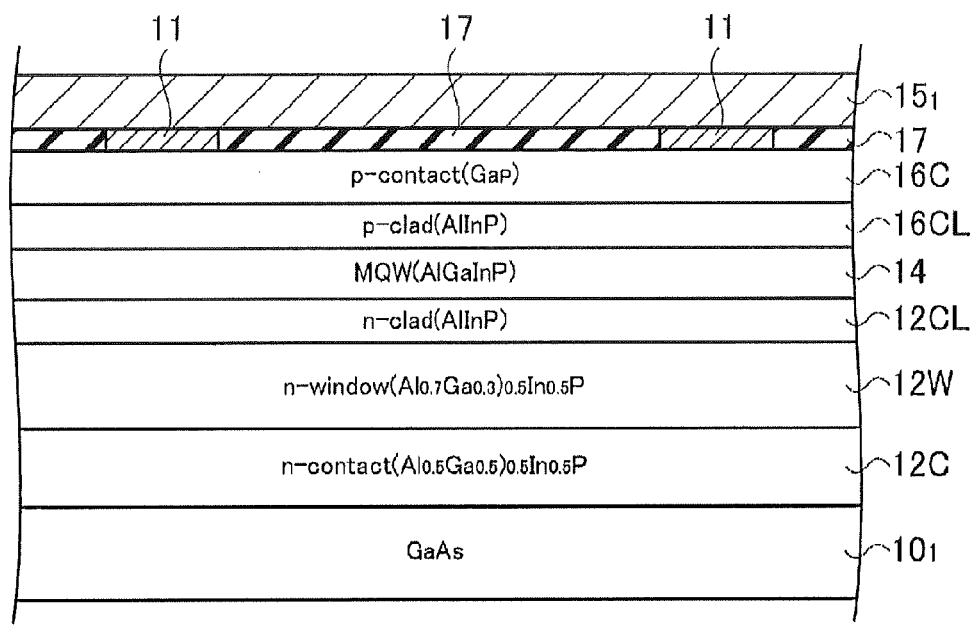
FIG. 5 schematically illustrates a portion of an LED structure in the semiconductor light emitting device according to the first embodiment, in a cross-sectional view.
Figure 6:
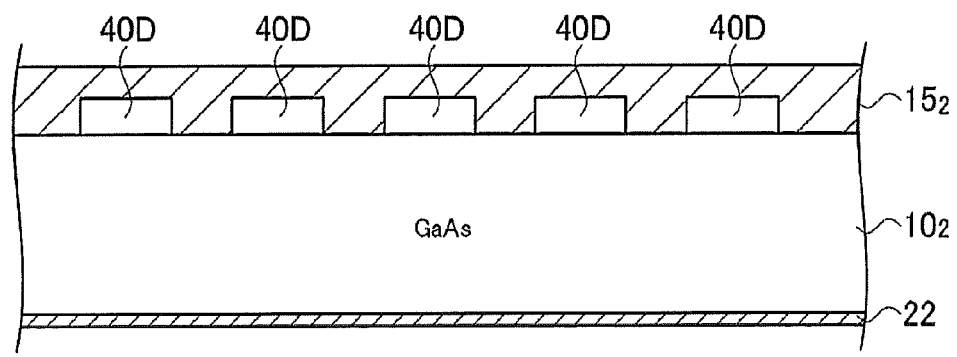
FIG. 6 schematically illustrates a portion of a GaAs substrate structure portion in the semiconductor light emitting device according to the first embodiment, in a cross-sectional view.

FIG. 5 schematically illustrates a portion of an LED structure in the semiconductor light emitting device according to the first embodiment, in a cross-sectional view. FIG. 6 schematically illustrates a portion of a GaAs substrate structure in the semiconductor light emitting device according to the first embodiment, in a cross-sectional view.

The semiconductor light emitting device according to the first embodiment may be formed using a bonding technique.

By adhering the GaAs substrate $10_2$ to the LED structure made of the epitaxial growth layers using the metal layers $15_1$ and $15_2$, it becomes possible to form a metallic reflective layer having great reflectivity. The metallic reflective layer is formed with the metal layer $15_1$. Since an interface between the insulating layer 17 and the metal layer $15_1$ forms a mirror surface, light emitted from the LED is reflected on the mirror surface. The ODR metal layer 11 is interposed in the interface between the metal layer $15_1$ and the p-type contact layer 16C for making ohmic contact between the metal layer $15_1$ and the p-type contact layer 16C and has a thickness of the same level as that of the insulating layer 17.

As illustrated in FIG. 5, in the semiconductor light emitting device according to the first embodiment, the LED structure is configured such that after the n-type contact layer 12C, the n-type window layer 12W, the p-type contact layer 16C, the n-type clad layer 12CL, the MQW layer 14, the p-type clad layer 16CL, and the p-type contact layer 16C are sequentially formed on the GaAs substrate $10_1$, the insulating layer 17 and the ODR metal layer 11 are patterned on the p-type contact layer 16C, and then, the metal layer $15_1$ is formed.

As illustrated in FIG. 6, in the semiconductor light emitting device according to the first embodiment, the GaAs substrate structure is configured such that the step structures 40D are formed on the GaAs substrate $10_2$ at a predetermined pattern pitch and the metal layer $15_2$ is then formed.

In the semiconductor light emitting device according to the first embodiment, by forming the metal layer $15_2$ disposed on the GaAs substrate $10_2$ and the metal layer $15_1$ disposed on the LED side as Au layers, it becomes possible to adhere the metal layer $15_2$ and the metal layer $15_1$ by thermo-compression bonding.

For example, a condition for adhering the metal layer may be a temperature ranging from approximately 250 degrees C. to approximately 700 degrees C., specifically, from approximately 300 degrees C. to approximately 400 degrees C. and a pressure for the thermo-compression bonding may range from approximately 10 MPa to approximately 20 MPa.

In the semiconductor light emitting device according to the first embodiment, after adhering the metal layer $15_2$ and the metal layer $15_1$, the GaAs substrate $10_1$ is removed by wet etching and the surface electrode layers 20 and 20a are formed on the n-type contact layer 12C.

Thereafter, a portion of the n-type contact layer 12C is removed by wet etching, and the double frost-processed layer 30DF having an uneven shape is formed through the double frost process on the surface or the etched stepped surface of the n-type window layer 12W.

In the structures of FIGS. 5 and 6, the metal layers $15_1$ and $15_2$ are formed as, for example, Au layers, and their thicknesses range, for example, from approximately 2.5 to approximately 5 μm. Further, the ODR metal layer 11 is formed as, for example, a AuBe layer, an alloy layer of AuBe and Ni, or the like, and its thickness is, for example, the same level as that of the insulating layer 17, which is approximately 450 nm. For example, the insulating layer 17 is formed as a silicon oxide film, a silicon nitride film, a SiON film, a $SiO_xN_y$ film, a multilayer film thereof, or the like.

Since the metal layer $15_1$ formed as the Au layer absorbs blue light and ultraviolet light, a metal buffer layer formed as, for example, Ag, Al, Ni, Cr, W layer, or the like may be installed between the metal layer $15_1$, and the ODR metal layer 11 and the insulating layer 17, in order to reflect the light of such a short wavelength side.

In the semiconductor light emitting device according to the first embodiment, by forming the transparent insulating layer 17 between the metal layer $15_1$ serving as the metallic reflective layer and the p-type contact layer 16C, a contact region between the p-type contact layer 16C and the metal layer $15_1$ is reduced to prevent absorption of light, which makes it possible to form a metallic reflective layer having great reflectivity.

According to the first embodiment, the double frost-processed layer 30DF having an uneven shape is formed on the surface or the etched stepped surface of the n-type window layer 12W using a double frost process technique based on wet etching, which makes it possible to provide a semiconductor light emitting device with improved efficiency of light extraction.

According to the first embodiment, it is possible to adhere the GaAs substrate structure and the LED structure using the bonding technique while maintaining good adhesion between the two structures. Furthermore, in order to prevent the absorption of light into the GaAs substrate $10_2$, the light may be totally reflected using the metal layer $15_1$ as the reflective layer, which makes it possible to reflect the light of all angles. Accordingly, it is possible to provide a semiconductor light emitting device with improved efficiency of light extraction.

In the first embodiment, the conductivity type of each layer may be set to be opposite to those described above.

In the first embodiment, although an example of employing a GaAs substrate as the substrate $10_2$ is illustrated, it is also possible to employ a silicon substrate, a SiC substrate, a GaP substrate, a sapphire substrate, or the like.

(Frost Process)

In the first embodiment, an example of performing a frost process two times is described as a double frost process DF. However, the frost process may be performed a plurality of times without being limited to the two times. In this case, the frost process may be referred to as a multi frost (MF) process mode.

In a first frost process (with a frost process temperature $T_{F1}$ and a frost process time $t_{F1}$), a frost-processed surface is formed to have a random rough uneven surface.

In a second frost process (with a frost process temperature $T_{F2}$ and a frost process time $t_{F2}$) following the first frost process, a microstructural uneven surface is further formed on the frost-processed surface of the first random rough uneven surface. Furthermore, an unevenness depth of the first random rough uneven surface may be deepened depending on conditions of the second frost process and materials to be etched.

Furthermore, in the MF process mode, an etching process mode EM and a frost process mode FM may be repeated several times. In the etching process mode EM, the frost-processed surface is converted to a relatively smooth surface as etching time goes. In the frost process mode FM, the first frost process (with the frost process temperature $T_{F1}$ and the frost process time $t_{F1}$) and the second frost process (with the frost process temperature $T_{F2}$, and the frost process time $t_{F2}$) are consecutively performed.

According to the first embodiment, by performing a plurality of times the frost process on the LED device surface, it becomes possible to provide a semiconductor light emitting device having improved brightness.

Figure 7:
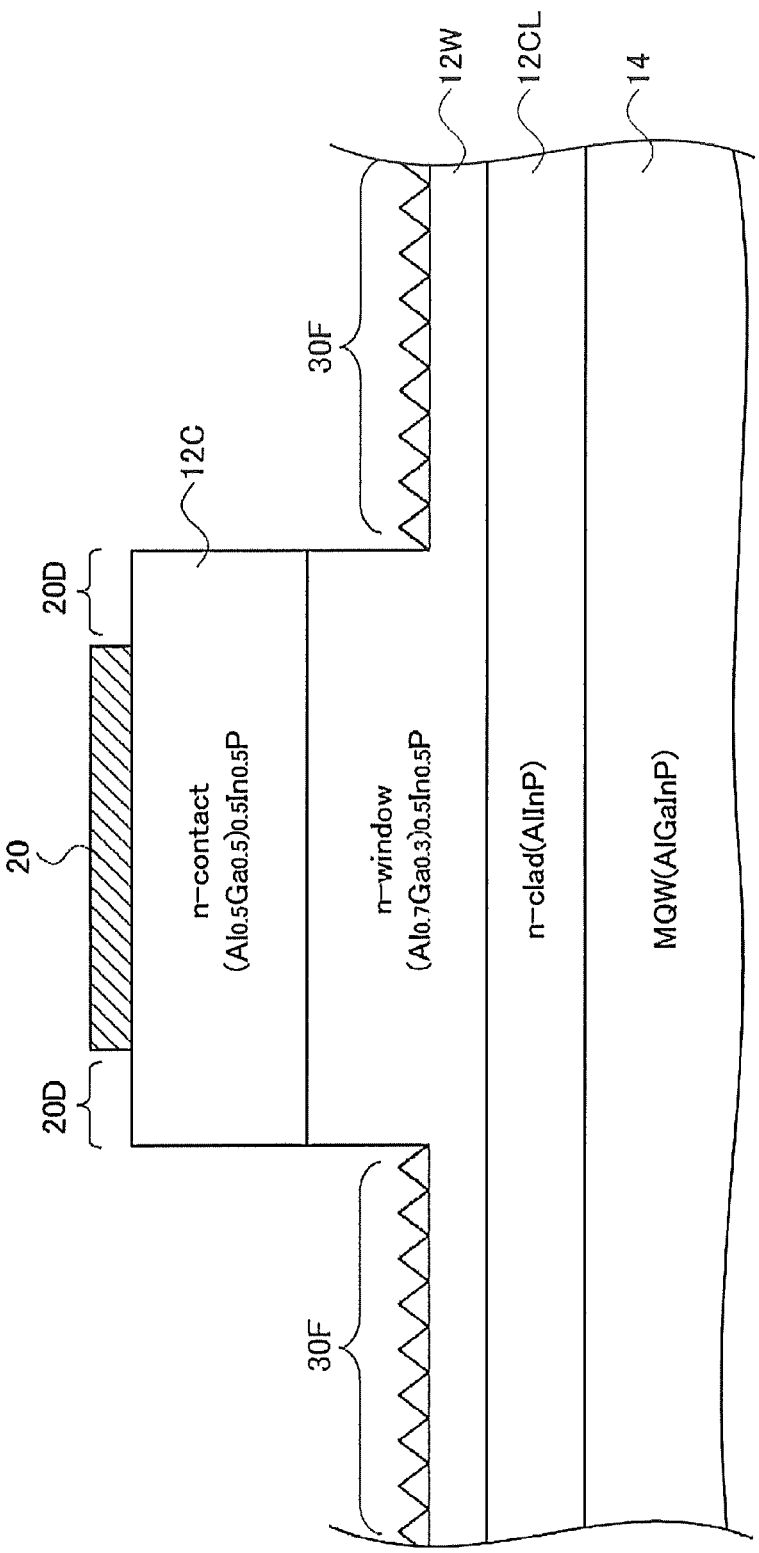
FIG. 7 schematically illustrates a structure after a first frost process in a manufacturing process of the semiconductor light emitting device according to the first embodiment, in a cross-sectional view.
Figure 8:
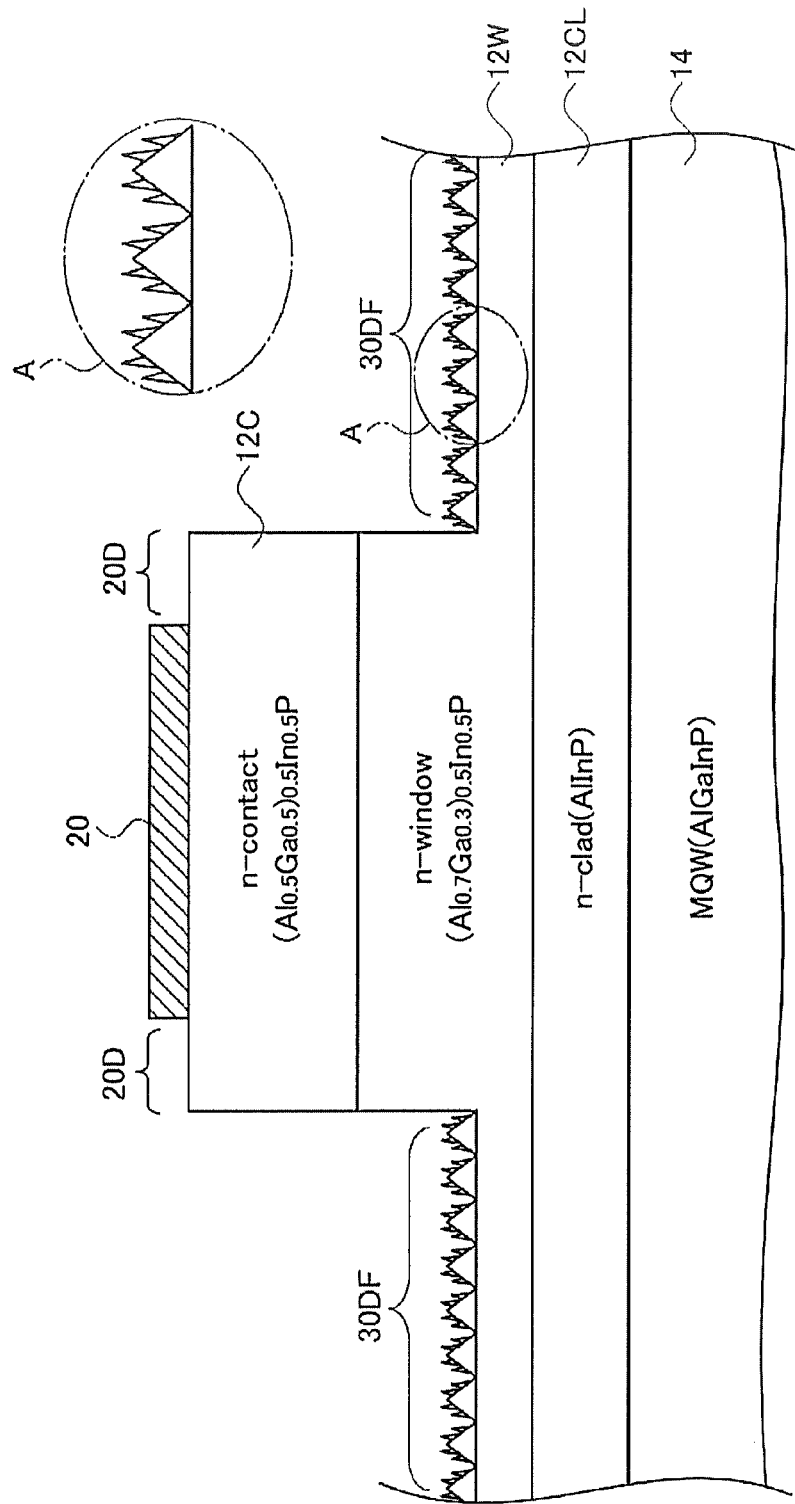
FIG. 8 schematically illustrates a structure after a second frost process in the manufacturing process of the semiconductor light emitting device according to the first embodiment, in a cross-sectional view.

FIG. 7 schematically illustrates a structure after a first frost process in a manufacturing process of the semiconductor light emitting device according to the first embodiment is performed, in a cross-sectional view. FIG. 8 schematically illustrates a structure after a second frost process in the manufacturing process of the semiconductor light emitting device according to the first embodiment is performed, in a cross-sectional view.

In the first frost process, as illustrated in FIG. 7, the frost-processed layer 30F is formed to have a random rough uneven surface. In the example of FIG. 7, by wet etching in the first frost process, a portion of the n-type contact layer 12C is removed and a portion of the n-type window layer 12W is etched up to a halfway point. On the other hand, non-formation regions 20D exist in a peripheral portion of the surface electrode layer 20.

In the second frost process, as illustrated in FIG. 8, the double frost-processed layer 30DF is formed to have a microstructural uneven surface in addition to the random rough uneven surface of the frost-processed layer 30F. As schematically illustrated in an enlarged view of a region A portion in FIG. 8, the microstructural uneven surface is formed as a microstructural protruding structure with respect to the random rough uneven surface of the frost-processed layer 30F.

Figure 9:
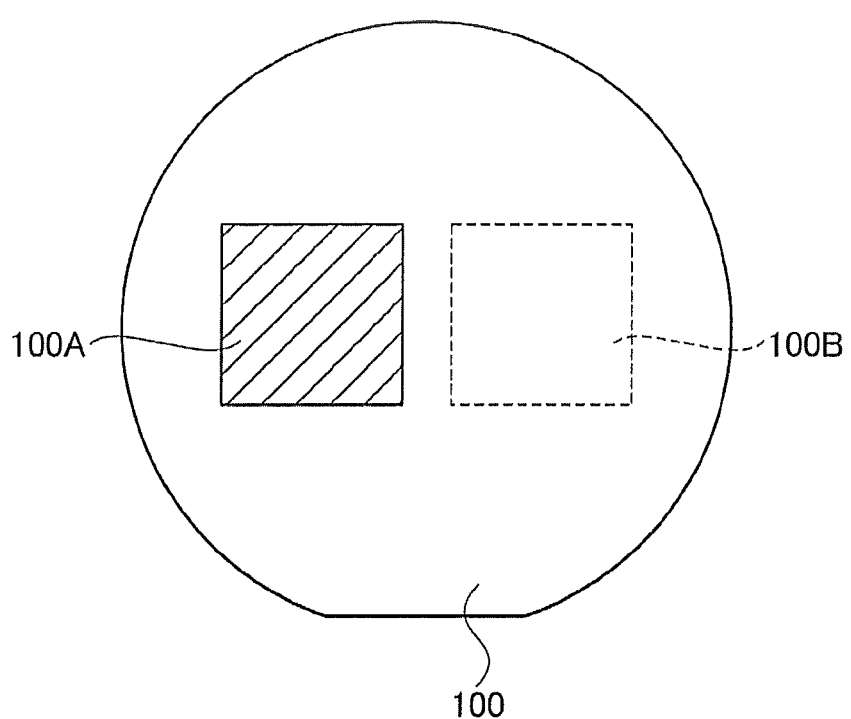
FIG. 9 schematically illustrates a configuration of TEG patterns that compares the first frost process and the second frost process in the manufacturing process of the semiconductor light emitting device according to the first embodiment, in a plane view.

FIG. 9 schematically illustrates a configuration of TEG patterns that compares the first frost process and the second frost process in the manufacturing process of the semiconductor light emitting device according to the first embodiment, in a plane view. Specifically, a wafer 100 includes an etching mask region 100A on which the first frost process is performed and an etching region 100B on which the first frost process and the second frost process are performed. As such, the states of the surfaces after the first frost process and the second frost process are compared.

Figure 10A:
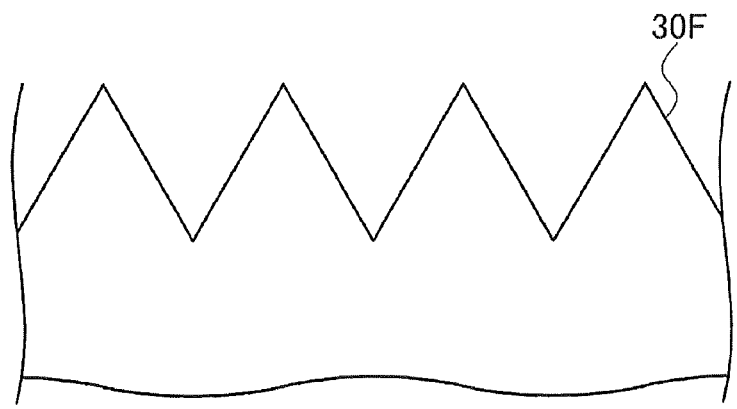
FIG. 10A schematically illustrates a structure after a first frost process in the manufacturing process of the semiconductor light emitting device according to the first embodiment, in a cross-sectional view.
Figure 10B:
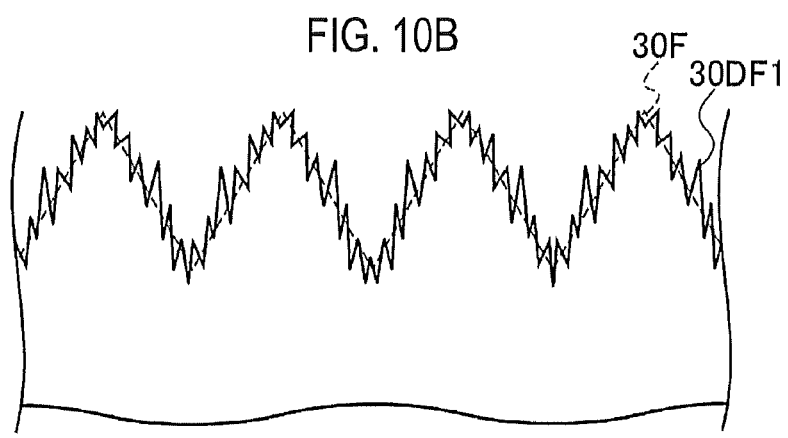
FIG. 10B schematically illustrates an example of a structure after a second frost process in the manufacturing process of the semiconductor light emitting device according to the first embodiment, in a cross-sectional view.
Figure 10C:
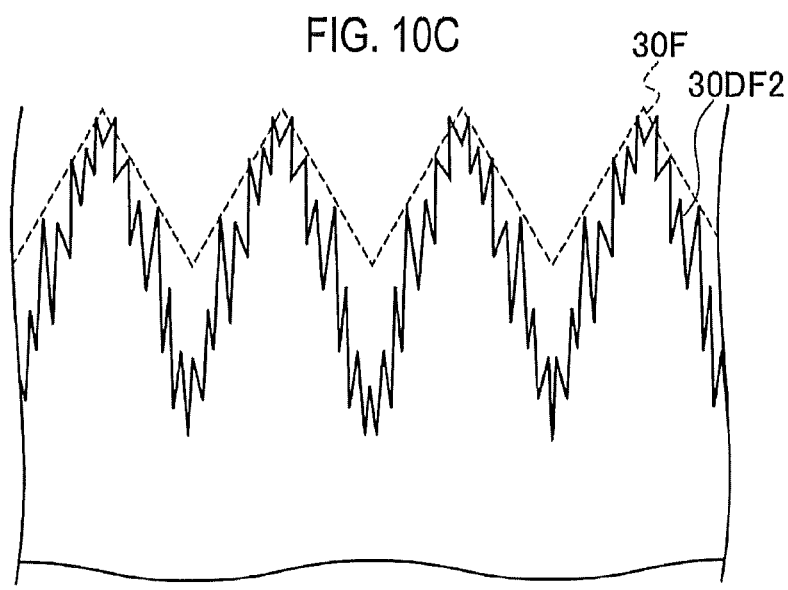
FIG. 10C schematically illustrates another example of a structure after a second frost process in the manufacturing process of the semiconductor light emitting device according to the first embodiment, in a cross-sectional view.

FIG. 10A schematically illustrates a structure after the first frost process is performed, in a cross-sectional view. FIG. 10B schematically illustrates an example of a structure after the first frost process and then the second frost process are performed, in a cross-sectional view. FIG. 10C schematically illustrates another example of a structure after the first process and then the second frost process, whose condition is different from that in FIG. 10B, are performed, in a cross-sectional view.

In the first frost process (with the frost process temperature $T_{F1}$ and the frost process time $t_{F1}$), the frost-processed layer 30F is formed to have a frost-processed surface of a rough uneven surface. In contrast, once the second frost process (with the frost process temperature $T_{F2}$ and the frost process time $t_{F2}$) is performed after the first frost process, a double frost-processed layer 30DF1 is formed to have a microstructural uneven surface which is finer than the rough uneven surface of the first frost-processed layer 30F, as illustrated in FIG. 10B.

Furthermore, depending on a material to be etched and a condition in the second frost process, the unevenness of the first rough uneven surface may become deeper in the double frost-processed layer 30DF2, as illustrated in FIG. 10C. The double frost-processed layer 30DF2 also has a microstructural uneven surface, as illustrated in FIG. 10C.

Figure 11A:
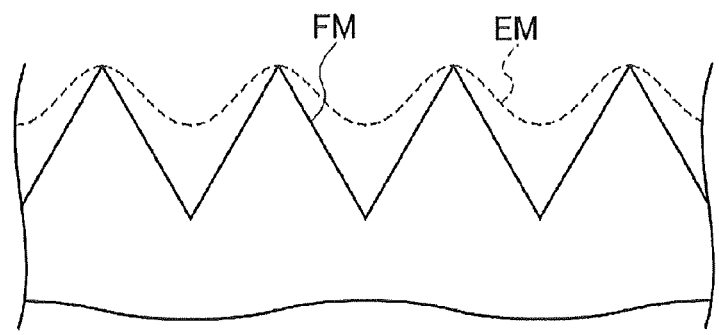
FIG. 11A schematically illustrates a structure that compares an etching process mode (EM) and a frost process mode (FM) in the first frost process of the manufacturing process of the semiconductor light emitting device according to the first embodiment, in a cross-sectional view.
Figure 11B:
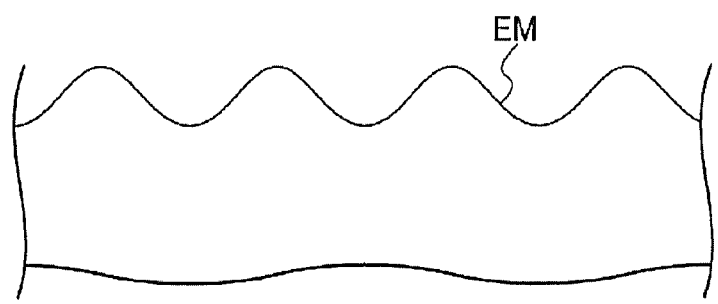
FIG. 11B schematically illustrates a structure after an etching process mode (EM) in the second frost process is performed in the manufacturing process of the semiconductor light emitting device according to the first embodiment, in a cross-sectional view.
Figure 11C:
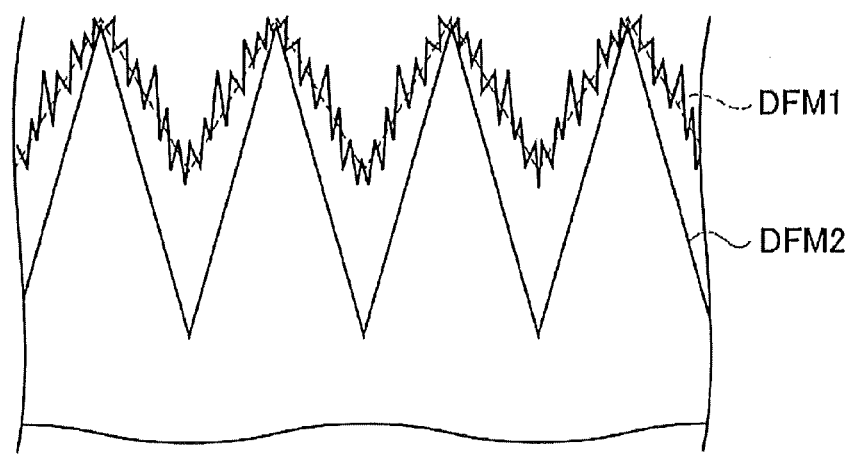
FIG. 11C schematically illustrates a structure that compares frost process modes DFM1 and DFM2 in the second frost process of the manufacturing process of the semiconductor light emitting device according to the first embodiment, in a cross-sectional view.

FIG. 11A schematically illustrates a structure that compares an etching process mode (EM) and a frost process mode (FM) in the first frost process, in a cross-sectional view. Specifically, in the first frost process, the frost process mode (FM) indicates a condition for obtaining the frost-processed layer 30F having a random rough uneven surface, while the etching process mode (EM) indicates a condition requiring a relatively longer etching time than that in the frost process mode (FM) and resulting in a relatively smooth random rough uneven surface. Proceeding with the etching process mode may not be advantageous since the light extraction effect resulting from the unevenness is weakened. FIGS. 11A, 11B, and 11C illustrate examples resulting from the etching process mode and show that the micro unevenness in FIGS. 10A, 10B, and 10C is reduced in the etching process mode.

In addition, FIG. 11B schematically illustrates a structure after the etching process mode (EM) in the second frost process is performed, in a cross-sectional view. Specifically, the etching process mode (EM) indicates a condition requiring a relatively longer etching time than that in the double frost process mode (see DFM1: FIGS. 10B and 11C), which obtains the double frost-processed layer 30DF1, and resulting in a relatively smooth random rough uneven surface, as illustrated in FIG. 11B.

FIG. 11C schematically illustrates a structure that compares double frost process modes DFM1 and DFM2 in the second frost process, in a cross-sectional view. The double frost process mode DFM2 indicates a process mode in which a depth of a valley in the uneven surface is formed relatively deeper than that of the double frost process mode DFM1.

Depending on a material to be etched and a condition in the second frost process, a double frost-processed layer 30DF2 may be formed to have further deep unevenness in the first rough uneven surface, as illustrated in FIG. 10C. The double frost process mode DFM2 (see FIG. 11C) proceeds to have a smooth surface with a relatively long etching time in the etching process mode (EM) in comparison with the micro uneven surface of the double frost-processed layer 30DF2 illustrated in FIG. 10C.

Figure 12A:
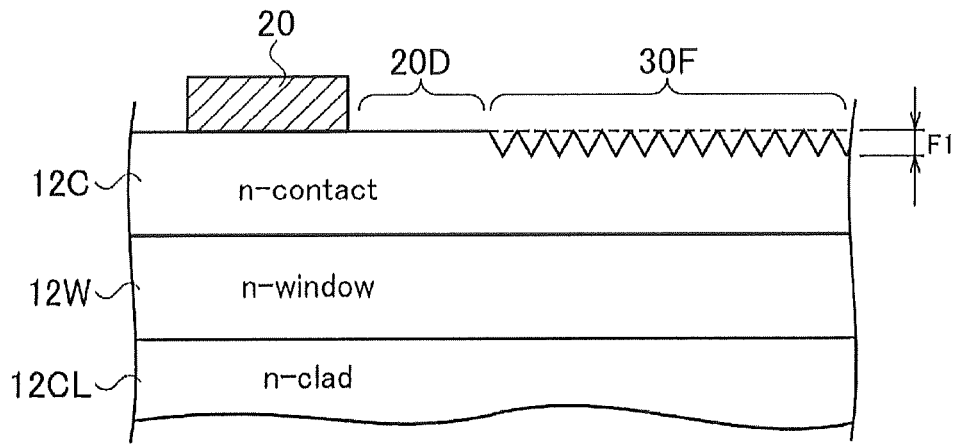
FIG. 12A schematically illustrates a structure in a state where a surface of an n-type contact layer is subjected to a frost process in the manufacturing process of the semiconductor light emitting device according to the first embodiment, in a cross-sectional view.
Figure 12B:
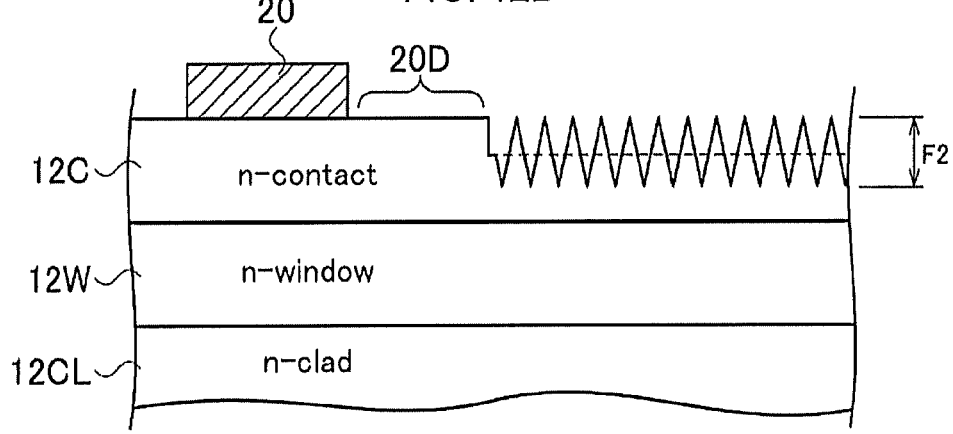
FIG. 12B schematically illustrates a structure in a state where a frost process in the manufacturing process of the semiconductor light emitting device according to the first embodiment is performed deeply onto an interior of the n-type contact layer, in a cross-sectional view.
Figure 12C:
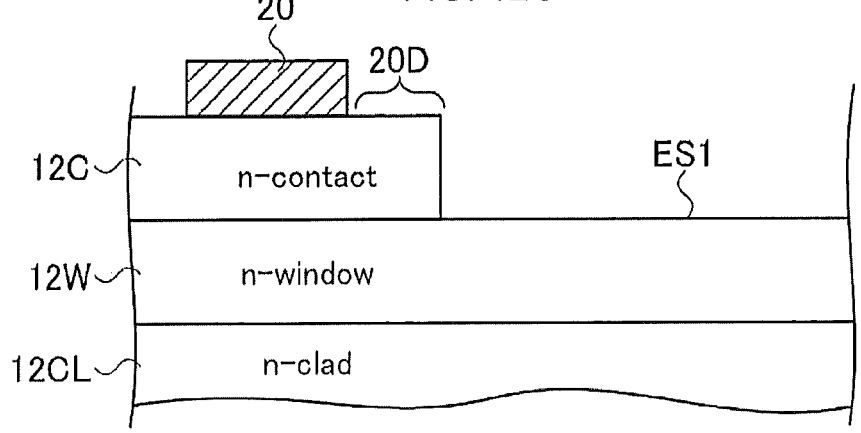
FIG. 12C schematically illustrates a structure in a state where the n-type contact layer is etched up to its bottom in the manufacturing process of the semiconductor light emitting device according to the first embodiment, in a cross-sectional view.

FIG. 12A schematically illustrates a structure in a state where a surface of the n-type contact layer 12C is subjected to a frost process in the manufacturing process of the semiconductor light emitting device according to the first embodiment, in a cross-sectional view. FIG. 12B schematically illustrates a structure in a state where a frost process in the manufacturing process of the semiconductor light emitting device according to the first embodiment is performed deeply on an interior of the n-type contact layer 12C, in a cross-sectional view. FIG. 12C schematically illustrates a structure in a state where the n-type contact layer 12C is etched up to its bottom in the manufacturing process of the semiconductor light emitting device according to the first embodiment, in a cross-sectional view.

According to the manufacturing process of the semiconductor light emitting device according to the first embodiment, as illustrated in FIG. 12A, the frost process is performed on the surface of the n-type contact layer 12C to have a peak-to-peak unevenness height of F1. Furthermore, in the example of FIG. 12B, by adjusting the etching time to perform wet etching longer than that in FIG. 12A, the interior of the n-type contact layer 12C is deeply frosted, for example, to a peak-to-peak unevenness height of F2 (>F1). On the other hand, in the example of FIG. 12C, the frost process mode changes to the etching process mode so that the n-type contact layer 12C is etched up to its bottom and an etched surface ES1 of the n-type window layer 12W is exposed.

In the manufacturing process of the semiconductor light emitting device according to the first embodiment, a microstructural uneven surface may be formed in the structures in FIGS. 12A and 12B by performing the double frost process. In other words, the first frost process (with the frost process temperature $T_{F1}$ and the frost process time $t_{F1}$) and the second frost process (with the frost process temperature $T_{F2}$ and the frost process time $t_{F2}$) are consecutively performed.

Figure 13A:
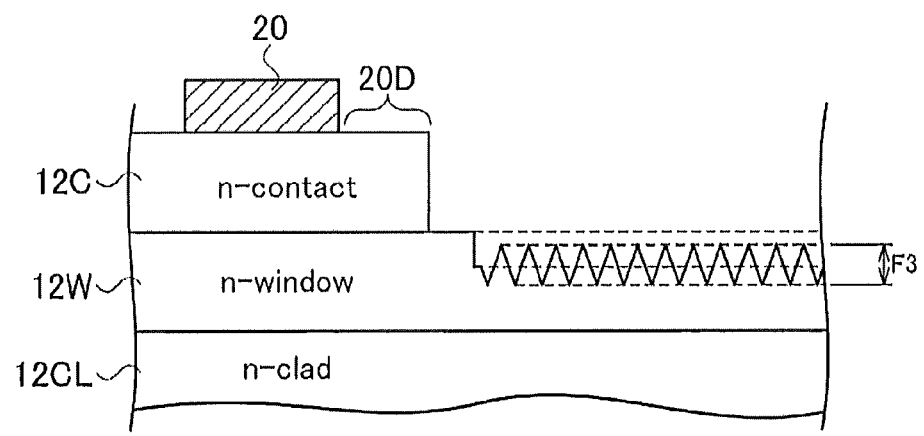
FIG. 13A schematically illustrates a structure in a state where a frost process in the manufacturing process of the semiconductor light emitting device according to the first embodiment is performed on an interior of an n-type window layer, in a cross-sectional view.
Figure 13B:
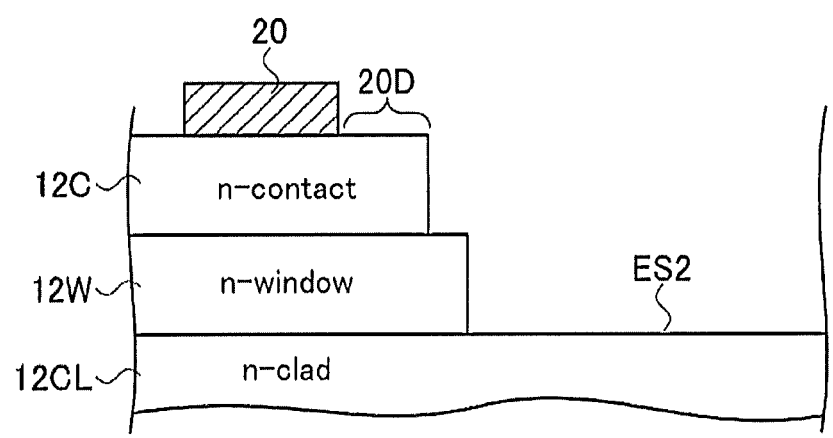
FIG. 13B schematically illustrates a structure in a state where the n-type window layer is etched up to its bottom in the manufacturing process of the semiconductor light emitting device according to the first embodiment, in a cross-sectional view.

FIG. 13A schematically illustrates a structure in a state where a frost process in the manufacturing process of the semiconductor light emitting device according to the first embodiment is performed on an interior of the n-type window layer 12W, in a cross-sectional view. FIG. 13B schematically illustrates a structure in a state where the n-type window layer 12W is etched up to its bottom in the manufacturing process of the semiconductor light emitting device according to the first embodiment, in a cross-sectional view.

In the manufacturing process of the semiconductor light emitting device according to the first embodiment, as illustrated in FIG. 13A, by additionally performing the frost process on the surface ES1 of the n-type window layer 12W to frost-process the interior of the n-type window layer 12W, the surface may be frost-processed to have a peak-to-peak unevenness height of F3. In this case, a microstructural uneven surface may be formed on the structure of FIG. 13A by performing the double frost process. In addition, in the example of FIG. 13C, the frost process mode FM may change to the etching process mode EM so that the n-type window layer 12W is etched up to its bottom and an etched surface ES2 of the n-type clad layer 12CL is exposed.

Figure 14:
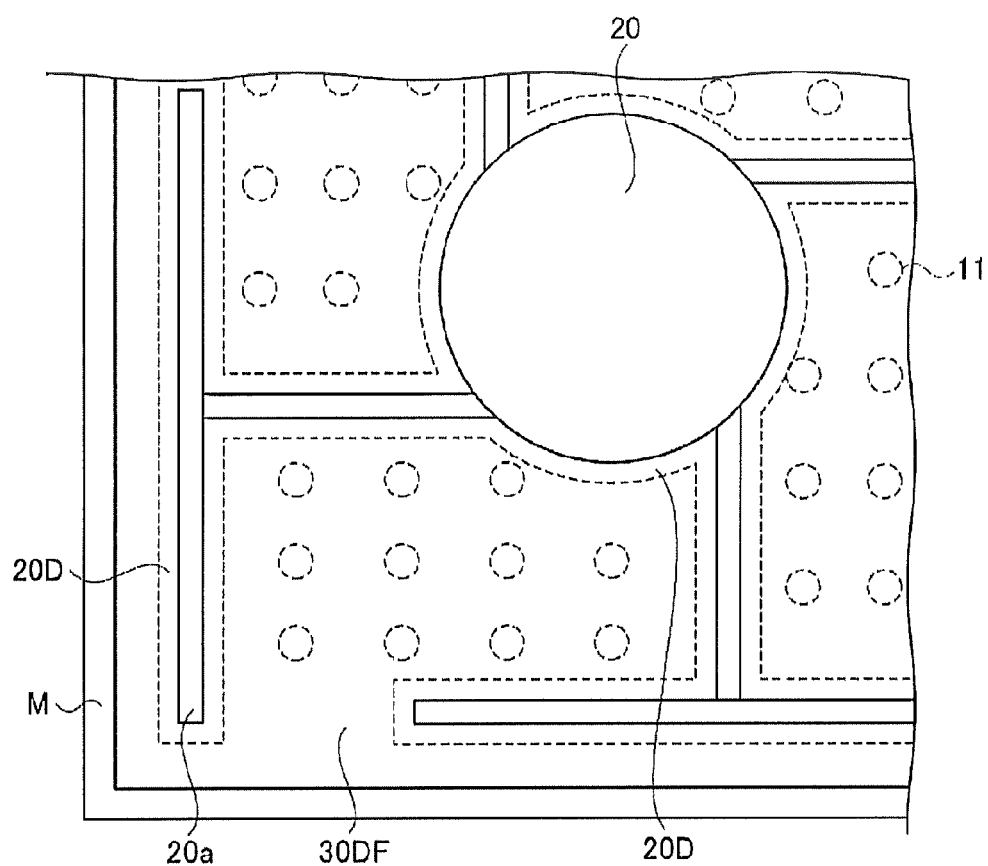
FIG. 14 schematically illustrates an enlarged plane pattern of the semiconductor light emitting device according to the first embodiment showing an aspect in which a frost-processed layer is not formed near surface electrode layers.

FIG. 14 schematically illustrates an enlarged plane pattern of the semiconductor light emitting device according to the first embodiment showing an aspect in which a frost-processed layer is not formed near the surface electrode layers 20 and 20a. Specifically, in the semiconductor light emitting device according to the first embodiment, although the frost process is performed, the non-formation region 20D without the frost-processed layer exists near the surface electrode layers 20 and 20a. This is because wraparound of etchant for the frost process is inhibited near the surface electrode layers 20 and 20a and thus the frost process is not sufficiently performed. The non-formation region 20D of the frosted layer is also as illustrated in FIGS. 2 to 4, 7 to 8, and 12 to 13.

(Aspect of Current)

Figure 15:
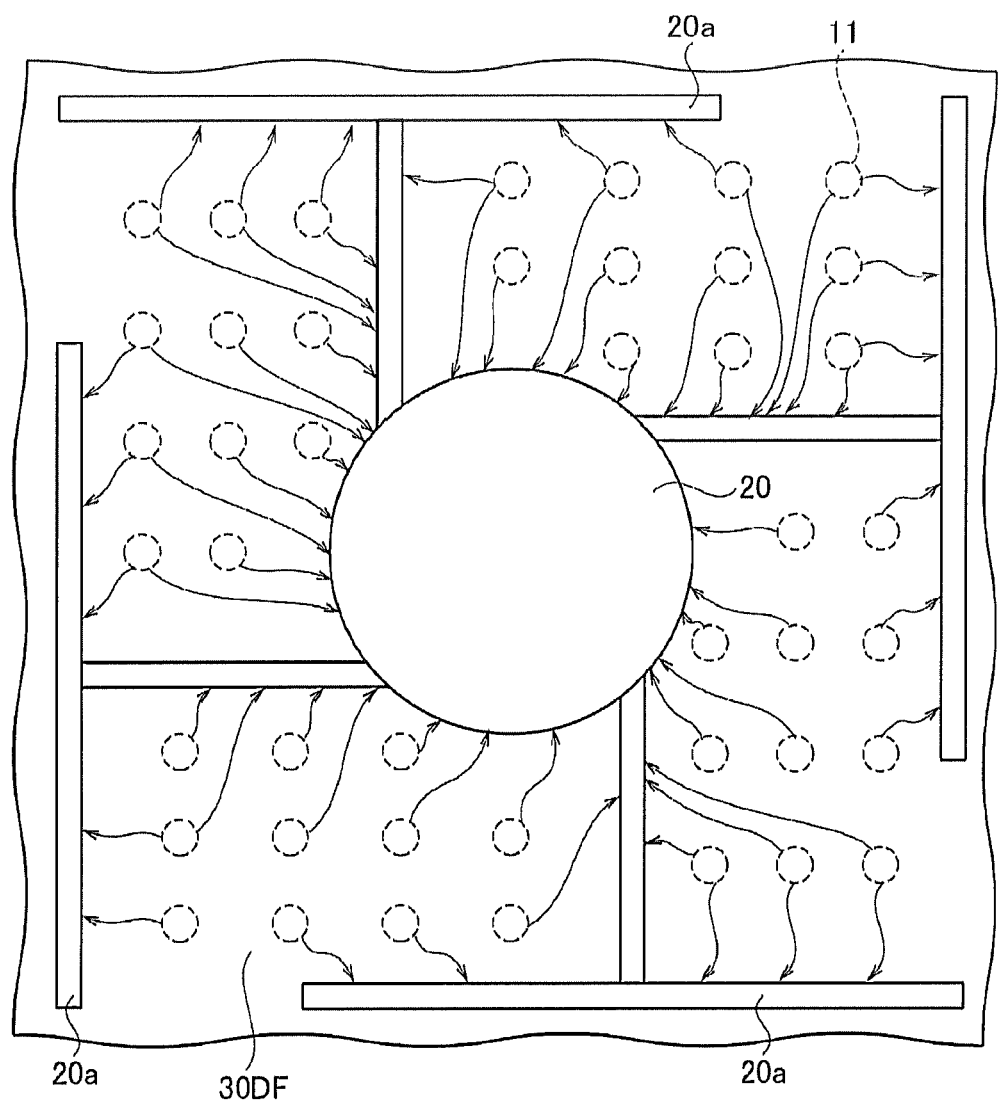
FIG. 15 schematically illustrates current that conduct between an internal ODR metal layer and the surface electrode layers in the semiconductor light emitting device according to the first embodiment.

FIG. 15 schematically illustrates current that conducts between the internal ODR metal layer 11 and the surface electrode layers 20 and 20a in the semiconductor light emitting device according to the first embodiment.

In the semiconductor light emitting device according to the first embodiment, the surface electrode layer 20 is disposed in the central portion on the plane pattern, and the T-shaped surface electrode layers 20a are connected to the surface electrode layer 20 and extend from the surface electrode layer 20 in four directions of four sides of the rectangle. Accordingly, light emission is efficiently performed by the current conduction between the back electrode layer 22 and the surface electrode layers 20 and 20a via the internal ODR metal layer 11, as schematically illustrated in FIG. 15.

Figure 16A:
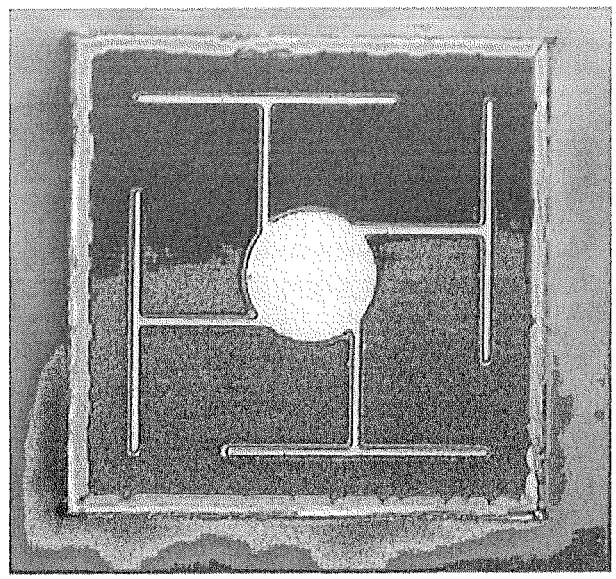
FIG. 16A is a photograph showing a surface of an experimentally manufactured semiconductor light emitting device according to the first embodiment.
Figure 16B:
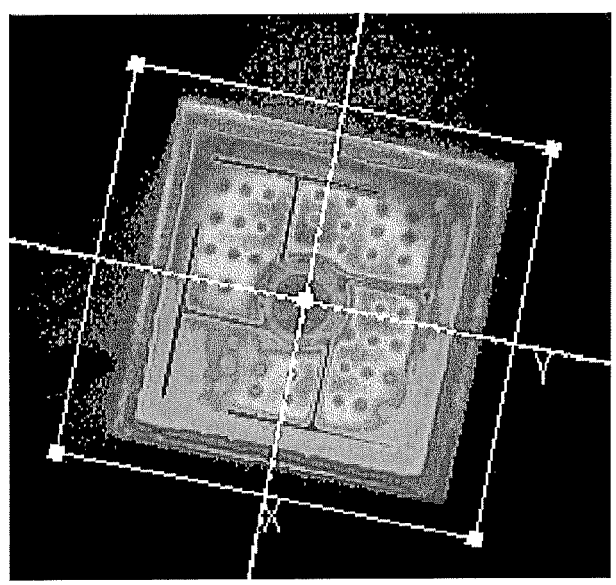
FIG. 16B is a photograph showing a surface of a light emitting brightness pattern of the experimentally manufactured semiconductor light emitting device according to the first embodiment.

FIG. 16A is an optical microscope photograph showing a surface of an experimentally manufactured semiconductor light emitting device according to the first embodiment. FIG. 16B shows a distribution of a light emitting brightness of the experimentally manufactured semiconductor light emitting device according to the first embodiment. With reference to FIG. 1, relatively more light is extracted from the portion of the double frost-processed layer 30DF in the device surface. In addition, portions in the device surface corresponding to the surface electrode layers 20 and 20a and the internal ODR metal layer 11 achieve relatively low brightness. Since a bonding wire exists in a left lower portion, the portion seems to achieve low brightness, but the portion emits light in the same manner as other portions actually.

(Relation Between First Frost Process Time and Rate of Increase in Brightness)

Figure 17:
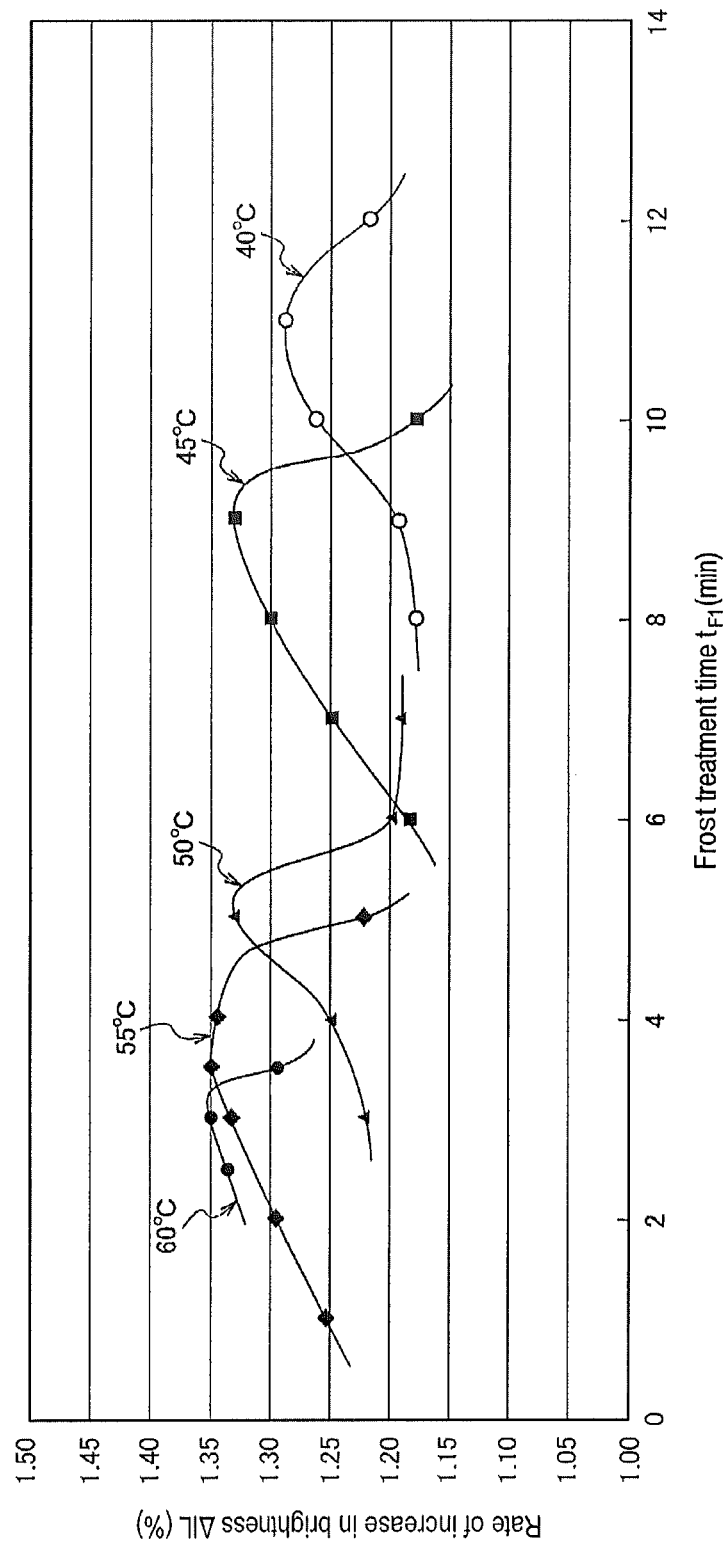
FIG. 17 shows a relation between a time for a first frost process and a rate of increase in brightness in which an etchant temperature is a parameter in the manufacturing process of the semiconductor light emitting device according to the first embodiment.
Figure 18A:
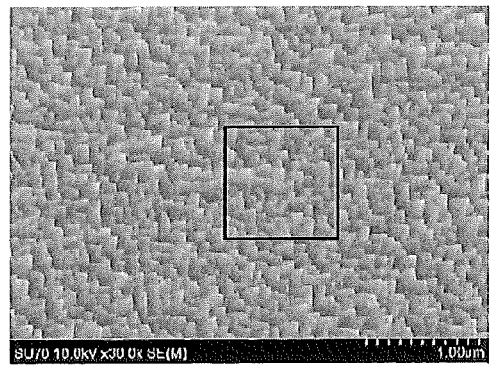
FIG. 18A is a SEM photograph showing a surface after a first frost process with an etchant temperature of 40 degrees C. and a frost process time of 3 minutes is performed in the manufacturing process of the semiconductor light emitting device according to the first embodiment.
Figure 18B:
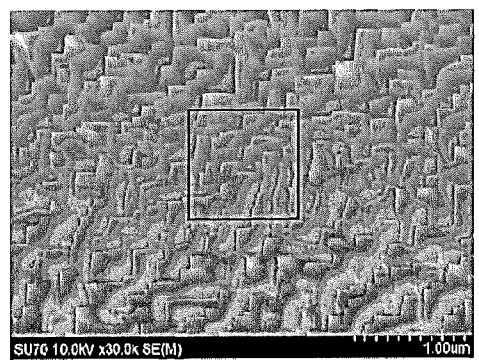
FIG. 18B is a SEM photograph showing a surface after a first frost process with an etchant temperature of 45 degrees C. and a frost process time of 3 minutes is performed in the manufacturing process of the semiconductor light emitting device according to the first embodiment.
Figure 18C:
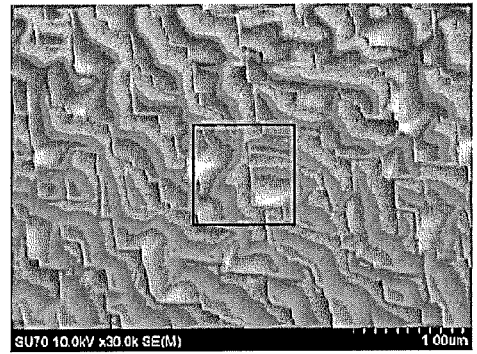
FIG. 18C is a SEM photograph showing a surface after a first frost process with an etchant temperature of 50 degrees C. and a frost process time of 3 minutes is performed in the manufacturing process of the semiconductor light emitting device according to the first embodiment.
Figure 18D:
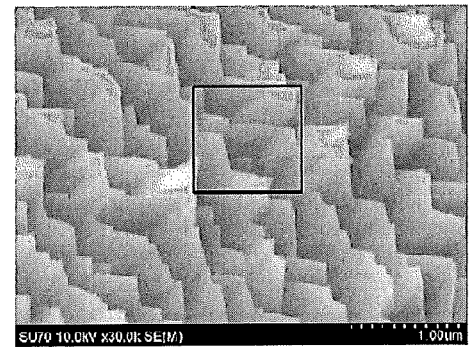
FIG. 18D is a SEM photograph showing a surface after a first frost process with an etchant temperature of 55 degrees C. and a frost process time of 3 minutes is performed in the manufacturing process of the semiconductor light emitting device according to the first embodiment.

FIG. 17 shows a relation between a time for a first frost process $t_{F1}$ and a rate of increase in brightness $\Delta IL$ (%) in which an etchant temperature is a parameter in the manufacturing process of the semiconductor light emitting device according to the first embodiment. As illustrated in FIG. 17, the etchant temperature varies to be 40 degrees C., 45 degrees C., 50 degrees C., 55 degrees C., and 60 degrees C., and the frost process time $t_{F1}$ seems to be relatively shortened with the rise of the temperature of the etchant. In addition, if the frost process time $t_{F1}$ is increased while the etchant temperature is maintained at 45 degrees C., 50 degrees C., or 60 degrees C., peak levels of the rate of increase in brightness $\Delta IL$ (%) decrease sharply from specific frost process times $t_{F1}$, respectively. The reason for the above is changes from the frost process mode FM to the etching process mode EM. On the other hand, in the example with the etchant temperature of 55 degrees C., the peak level of the rate of increase in brightness $\Delta IL$ (%) may be maintained high, for example, within specific frost process time $t_{F1}$ from 3.5 minutes to 4 minutes.

FIGS. 18A to 18D are SEM photographs showing surface examples after a first frost process with an etchant temperature of 40 degrees C. and a frost process time of 3 minutes, a first frost process with an etchant temperature of 45 degrees C. and a frost process time of 3 minutes, a first frost process with an etchant temperature of 50 degrees C. and a frost process time of 3 minutes, and a first frost process with an etchant temperature of 55 degrees C. and a frost process time of 3 minutes are performed, respectively, in the manufacturing process of the semiconductor light emitting device according to the first embodiment. In FIGS. 18A to 18D, the numbers of uneven portions in the surfaces after the first frost process, which are located within one micron square, are 98, 27, 8, and 6, respectively.

As illustrated in FIG. 17, an optimal frost process time $t_{F1}$ may be different according to the etchant temperature and a peak level of the rate of increase in brightness $\Delta IL$ (%) may be achieved with a relatively short frost process time $t_{F1}$ as the etchant temperature increases.

Furthermore, as the etchant temperature increases, the peak level of the rate of increase in brightness $\Delta IL$ (%) may tend to increase, as illustrated in FIG. 17. For example, the peak in the case of 40 degrees C. is approximately 1.29, the peak in the case of 50 degrees C. is approximately 1.33, and the peak in the case of 60 degrees C. is approximately 1.35.

As illustrated in FIGS. 18A to 18D, as the etchant temperature increases, unevenness of the roughened device surface may tend to increase.

(Relation Between Second Frost Process Time and Rate of Increase in Brightness)

Figure 19:
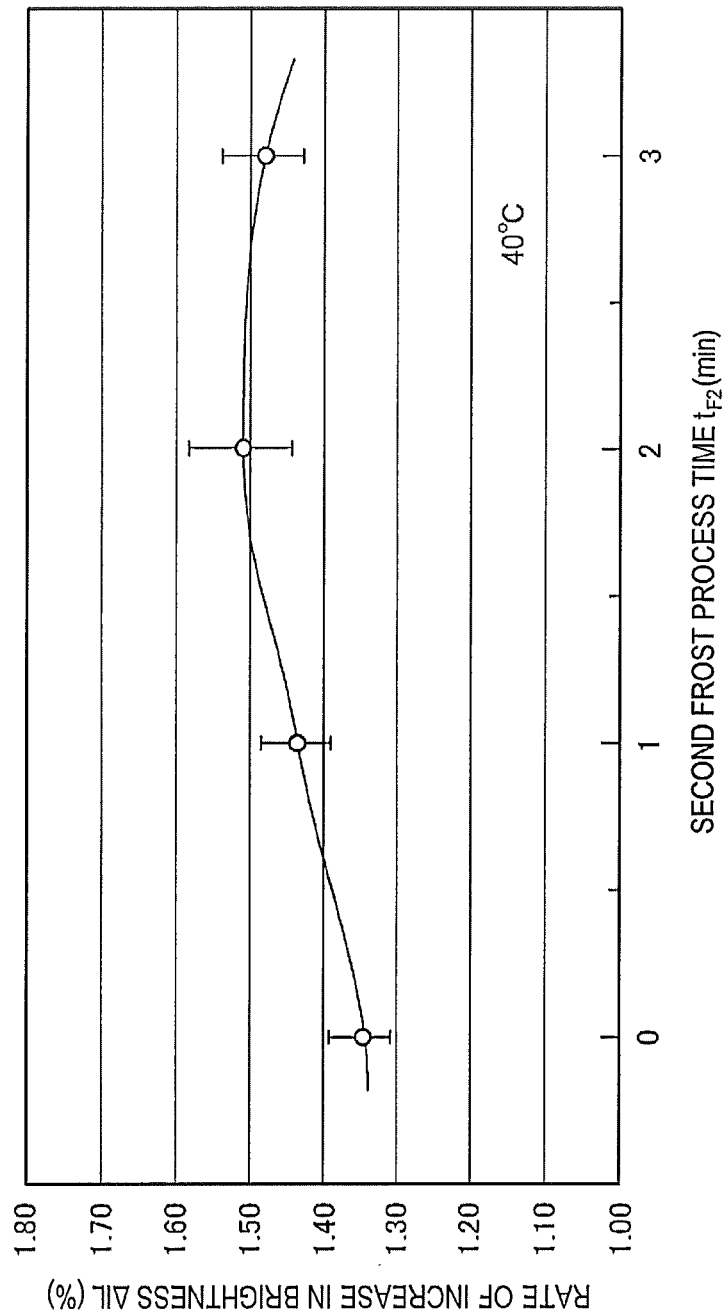
FIG. 19 shows a relation between a time for a second frost process with an etchant temperature of 40 degrees C. and a rate of increase in brightness in the manufacturing process of the semiconductor light emitting device according to the first embodiment, in a case where a first frost process with an etchant temperature of 55 degrees C. and a frost process time of 3 minutes and 30 seconds is performed.

FIG. 19 shows a relation between a time for a second frost process $t_{F2}$ with an etchant temperature of 40 degrees C. and a rate of increase in brightness $\Delta IL$ (%) in the manufacturing process of the semiconductor light emitting device according to the first embodiment, in a case where a first frost process with an etchant temperature of 55 degrees C. and a frost process time $t_{F2}$ of 3 minutes and 30 seconds is performed.

FIGS. 20A to 20D are SEM photographs showing a surface of a reference example for which a first frost process with an etchant temperature of 55 degrees C. and a frost process time of 3 minutes and 30 seconds is performed but a second frost process is not performed, a surface for which a second frost process with an etchant temperature of 40 degrees C. and a frost process time of 1 minute is performed, a surface for which a second frost process with an etchant temperature of 40 degrees C. and a frost process time of 2 minutes is performed, and a surface for which a second frost process with an etchant temperature of 40 degrees C. and a frost process time of 3 minutes is performed, respectively, in the manufacturing process of the semiconductor light emitting device according to the first embodiment.

Figure 20A:
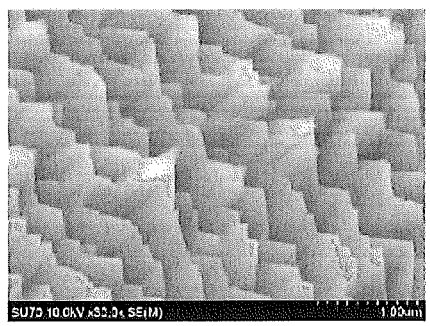
FIG. 20A is a SEM photograph showing a surface of a reference example for which a first frost process with an etchant temperature of 55 degrees C. and a frost process time of 3.5 minutes is performed but a second frost process is not performed, in the manufacturing process of the semiconductor light emitting device according to the first embodiment.
Figure 20B:
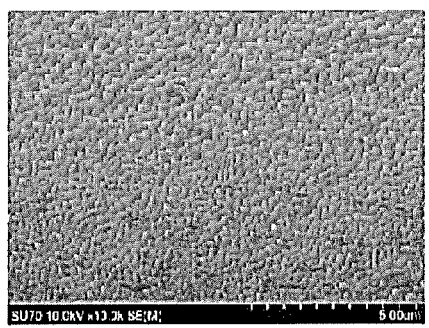
FIG. 20B is a SEM photograph showing a surface for which a first frost process with an etchant temperature of 55 degrees C. and a frost process time of 3 minutes is performed and a second frost process with an etchant temperature of 40 degrees C. and a frost process time of 1 minute is performed, in the manufacturing process of the semiconductor light emitting device according to the first embodiment.
Figure 20C:
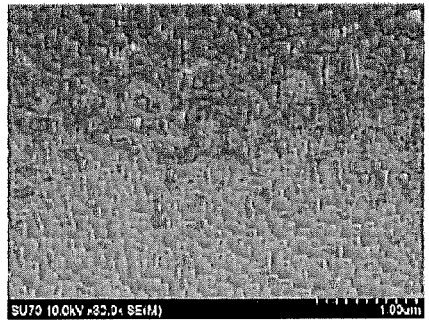
FIG. 20C is a SEM photograph showing a surface for which a first frost process with an etchant temperature of 55 degrees C. and a frost process time of 3 minutes is performed and a second frost process with an etchant temperature of 40 degrees C. and a frost process time of 2 minutes is performed, in the manufacturing process of the semiconductor light emitting device according to the first embodiment.
Figure 20D:
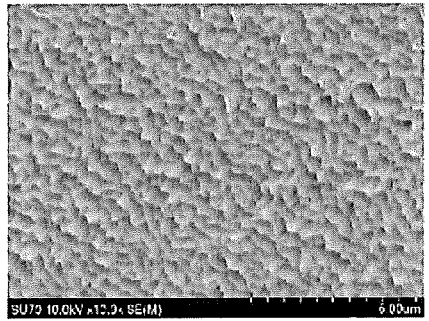
FIG. 20D is a SEM photograph showing a surface for which a first frost process with an etchant temperature of 55 degrees C. and a frost process time of 3 minutes is performed and a second frost process with an etchant temperature of 40 degrees C. and a frost process time of 3 minutes is performed, in the manufacturing process of the semiconductor light emitting device according to the first embodiment.
Figure 21A:
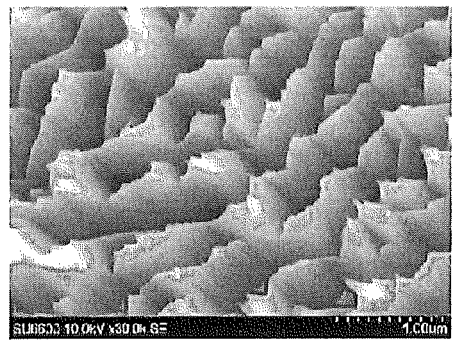
FIG. 21A is an enlarged SEM photograph for the surface of FIG. 20B.
Figure 21B:
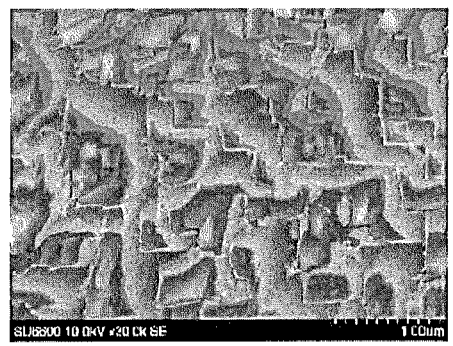
FIG. 21B is an enlarged SEM photograph for the surface of FIG. 20C.
Figure 21C:
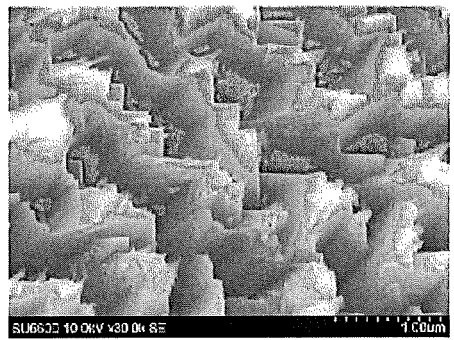
FIG. 21C is an enlarged SEM photograph for the surface of FIG. 20D.

Furthermore, FIG. 21A is an enlarged SEM photograph for the surface of FIG. 20B, FIG. 21B is an enlarged SEM photograph for the surface of FIG. 20C, and FIG. 21C is an enlarged SEM photograph for the surface of FIG. 20D.

In contrast to a relatively coarse unevenness structure as illustrated in FIG. 20A, relatively fine unevenness structures are formed in relatively coarse unevenness structures by the double frost process, as illustrated in FIGS. 20B to 20D. In addition, the relatively coarse unevenness structures and the relatively fine unevenness structures are also generally uniformly formed in frost process regions.

In the manufacturing process of the semiconductor light emitting device according to the first embodiment, when compared to the reference example (for which the first frost process with the temperature of the etchant of 55 degrees C. and the frost process time of 3.5 minutes is performed) without performing a second frost process, the rate of increase in brightness $\Delta IL$ (%) increases approximately by 15% by the effect of the double frost process including the second frost process condition associated with FIG. 20C (i.e., the etchant temperature of 40 degrees C. and the frost process time of 2 minutes).

Figure 22A:
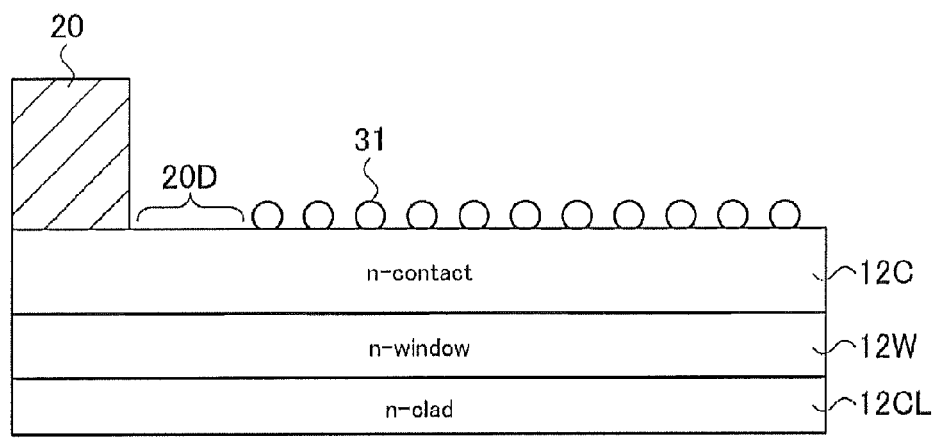
FIG. 22A schematically illustrates a structure in a state where a first frost process is performed on a surface of an n-type contact layer in the manufacturing process of the semiconductor light emitting device according to the first embodiment, in a cross-sectional view.
Figure 22B:
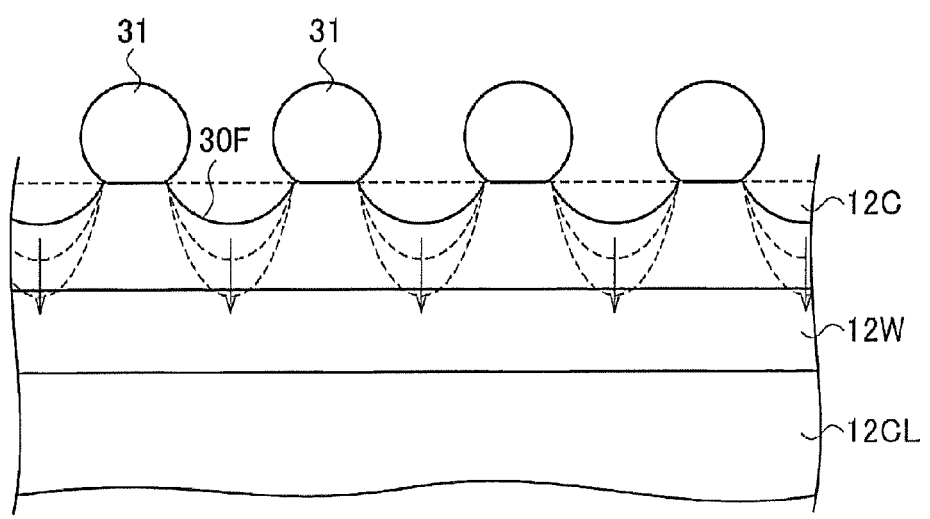
FIG. 22B schematically illustrates a structure showing an etching progress status of FIG. 22A, in a cross-sectional view.

FIG. 22A schematically illustrates a structure in a state where a first frost process is performed on the surface of the n-type contact layer 12C in the manufacturing process of the semiconductor light emitting device according to the first embodiment, in a cross-sectional view. FIG. 22B schematically illustrates a structure showing an etching progress status of FIG. 22A, in a cross-sectional view.

For example, the etchant applied to the frost process includes acetic acid, hydrochloric acid, water, and an additive. For example, sodium acetate or the like can be used as the additive. Here, the hydrochloric acid promotes etching and the acetic acid has a function of relaxing an etching rate. The additive acts as an etching nucleus and serves as a mask during etching. For example, several kinds of additives other than sodium acetate may be mixed and used as the additive.

When the first frost process is performed on the n-type contact layer 12C, the additive 31 may be attached on the surface of the n-type contact layer 12C at predetermined intervals, as illustrated in FIG. 22A. As such, while the additive 31 functions as masks in the first frost process, as illustrated in an arrow in FIG. 22B, etching proceeds from the surface of the n-type contact layer 12C so that and the frost-processed layer 30F is formed. In this case, the etching proceeds using the hydrochloric acid included in the etchant employed in the frost process.

Figure 23A:
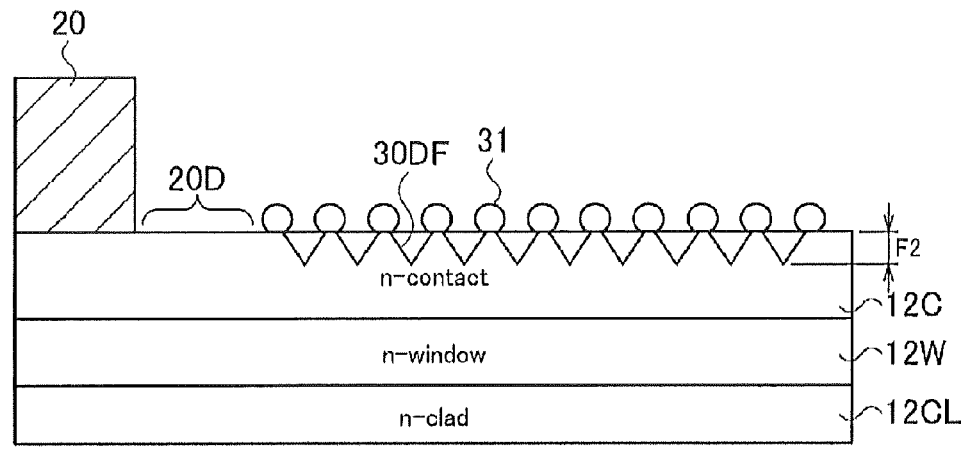
FIG. 23A schematically illustrates a structure in a state where a second frost process is performed deeply on an interior of the n-type contact layer in the manufacturing process of the semiconductor light emitting device according to the first embodiment, in a cross-sectional view.

FIG. 23A schematically illustrates a structure in a state where a second frost process is performed deeply on an interior of the n-type contact layer in the manufacturing process of the semiconductor light emitting device according to the first embodiment, in a cross-sectional view. In this case, the double frost-processed layer 30DF may have the peak-to-peak unevenness height of F2 as illustrated in FIG. 12B. In addition, FIG. 23B schematically illustrates a structure showing an etching progress status of FIG. 23A, in a cross-sectional view.

Figure 23B:
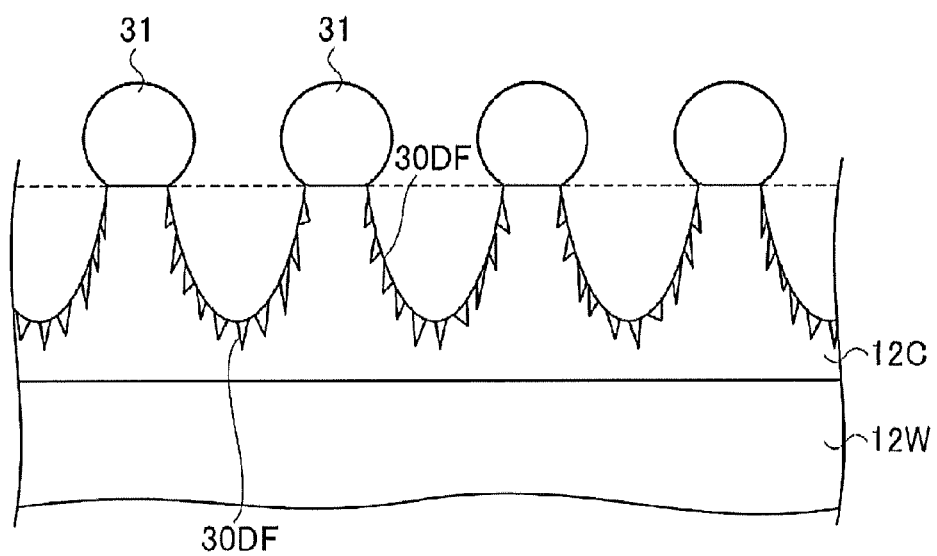
FIG. 23B schematically illustrates a structure showing an etching progress status of FIG. 23A, in a cross-sectional view.

While the second frost process is performed deeply on the interior of the n-type contact layer 12C, the additive 31 may be disposed on the surface of the n-type contact layer 12C at predetermined intervals as illustrated in FIG. 23A to serve as masks as illustrated in FIG. 23B. Thus, etching proceeds deeply from the surface of the n-type contact layer 12C so that the double frost-processed layer 30DF is formed.

Figure 24A:
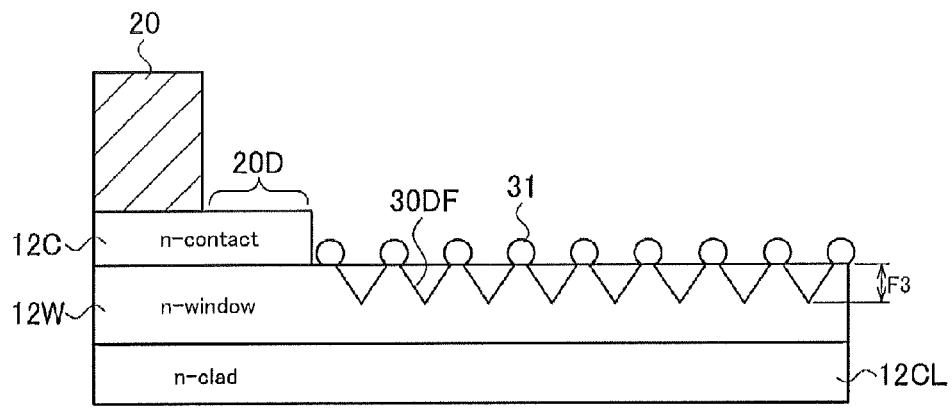
FIG. 24A schematically illustrates a structure in a state where a second frost process is performed deeply on an interior of an n-type window layer in the manufacturing process of the semiconductor light emitting device according to the first embodiment, in a cross-sectional view.
Figure 24B:
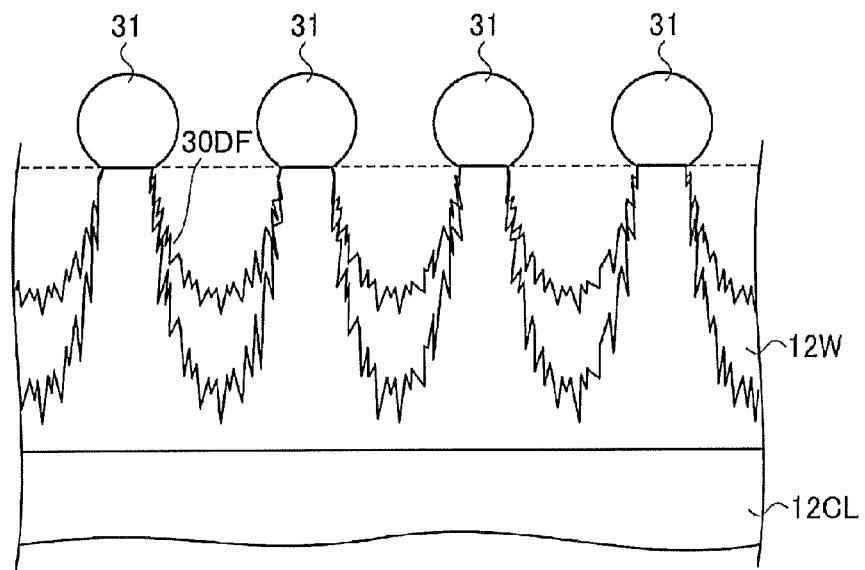
FIG. 24B schematically illustrates a structure showing an etching progress status of FIG. 24A, in a cross-sectional view.

FIG. 24A schematically illustrates a structure in a state where a second frost process is performed deeply on an interior of the n-type window layer 12W in the manufacturing process of the semiconductor light emitting device according to the first embodiment, in a cross-sectional view. In this case, the double frost-processed layer 30DF has the peak-to-peak unevenness height of F3 as illustrated in FIG. 13A. FIG. 24B schematically illustrates a structure showing an etching progress status of FIG. 24A, in a cross-sectional view.

While the second frost process is performed deeply on the interior of the n-type window layer 12W, the additive 31 may be disposed on the surface of the n-type contact layer 12C at predetermined intervals as illustrated in FIG. 24A to serve as masks as illustrated in FIG. 24B. Thus, etching proceeds deeply from the surface of the n-type window layer 12W so that the double frost-processed layer 30DF is formed. FIG. 24B also schematically illustrates a case in which a depth of a valley in the uneven surface is deeper.

If the etching further proceeds in the illustrated structure of FIGS. 23A and 23B, the n-type contact layer 12C may be removed up to its bottom. If the etching proceeds further, the additive 31 is attached to the surface of the etched n-type window layer 12W again and the uneven structure is formed. The unevenness increases by repeatedly performing the frost process mode FM and the etching process mode EM.

(Device Cross-Sectional SEM Photograph)

Figure 25A:
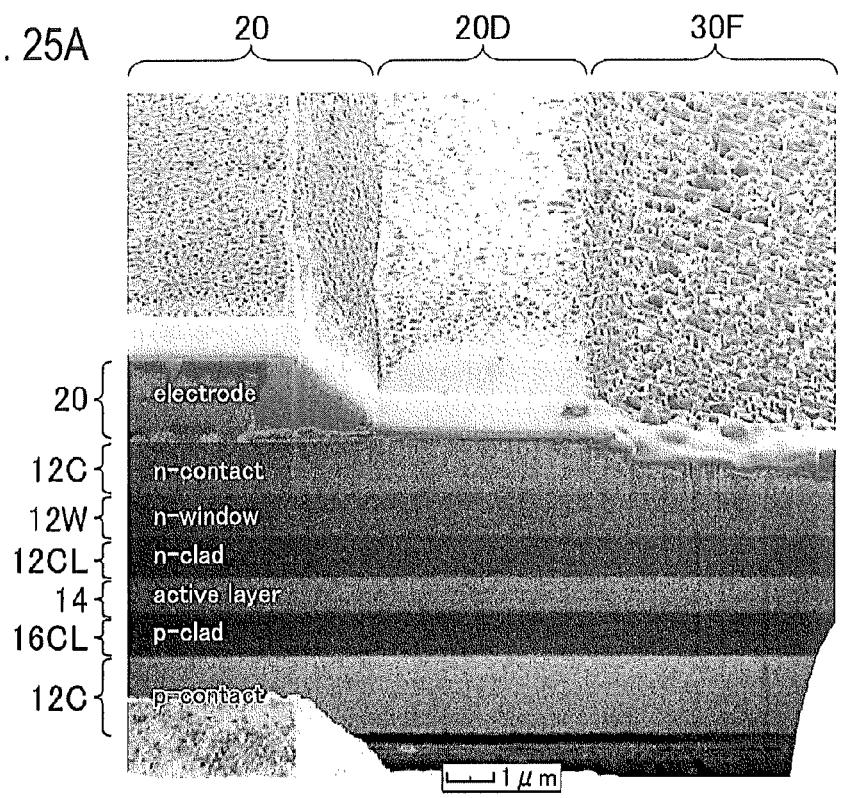
FIG. 25A is an example of a device cross-sectional SEM photograph of the semiconductor light emitting device according to the first embodiment after a first frost process with an etchant temperature of 50 degrees C. and a frost process time of 3 minutes is performed.
Figure 25B:
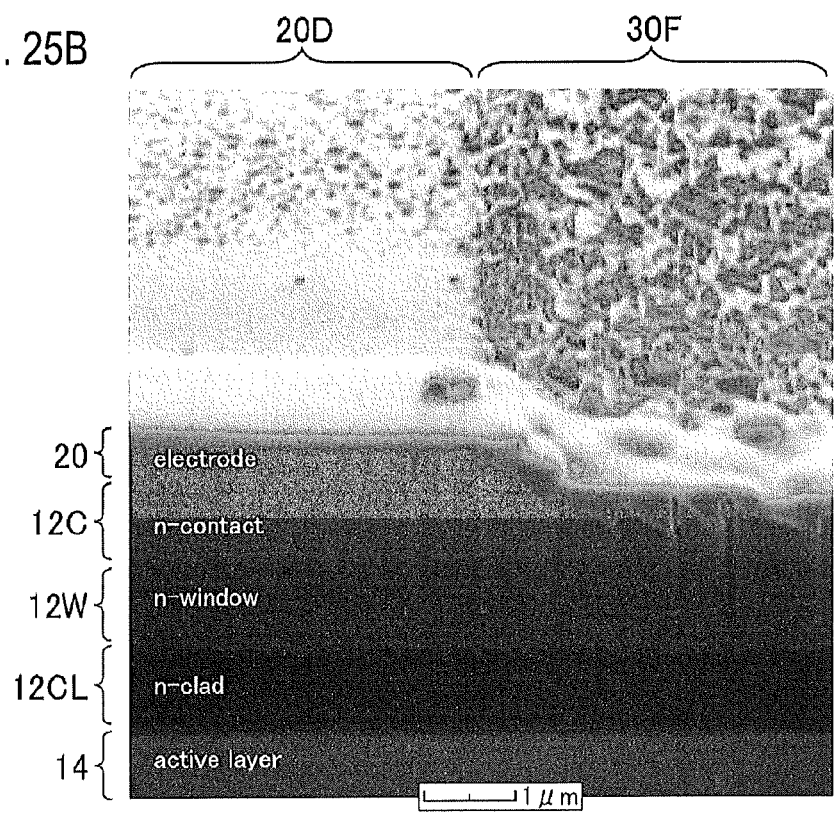
FIG. 25B is an example of an enlarged device cross-sectional SEM photograph of FIG. 25A.

FIG. 25A is an example of a device cross-sectional SEM photograph of the semiconductor light emitting device according to the first embodiment after a first frost process with an etchant temperature of 50 degrees C. and a frost process time of 3 minutes is performed. FIG. 25B is an example of an enlarged device cross-sectional SEM photograph of FIG. 25A.

As illustrated in FIGS. 25A and 25B, a peripheral portion of the surface electrode layer 20 are not etched in the frost process. Thus, the non-formation region 20D having a width of approximately several μm is observed in the peripheral portion of the surface electrode layer 20. Further, in a range spaced from the surface electrode layer 20 by the non-formation region 20D, the first frost-processed layer 30F is formed on the surface of the n-type contact layer 12C.

(Frost Process Mode and Etching Process Mode)

Figure 26A:
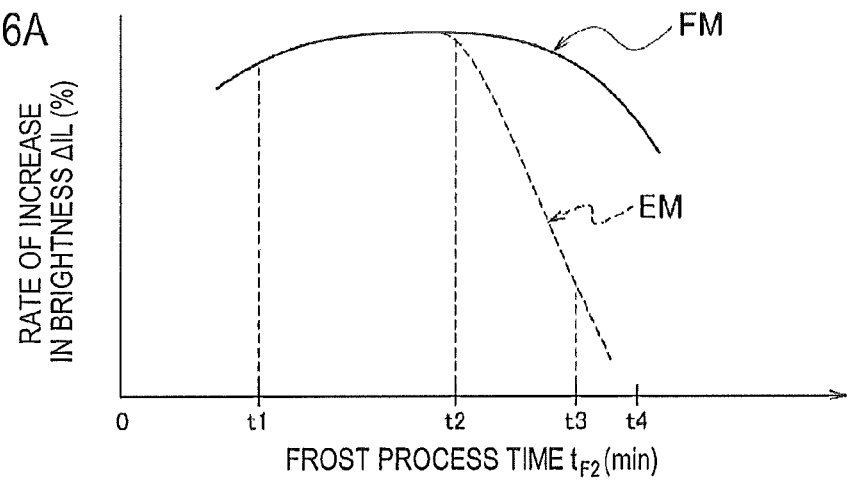
FIG. 26A schematically illustrates a relation between a frost process time and a rate of increase in brightness in a frost process mode and an etching process mode.

FIG. 26A schematically illustrates a relation between a frost process time $t_{F2}$ and a rate of increase in brightness ΔIL (%) in a frost process mode FM and an etching process mode EM in the manufacturing process of the semiconductor light emitting device according to the first embodiment. In addition, FIG. 26B to 26E schematically illustrate structures in which wet etching is performed on the surface of the n-type window layer 12W, in a cross-sectional view.

Figure 26B:
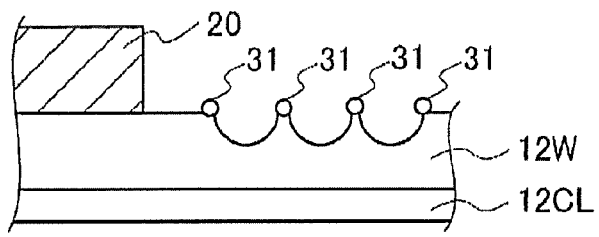
FIG. 26B schematically illustrates a structure of an aspect in which wet etching is performed on a surface of an n-type window layer in the manufacturing process of the semiconductor light emitting device according to the first embodiment, in a cross-sectional view.

In surface etching of the n-type window layer in the manufacturing process of the semiconductor light emitting device according to the first embodiment, downward etching and lateral etching are performed uniformly as illustrated in FIG. 26B since the wet etching is isotropic etching.

Figure 26C:
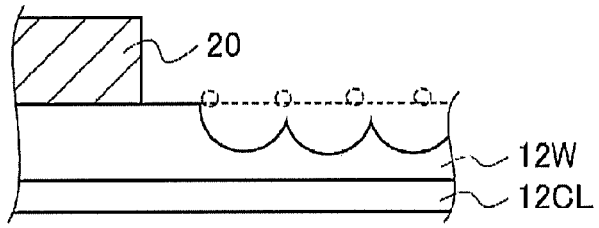
FIG. 26C schematically illustrates a structure of an aspect in which the wet etching on the n-type window layer proceeds, in a cross-sectional view.

FIG. 26C schematically illustrates a structure of an aspect in which the wet etching on the n-type window layer 12W proceeds, in a cross-sectional view.

Figure 26D:
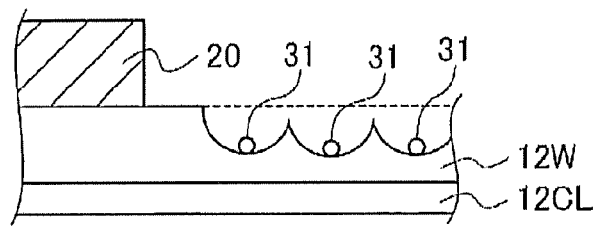
FIG. 26D schematically illustrates a structure of an aspect in which the wet etching on the n-type window layer proceeds while an additive is attached to new locations, in a cross-sectional view.

FIG. 26D schematically illustrates a structure of an aspect in which the wet etching on the n-type window layer 12W proceeds while the additive 31 is attached to new locations, in a cross-sectional view.

Figure 26E:
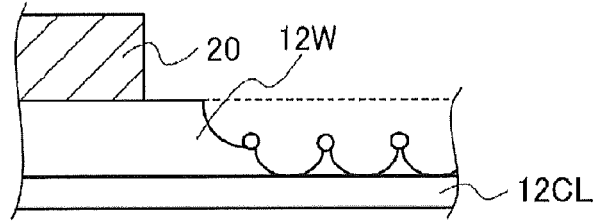
FIG. 26E schematically illustrates a structure of an aspect in which the wet etching on the n-type window layer further proceeds to reach a clad layer, in a cross-sectional view.

FIG. 26E schematically illustrates a structure of an aspect in which the wet etching on the n-type window layer proceeds further and reaches the clad layer 12CL, in a cross-sectional view.

In the manufacturing process of the semiconductor light emitting device according to the first embodiment, if the frost process time $t_{F2}$ increases while the etchant temperature is maintained, the peak level of the rate of increase in brightness ΔIL (%) decreases sharply from a specific frost process time $t_2$. The reason for the above is changing from the frost process mode FM to the etching process mode EM. Specifically, as illustrated in FIGS. 26B to 26E, if the etching process mode EM in the double frost process proceeds so that the bottom of the n-type window layer 12W is etched and the etching reaches the n-type clad layer 12CL, the peak level of the rate of increase in brightness ΔIL (%) decreases sharply.

On the other hand, in the example of the frost process mode FM, the peak level of rate of increase in brightness of ΔIL (%) is maintained high, for example, within a range of specific frost process time $t_1$ to $t_4$.

According to the first embodiment, as a method of improving the brightness of the LED device, efficiency of light extraction can be improved by performing an additional roughening process on a rough surface in a device surface. The method forms a relatively coarse uneven shape on the device surface by performing a first surface roughening process at a relatively high temperature and then forms a relatively fine uneven shape on the relatively coarse uneven shape, which has been formed in advance, by performing a second surface roughening process at a relatively lower temperature than that in the first surface roughening process. Therefore, a rate of increase in brightness ΔIL by the frost process ranges from approximately 30% to approximately 40% in the first surface roughening process, but the rate of increase in brightness ΔIL increases to range from approximately 45% to approximately 45% in the second surface roughening process.

As such, according to the first embodiment, the efficiency of light extraction in the device surface is improved by performing a method of forming a new frost shape on which a first surface roughening process is performed at a relatively high temperature to form a coarse uneven shape on the device surface and then the second surface roughening process is performed at a relatively lower temperature than that in the first surface roughening process to form a relatively fine uneven shape (from approximately 0.05 μm to approximately 0.2 μm for peak-to-peak) on the relatively coarse uneven shape (from approximately 0.3 μm to approximately 1.0 μm for peak-to-peak). For example of the process conditions, if the first surface roughening process is performed under an etching temperature of 55 degrees C. and a process time of 3.5 minutes is performed and the second surface roughening process is performed under an etching temperature 40 degrees C. and a process time of 2.0 minutes, brightness increases approximately 15% by miniaturizing the frost shape.

According to the first embodiment, by performing a plurality of times the frost process on the LED device surface, it becomes possible to provide a semiconductor light emitting device having improved brightness and a method of manufacturing such a semiconductor light emitting device.

First Modified Example of First Embodiment

Figure 27:
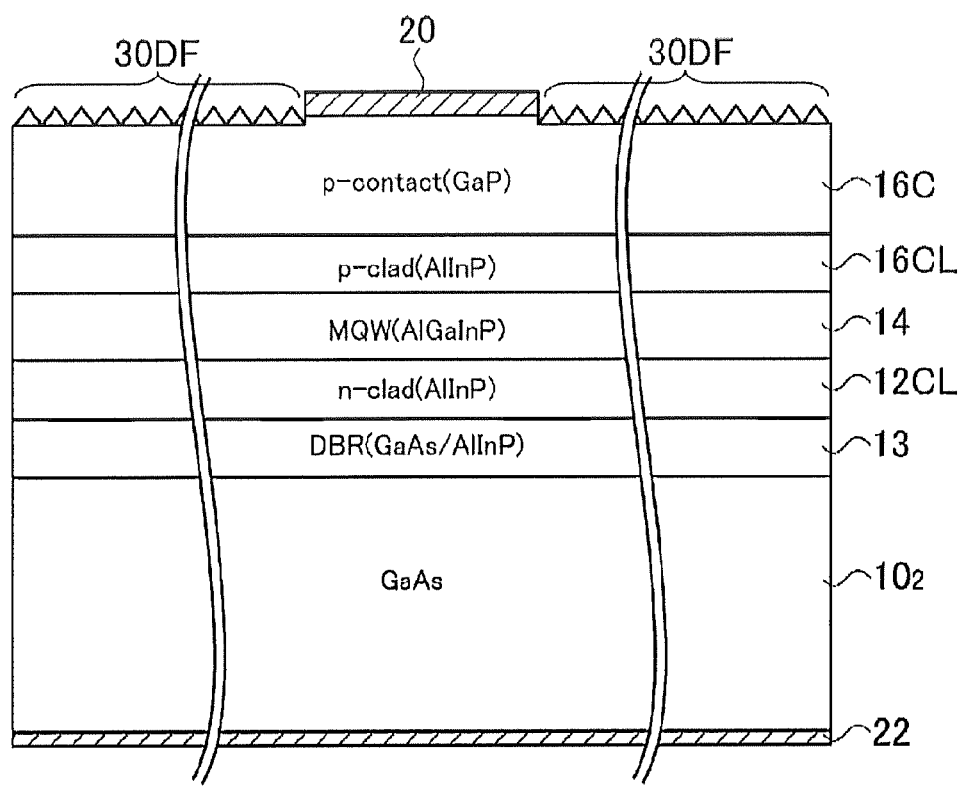
FIG. 27 schematically illustrates a structure of a semiconductor light emitting device according to a first modified example of the first embodiment, in a cross-sectional view.

FIG. 27 schematically illustrates a structure of a semiconductor light emitting device according to a first modified example of the first embodiment, in a cross-sectional view. The semiconductor light emitting device according to the first modified example of the first embodiment is a GaP-based semiconductor light emitting device and configured to emit visible light.

As illustrated in FIG. 27, the semiconductor light emitting device according to the first modified example of the first embodiment includes the substrate $10_2$, the first clad layer 12CL of a first conductivity type disposed on the substrate $10_2$, the MQW layer 14 disposed on the first clad layer 12CL, the second clad layer 16CL of a second conductivity type disposed on the MQW layer 14, the contact layer 16C of the second conductivity type disposed on the second clad layer 16CL, and the frost-processed layer 30DF disposed on the surface of the contact layer 16C.

The frost-processed layer 30DF may be formed by performing a frost process a plurality of times on the surface or the stepped surface of the contact layer 16C.

Further, the plurality of frost processes may be wet etched a plurality of times on the contact layer 16C.

Furthermore, the plurality of frost processes may be performed by wet etching twice on the contact layer 16C while an etching temperature for a second frost process may be set lower than an etching temperature for a first frost process.

In addition, the frost-processed layer 30DF may be formed as a GaP layer.

Further, the substrate $10_2$ may be formed of GaAs, the first clad layer 12CL and the second clad layer 16CL may be formed as AlInP layers, and the MQW layer 14 may be formed of pairs of InGaP/AlGaInP.

Furthermore, a distributed Bragg reflector (DBR) layer 13 is inserted between the substrate $10_2$ and the first clad layer 12CL. For example, the DBR layer 13 may be formed as one of GaP/AlInP, GaAs/AlGaAs, and GaAs/AlInP pairs.

In the semiconductor light emitting device according to the first modified example of the first embodiment, the frost process may be performed by a double frost process or a multi-frost process while conditions for the frost process may be similar to those of the first embodiment.

According to the first modified example of the first embodiment, in the same manner as the first embodiment, by performing the frost process a plurality of times on the LED device surface, it becomes possible to provide a semiconductor light emitting device having improved brightness.

Second Modified Example of First Embodiment

Figure 28:
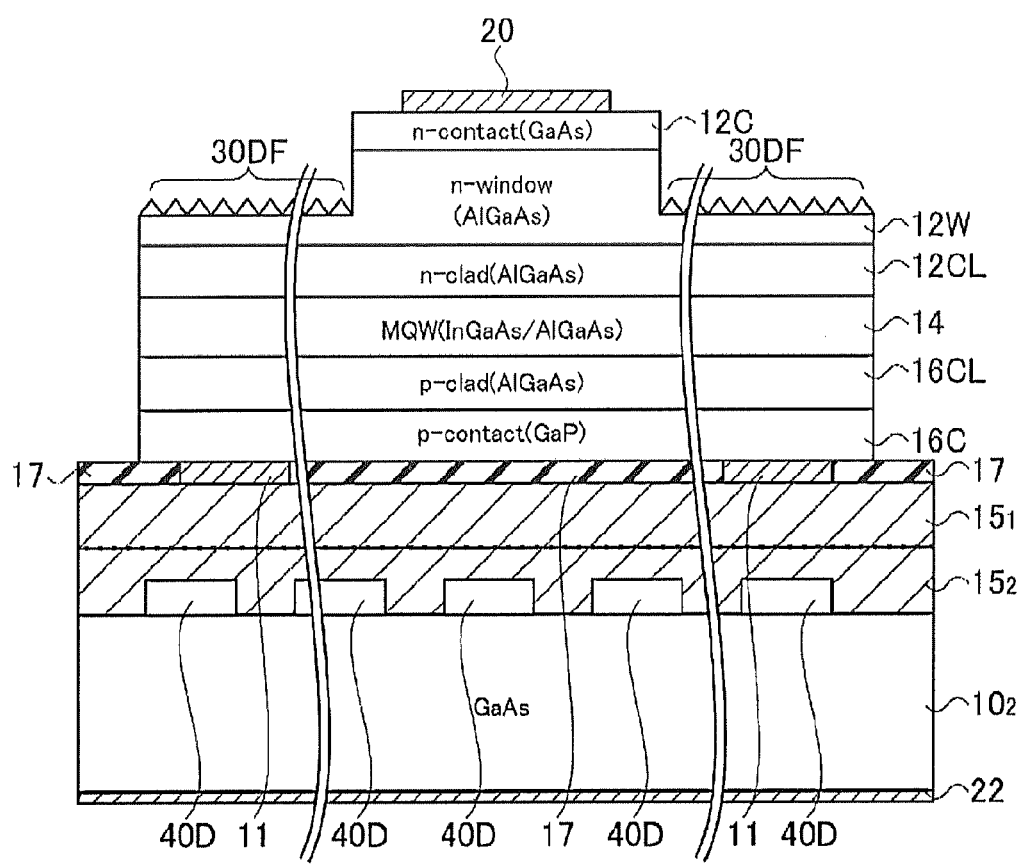
FIG. 28 schematically illustrates a structure of a semiconductor light emitting device according to a second modified example of the first embodiment, in a cross-sectional view.

FIG. 28 schematically illustrates a structure of a semiconductor light emitting device according to a second modified example of the first embodiment, in a cross-sectional view. The semiconductor light emitting device according to the second modified example of the first embodiment is an AlGaAs-based semiconductor light emitting device and configured to emit infrared light.

As illustrated in FIG. 28, the schematic cross-sectional structure of the semiconductor light emitting device according to the second modified example of the first embodiment includes the substrate $10_2$, the p-type contact layer 16C disposed on the substrate $10_2$, the p-type clad layer 16CL disposed on the p-type contact layer 16C, the MQW layer 14 disposed on the p-type clad layer 16CL, the n-type clad layer 12CL disposed on the MQW layer 14, the n-type window layer 12W disposed on the n-type clad layer 12CL, and the n-type contact layer 12C disposed on the n-type window layer 12W.

The double frost-processed layer 30DF having an uneven shape is formed through a double frost process on the surface or the etched stepped surface of the n-type window layer 12W.

The substrate $10_2$ may be formed of GaAs and the step structures 40D may be formed on the surface of the substrate $10_2$ at a predetermined pattern pitch. The step structure 40D may be configured as a structure formed by etching the substrate $10_2$ or as an air gap structure.

The metal layer $15_2$ is disposed on the substrate $10_2$ and the step structure 40D. Further, the metal layer $15_2$ adheres to the metal layer $15_1$ by bonding.

The insulating layer 17 and the ODR metal layer 11 are disposed on the metal layer $15_1$ in a predetermined pattern.

The back electrode layer 22 is disposed on a back side of the substrate $10_2$ and the surface electrode layer 20 is disposed on a surface of the n-type contact layer (i.e., GaAs layer) 12C. For example, both the surface electrode layer 20 and the back electrode layer 22 may be formed as Au layers.

The p-type contact layer 16C may be formed as a GaP layer, the p-type clad layer 16CL may be formed as an AlGaAs layer, and the MQW layer 14 may be formed as pairs of InGaAs/AlGaAs. Furthermore, the n-type clad layer 12CL may be formed as an AlGaAs layer, the n-type window layer 12W may be formed as an AlGaAs layer, and the n-type contact layer 12C may be formed as a GaAs layer.

The frost-processed layer 30DF may be formed as an AlGaAs layer.

In the semiconductor light emitting device according to the second modified example of the first embodiment, the frost process may be performed by a double frost process or a multi-frost process while conditions for the frost process may be similar to those for the first embodiment.

In the second modified example of the first embodiment, by performing the frost process a plurality of times on the LED device surface in the same manner as the first embodiment, it becomes possible to provide a semiconductor light emitting device having improved brightness.

Third Modified Example of First Embodiment

Figure 29:
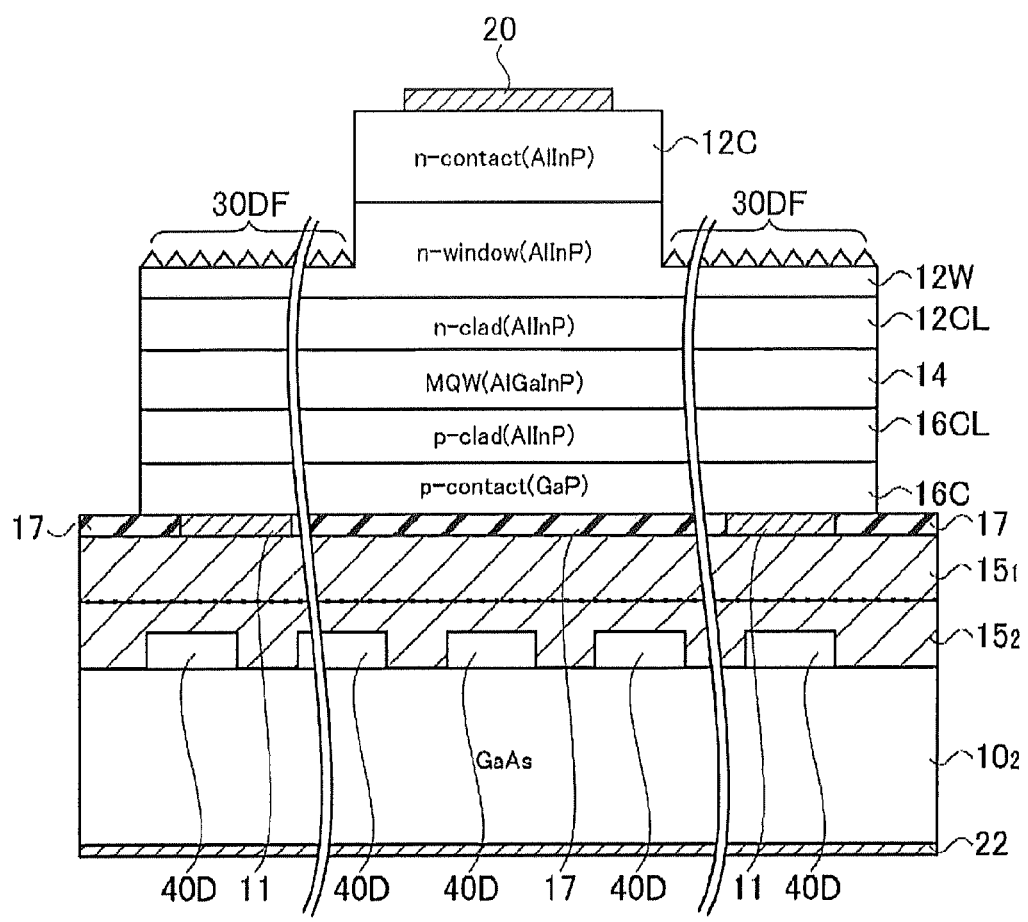
FIG. 29 schematically illustrates a structure of a semiconductor light emitting device according to a third modified example of the first embodiment, in a cross-sectional view.

FIG. 29 schematically illustrates a structure of a semiconductor light emitting device according to a third modified example of the first embodiment, in a cross-sectional view. The semiconductor light emitting device according to the third modified example of the first embodiment is an AlInP-based semiconductor light emitting device and configured to emit visible light.

As illustrated in FIG. 29, the schematic cross-sectional structure of the semiconductor light emitting device according to the third modified example of the first embodiment includes the substrate $10_2$, the p-type contact layer 16C disposed on the substrate $10_2$, the p-type clad layer 16CL disposed on the p-type contact layer 16C, the MQW layer 14 disposed on the p-type clad layer 16CL, the n-type clad layer 12CL disposed on the MQW layer 14, the n-type window layer 12W disposed on the n-type clad layer 12CL, and the n-type contact layer 12C disposed on the n-type window layer on 12W.

The double frost-processed layer 30DF having an uneven shape is formed through a double frost process on the surface or the etched stepped surface of the n-type window layer 12W.

The substrate $10_2$ may be formed of GaAs and the step structures 40D may be formed on the surface of the substrate $10_2$ at a predetermined pattern pitch. The step structures 40D may be configured as a structure formed by etching the substrate $10_2$ or as an air gap structure.

The metal layer $15_2$ is disposed on the substrate $10_2$ and the step structure 40D. Furthermore, the metal layer $15_2$ adheres to the metal layer $15_1$ by bonding.

The insulating layer 17 and the ODR metal layer 11 are disposed on the metal layer $15_1$ in a predetermined pattern.

The back electrode layer 22 is disposed on the back side of the substrate 10 and the surface electrode layer 20 is disposed on the surface of the n-type contact layer (i.e., AlInP layer) 12C. For example, both the surface electrode layer 20 and the back electrode layer 22 may be formed as Au layers.

The p-type contact layer 16C may be formed as a GaP layer, the p-type clad layer 16CL may be formed as an AlInP layer, and the MQW layer 14 may be formed as pairs of InGaP/AlGaInP. Furthermore, the n-type clad layer 12CL may be formed as an AlInP layer, the n-type window layer 12W may be formed as an AlInP layer, and the n-type contact layer 12C may be formed as an AlInP layer.

The frost-processed layer 30DF may be formed as an AlInP layer.

In the semiconductor light emitting device according to the third modified example of the first embodiment, the frost process may be performed by a double frost process or a multi-frost process while conditions for the frost process may be similar to those for the first embodiment.

In the third modified example of the first embodiment, by performing the frost process a plurality of times on the LED device surface in the same manner as the first embodiment, it becomes possible to provide a semiconductor light emitting device having improved brightness.

Second Embodiment

Figure 30:
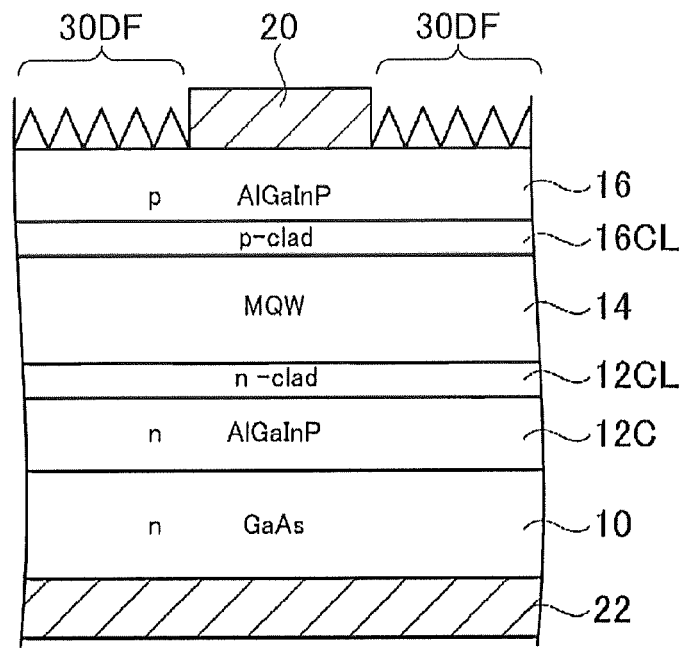
FIG. 30 schematically illustrates a structure of a semiconductor light emitting device according to a second embodiment, in a cross-sectional view.

As illustrated in FIG. 30, a schematic cross-sectional structure of a semiconductor light emitting device according to the second embodiment includes the substrate 10, the n-type contact layer 12C disposed on the substrate 10, the n-type clad layer 12CL disposed on the n-type contact layer 12C, the MQW layer 14 disposed on the n-type clad layer 12CL, the p-type clad layer 16CL disposed on the MQW layer 14, and the p-type window/contact layer 16 disposed on the p-type clad layer 6CL.

The double frost-processed layer 30DF having an uneven shape is formed through a double frost process on the surface of the p-type window/contact layer 16. In this case, the multiple frost process techniques according to the same wet etching technique as in the first embodiment may be applied to the double frost process.

The substrate 10 may be formed of GaAs, the n-type contact layer 12C and the n-type clad layer 12CL may be formed as AlInGaP layers, and the MQW layer 14 may be formed of pairs of InGaP/AlInGaP. The p-type clad layer 16CL and the p-type window/contact layer 16 may be formed as an AlInGaP layer.

The back electrode layer 22 is disposed on the back side of the substrate 10 and the surface electrode layer 20 is disposed on the surface of the p-type window/contact layer 16. For example, both the surface electrode layer 20 and the back electrode layer 22 may be formed as Au layers.

According to the second embodiment, by forming the uneven shape on the surface of the p-type window/contact layer 16 through the double frost process technique according to the wet etching, it becomes possible to provide a semiconductor light emitting device having improved efficiency of light extraction.

In addition, the configuration of the p-type window/contact layer 16 may adopt the same structure as the p-type AlGaInP layer (i.e., the second clad layer) 16CL. The p-type window/contact layer 16 may be a laminated structure of a contact layer and a window layer. For example, in order for the MQW layer 14 to emit red light, the clad layer may be $(Al_{0.5}Ga_{0.5})_{0.5}In_{0.5}P$, and the window layer may be $(Al_xGa_{1-x})_{0.5}In_{0.5}P$ (x>0.5).

First Modified Example of Second Embodiment

Figure 31:
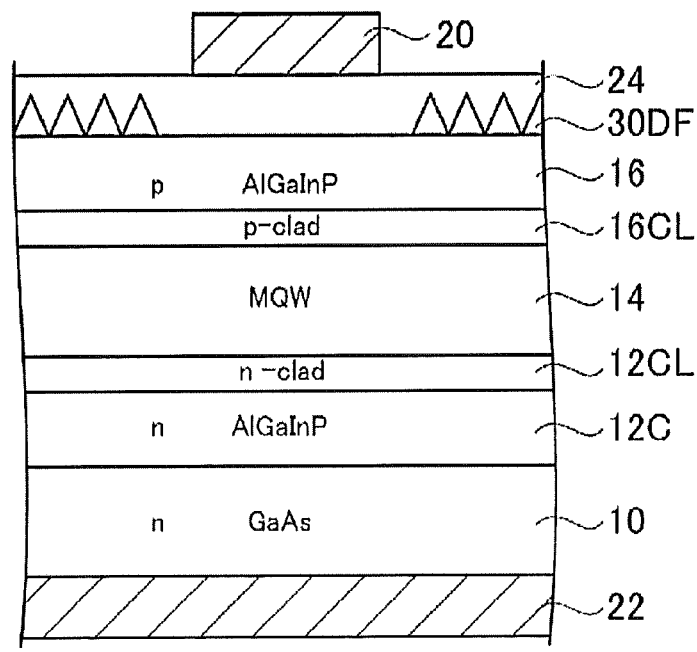
FIG. 31 schematically illustrates is a structure of a semiconductor light emitting device according to a first modified example of the second embodiment, in a cross-sectional view.

FIG. 31 schematically illustrates a structure of a semiconductor light emitting device according to a first modified example of the second embodiment that further includes a transparent electrode layer 24 on the double frost-processed layer 30DF, in a cross-sectional view. The transparent electrode layer 24 may be formed of ITO (indium tin oxide) or the like. Further, the surface electrode layer 20 is disposed on the transparent electrode layer 24. In addition, the double frost-processed layer 30DF is formed to overlap with the surface electrode layer 20 in a plane view.

Second Modified Example of Second Embodiment

Figure 32:
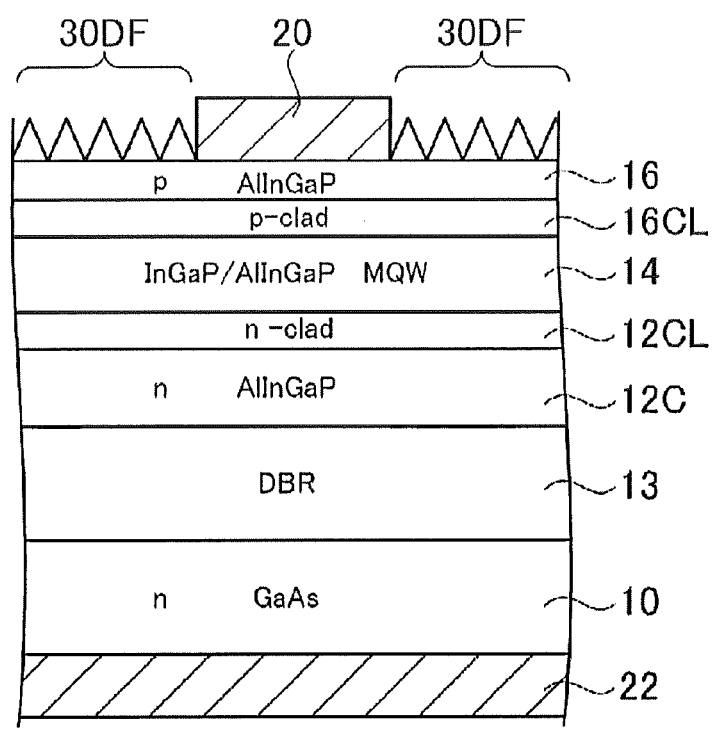
FIG. 32 schematically illustrates a structure of a semiconductor light emitting device according to a second modified example of the second embodiment, in a cross-sectional view.

FIG. 32 schematically illustrates a structure of a semiconductor light emitting device according to a second modified example of the second embodiment that includes the DBR layer 13 between the substrate structure (i.e., the substrate 10) and the n-type clad layer 12CL, in a cross-sectional view. Since other configurations are similar to those of the second embodiment, repeated descriptions are omitted.

For example, the DBR layer 13 may be formed as one of AlInGaP/AlInP, GaAs/AlGaAs, and GaAs/AlInP pairs.

Third Modified Example of Second Embodiment

Figure 33:
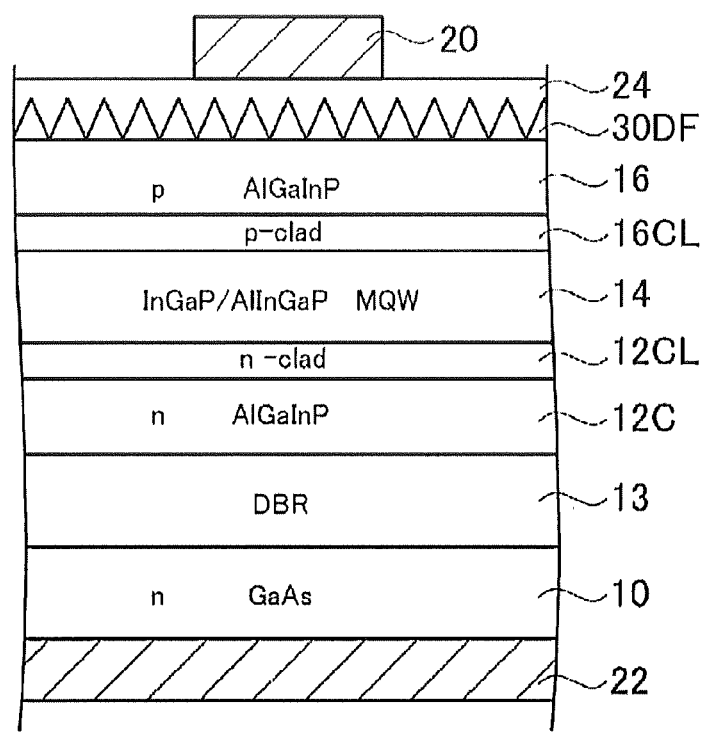
FIG. 33 schematically illustrates a structure of a semiconductor light emitting device according to a third modified example of the second embodiment, in a cross-sectional view.

FIG. 33 schematically illustrates a structure of a semiconductor light emitting device according to a third modified example of the second embodiment in which a double frost process is performed on the entire surface of the p-type window/contact layer 16, the double frost-processed layer 30DF having an uneven shape is formed, and the transparent electrode layer 24 is installed on the double frost-processed layer 30DF, in a cross-sectional view. The transparent electrode layer 24 may be formed of ITO or the like. Further, the surface electrode layer 20 is disposed on the transparent electrode layer 24.

The multiple frost process technique according to the same wet etching technique as in the first embodiment may be applied to the double frost process on the surface of the p-type window/contact layer 16.

According to the second embodiment, a structure is configured such that an uneven shape is formed through the double frost process on the surface of the p-type window/contact layer 16, which is formed of a AlInGaP layer, and the DBR layer 13 is inserted between the substrate 10 and the n-type clad layer 12CL. Thus, it provides a semiconductor light emitting device having improved efficiency of light extraction.

Fourth Modified Example of Second Embodiment

Figure 34:
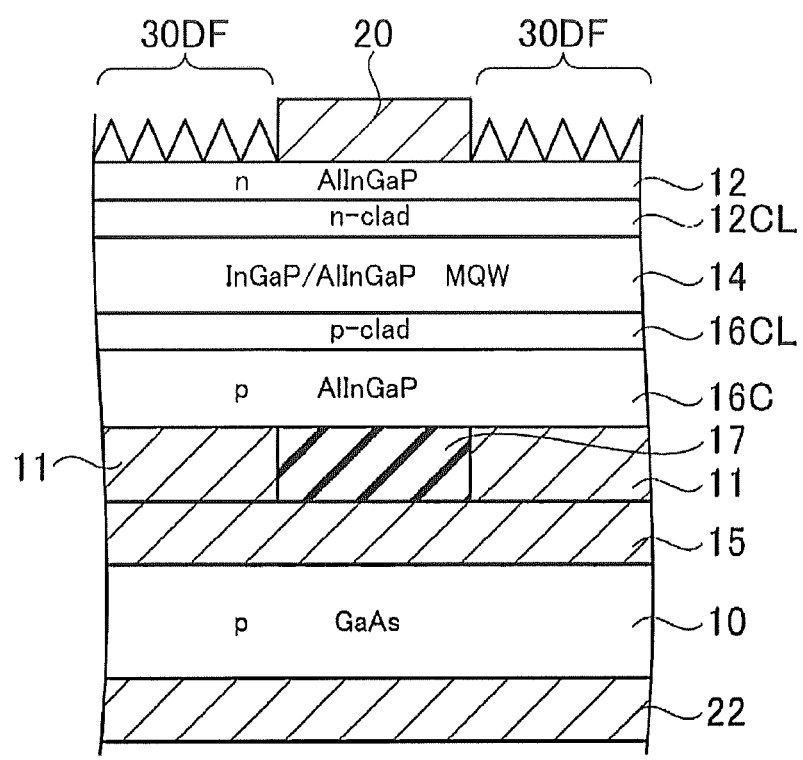
FIG. 34 schematically illustrates a structure of a semiconductor light emitting device according to a fourth modified example of the second embodiment, in a cross-sectional view.

FIG. 34 schematically illustrates a structure of a semiconductor light emitting device according to a fourth modified example of the second embodiment, in a cross-sectional view. The structure includes the substrate 10, the metal layer 15 disposed on the substrate 10, the metallic contact layer 11 and the insulating layer 17 which are disposed and patterned on the metal layer 15, the p-type contact layer 16C disposed on the metallic contact layer 11 and the insulating layer 17, the p-type clad layer 16CL disposed on the p-type contact layer 16C, the MQW layer 14 disposed on the p-type clad layer 16CL, the n-type clad layer 12CL disposed on the MQW layer 14, and the n-type window/contact layer 12 disposed on the n-type clad layer 12CL.

The double frost-processed layer 30DF having an uneven shape is formed through the double frost process on the surface of the n-type window/contact layer 12. In this case, the multiple frost process techniques according to the same wet etching technique as in the first embodiment may be applied to the double frost process.

The substrate 10 may be formed of GaAs, the n-type window/contact layer 12 and the p-type AlGaInP layer 16 may be formed as AlInGaP layers, and the multi-quantum well layer 14 may be formed of pairs of InGaP/AlInGaP.

The p-type contact layer 16C and the p-type clad layer 16CL may be formed as AlInGaP layers. The n-type clad layer 12CL may be formed as an AlInGaP layer.

The back electrode layer 22 is disposed on the back side of the substrate 10 and the surface electrode layer 20 is disposed on the surface of the n-type window/contact layer 12. For example, both the surface electrode layer 20 and the back electrode layer 22 may be formed as Au layers.

Fifth Modified Example of Second Embodiment

Figure 35:
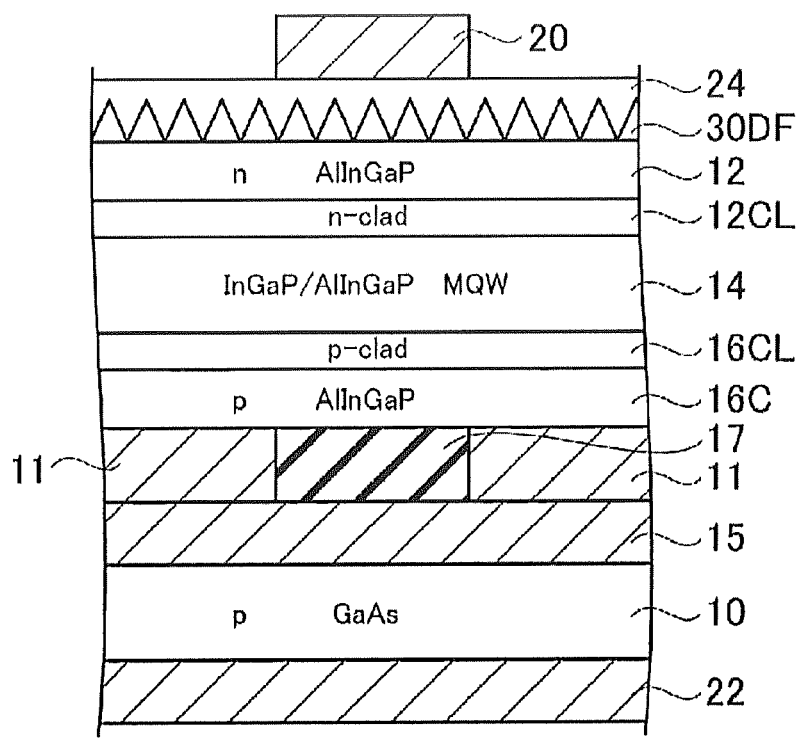
FIG. 35 schematically illustrates a structure of a semiconductor light emitting device according to a fifth modified example of the second embodiment, in a cross-sectional view.

FIG. 35 schematically illustrates a structure of a semiconductor light emitting device according to a fifth modified example of the second embodiment, in a cross-sectional view. In the structure, the double frost process is performed on the entire surface of the n-type window/contact layer 12, the double frost-processed layer 30DF having an uneven shape is formed, and the transparent electrode layer 24 is installed on the double frost-processed layer 30DF. The transparent electrode layer 24 may be formed of ITO or the like. Further, the surface electrode layer 20 is disposed on the transparent electrode layer 24.

The double frost process technique according to the wet etching technique may be applied to the frost process on the surface of the n-type window/contact layer 12.

In the structures of FIGS. 34 and 35, the metal layer 15 may be formed as, for example, a Au layer with a thickness ranging, for example, from approximately 2.5 to 5 μm. Further, the metallic contact layer 11 may be formed as, for example, a AuBe layer, an alloy layer of AuBe and Ni, or the like with a thickness of, for example, the same level as that of the insulating layer 17, which is approximately 450 nm. For example, the insulating layer 17 may be formed as a silicon oxide film, a silicon nitride film, a SiON film, a $SiO_xN_y$ film, a multilayer film thereof, or the like.

Since the metal layer 15 formed as the Au layer absorbs blue light and ultraviolet light, a metal buffer layer formed as, for example, Ag, Al, Ni, Cr, W layer or the like may be installed between the metal layer 15, and the metallic contact layer 11 and the insulating layer 17, in order to reflect light of a short wavelength.

The semiconductor light emitting devices according to the fourth modified example and the fifth modified example of the second embodiment may be formed using a bonding technique.

Using the metal layer 15 to adhere to the GaAs substrate 10 and the LED structure made of the epitaxial growth layers, it becomes possible to form a metallic reflective layer having great reflectivity. The metallic reflective layer is formed with the metal layer 15. Since a mirror surface is formed with the interface between the insulating layer 17 and the metal layer 15, light emitted from the LED is reflected on the mirror surface. The metallic contact layer 11, which is a layer for making ohmic contact between the metal layer 15 and the p-type contact layer 16C, is inserted in the interface between the metal layer 15 and the p-type contact layer 16C and has a thickness of the same level as that of the insulating layer 17.

If a pattern width of the metallic contact layer 11 is wide, a substantial light emitting region is limited and thus, area efficiency and luminous efficiency decrease. On the other hand, if the pattern width of the metallic contact layer 11 is narrow, area resistance of the metallic contact layer 11 increases and thus, a forward voltage Vf of the LED increases. In light of the above, the pattern width and the pattern structure can be optimized. Some pattern examples include a honeycomb pattern structure based on a hexagon and a circular dot pattern structure based on a circular dot shape. These pattern shapes will be described with reference to FIGS. 41 and 42 in association with the sixth modified example.

In the semiconductor light emitting device according to the fifth modified example of the second embodiment, by forming a metal layer (not illustrated) disposed on the GaAs substrate 10 and the metal layer 15 disposed on the LED side as Au layers, it becomes possible to adhere the metal layer (not illustrated) at the side of the GaAs substrate 10 and the metal layer 15 at the side of the LED structure made of the epitaxial growth layers by thermo-compression bonding.

For example, a condition for adhering may be a temperature ranging from approximately 250 degrees C. to approximately 700 degrees C., specifically, from approximately 300 degrees C. to approximately 400 degrees C. and a pressure for the thermo-compression bonding may range from approximately 10 MPa to approximately 20 MPa.

According to the semiconductor light emitting device according to the fifth modified example of the second embodiment, by forming the transparent insulating layer 17 between the metal layer 15 serving as the metallic reflective layer and the p-type contact layer 16C, the contact between the p-type contact layer 16C and the metal layer 15 is configured to prevent absorption of light, which makes it possible to form the metallic reflective layer having great reflectivity.

According to the fifth modified example of the second embodiment, by forming the uneven shape on the surface of the n-type window/contact layer 12 using the double frost process and forming the metallic reflective layer having great reflectivity using the metal layer 15, it becomes possible to provide a semiconductor light emitting device having improved efficiency of light extraction.

In addition, the same configuration as the n-type clad layer 12CL may be applied to the configuration of the n-type window/contact layer 12. The n-type window/contact layer 12 may be a laminated structure of a contact layer and a window layer. For example, in order for the MQW layer 14 to emit red light, the clad layer may be $(Al_{0.5}Ga_{0.5})_{0.5}In_{0.5}P$ and the window layer may be $(Al_xGa_{1-x})_{0.5}In_{0.5}P$ (x>0.5).

Sixth and Seventh Modified Examples of Second Embodiment

Figure 36:
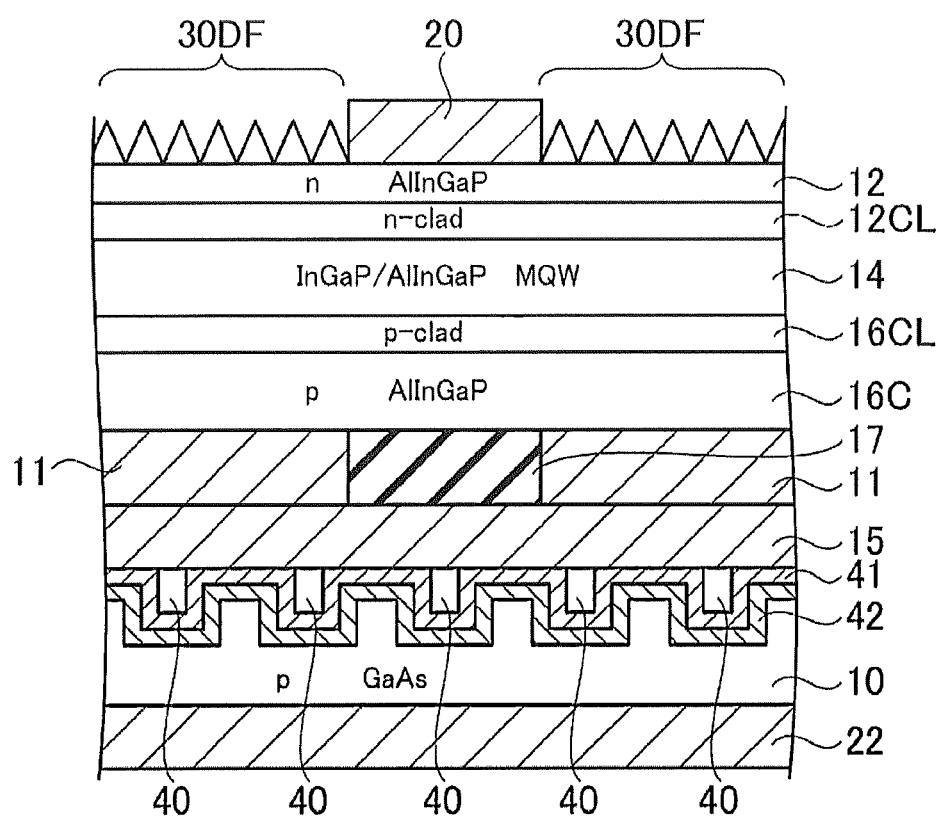
FIG. 36 schematically illustrates a structure of a semiconductor light emitting device according to a sixth modified example of the second embodiment, in a cross-sectional view.

FIG. 36 schematically illustrates a structure of a semiconductor light emitting device according to a sixth modified example of the second embodiment, in a cross-sectional view.

In the semiconductor light emitting device according to the sixth modified example of the second embodiment, the substrate structure may include the substrate 10 having grooves on its surface, a metal buffer layer 42 that is disposed on the surface of the substrate 10, side walls of the grooves, and bottom surfaces of the grooves, a metal layer 41 disposed on the metal buffer layer 42, and the metallic contact layer 11 and the insulating layer 17 that are disposed and patterned on the metal layer 41.

As illustrated in FIG. 36, the schematic cross-sectional structure of the semiconductor light emitting device according to the sixth modified example of the second embodiment includes the substrate 10 having the plurality of grooves 40 on its surface, the metal buffer layer 42 that is disposed on the surface of the substrate 10, and the side walls, and the bottom surfaces of the grooves 40, the metal layer 41 disposed on the metal buffer layer 42, the metal layer 15 disposed on the metal layer 41, the metallic contact layer 11 and an insulating layer 17 that are disposed and patterned on the metal layer 15, the p-type contact layer 16C disposed on the metallic contact layer 11 and the insulating layer 17, the p-type clad layer 16CL disposed on the p-type contact layer 16C, the MQW layer 14 disposed on the p-type clad layer 16CL, the n-type clad layer 12CL disposed on the MQW layer 14, and the n-type window/contact layer 12 disposed on the n-type clad layer 12CL.

The double frost-processed layer 30DF having an uneven shape is formed through the double frost process on the surface of the n-type window/contact layer 12. In this case, the multiple frost process techniques according to the same wet etching technique as in the first embodiment may be applied to the double frost process.

The substrate may be formed of GaAs, the p-type contact layer 16C and the p-type clad layer 16CL may be formed as AlInGaP layers, the multi-quantum well layer may be formed of pairs of InGaP/AlInGaP, and the n-type clad layer 12CL layer and the n-type window/contact layer 12 may be formed as AlInGaP layers.

Figure 37:
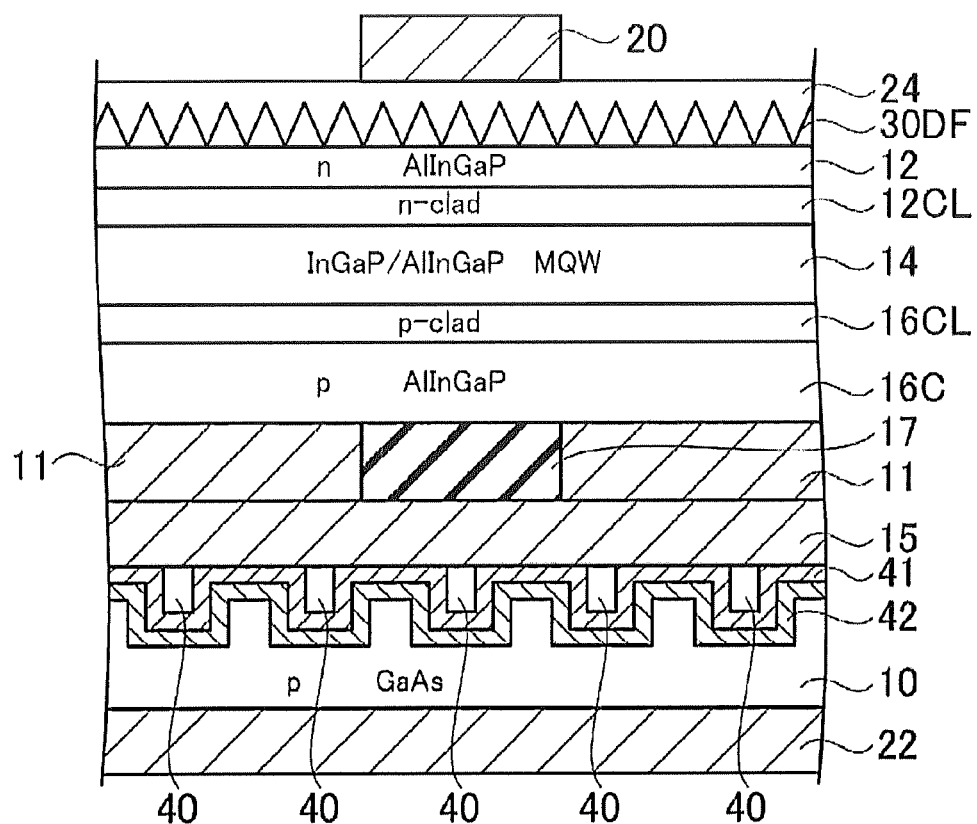
FIG. 37 schematically illustrates a structure of a semiconductor light emitting device according to a seventh modified example of the second embodiment, in a cross-sectional view.

FIG. 37 schematically illustrates a structure of a semiconductor light emitting device according to a seventh modified example of the second embodiment, in a cross-sectional view. In this structure, a double frost process is performed on the entire surface of the n-type window/contact layer 12, the double frost-processed layer 30DF of the uneven shape is formed, and the transparent electrode layer 24 is formed on the double frost-processed layer 30DF.

The double frost-processed layer 30DF having an uneven shape may be formed on the frost process of the surface of the n-type window/contact layer 12 using the double frost process technique according to the wet etching technique.

In the structure of the semiconductor light emitting devices according to the sixth modified example and the seventh modified examples of the second embodiment, the metal layer 15 may be formed as, for example, a Au layer with a thickness ranging, for example, from approximately 2.5 to approximately 5 μm. Further, the metallic contact layer 11 may be formed as, for example, a AuBe layer, an alloy layer of AuBe and Ni, or the like with a thickness of, for example, approximately the same level as that of the insulating layer 17, which is approximately 450 nm. The insulating layer 17 may be formed as, for example, a silicon oxide film, a silicon nitride film, a SiON film, a $SiO_xN_y$ film, a multilayer film thereof, or the like.

Since the metal layer 15 formed as the Au layer absorbs blue light and ultraviolet light, a metal buffer layer formed as, for example, Ag, Al, Ni, Gr, W layer, or the like may be installed between the metal layer 15, and the metallic contact layer 11 and the insulating layer 17 in order to reflect light of a short wavelength.

As illustrated in FIG. 36, the GaAs substrate 10 employed in the semiconductor light emitting device according to the sixth modified example of the second embodiment is formed to have the plurality of grooves 40 on its surface, and the metal buffer layer 42 formed as a titanium (Ti) layer is installed to be disposed on the surface of the GaAs substrate 10, the side walls, and the bottom surfaces of the grooves 40. In addition, the metal layer 41 formed as the Au layer is disposed on the surface of the metal buffer layer 42.

The semiconductor light emitting device according to the sixth modified example of the second embodiment can be formed by adhering the GaAs substrate 10 and the LED by a bonding technique.

The metallic reflective layer is formed with the metal layer 15 disposed on the LED structure side. Since a mirror surface is formed with the interface between the p-type contact layer 16C and the metal layer 15, light emitted from the LED is reflected on the mirror surface.

As illustrated in FIG. 36, in the semiconductor light emitting device according to the sixth modified example of the second embodiment, by forming the metal layer 41 and the metal layer 15 as the Au layers, the metal layer 41 at the side of the GaAs substrate 10 and the metal layer 15 at the side of the LED structure made of the epitaxial growth layers are adhered by thermo-compression bonding, and air gaps exist between the metal layer 41 having a groove shape and the metal layer 15.

For example, conditions for adhering may be a temperature ranging from approximately 250 degrees C. to approximately 700 degrees C., specifically, approximately 300 degrees C. to approximately 400 degrees C. and a pressure for the thermo-compression bonding may range from approximately 10 MPa to approximately 20 MPa. By providing the air gaps, the contact area between the metal layer 41 and the metal layer 15 decreases as compared to a structure in which the entire surfaces are brought into close-contact with each other. As a result, by providing the air gaps, the pressure of the thermo-compression bonding presses the contact area between the metal layer 41 and the metal layer 15 in which the contact area relatively decreases, and the sticking strength increases at the time of thermo-compression bonding of the metal layer 41 and the metal layer 15. Thus, when adhering the GaAs substrate 10 and the LED structure, since the air gaps exist, it is possible to maintain great adhesion between the metal layer 41 disposed on the surface of the GaAs substrate 10 and the metal layer 15.

According to the semiconductor light emitting device according to the sixth modified example of the second embodiment, light is totally reflected by a metal in the reflective layer in order to prevent the absorption of light into the GaAs substrate 10 and maintain great adhesion between the metal layer 41 and the metal layer 15. As the materials of the semiconductor substrate, it is possible to use opaque semiconductor substrate materials such as Si in addition to GaAs.

(Manufacturing Method)

A method of manufacturing the semiconductor light emitting device according to the sixth modified example of the second embodiment will be described below.

(a) First, the GaAs substrate structure to be adhered and the LED structure to be adhered are prepared.

First, stripe-shaped grooves having a predetermined pitch width are formed on the surface of the GaAs substrate 10 by reactive ion etching (RIE) or wet etching technique. A width of the stripe-shaped grooves is, for example, approximately 10 μM, approximately 30 μm, or approximately 60 μm, and the pitch thereof is, for example, approximately 100 μm, approximately 200 μm, approximately 410 μm, approximately 1,000 μm, or approximately 2,000 μm. Moreover, the grooves 40 are not limited to the stripe shape and may be of a lattice shape, a dot shape, a spiral shape, a hexagonal pattern shape, or the like. In addition, a depth of the grooves 40 may be the same level as that of the width of the stripe or may be shallower. The grooves 40 may be provided at a predetermined depth, by employing a cutting technique of a dicer, a cutting technique using a laser beam, or the like, which uses a YAG laser, instead of the etching technique.

(b) The metal buffer layer 42 made of a titanium alloy and the metal layer 41 made of Au or the like are sequentially formed on the GaAs substrate 10 having the plurality of grooves 40 on its surface, using a sputtering method, a vacuum deposition method, or the like.

(c) In the LED structure, the p-type contact layer 16C, the p-type clad layer 16CL, the MQW layer 14, the n-type clad layer 12CL, and the n-type window/contact layer 12 are sequentially formed on a GaAs substrate (not illustrated), using a molecular beam epitaxy (MBE) method, a MOCVD (Metal Organic Chemical Vapor Deposition) method, or the like. Next, on the p-type contact layer 16C, the metallic contact layer 11 and the metal layer 15 are formed with respect to the patterned insulating layer 17, using a lift-off method.

(d) Next, the GaAs substrate and the LED structure are adhered to each other. In the adhering process, adhering is performed in conditions of approximately 340 degrees C. as a thermo-compression bonding temperature, approximately 18 MPa as a thermo-compression bonding pressure, and approximately 10 minutes as a thermo-compression bonding time, for example, using a presser. As a result, as illustrated in FIG. 36, air gaps are formed between the metal layer 41 at the grooves 40 and the metal layer 15.

(e) Next, as illustrated in FIG. 36, the titanium layer and the back electrode layer 22 made of Au or the like are formed on the back of the GaAs substrate 10 using a sputtering method, a vacuum deposition method, or the like.

(f) Next, after the back electrode layer 22 is protected by resist or the like, the GaAs substrate (not illustrated) is removed by etching. For example, an etchant including ammonia/hydrogen peroxide is used during the etching time of approximately 65 to 85 minutes.

(g) Next, as illustrated in FIG. 36, after the surface electrode layer 20 is formed on the n-type window/contact layer 12 using a sputtering method, a vacuum deposition method, or the like, the surface electrode layer 20 is patterned. The pattern of the surface electrode layer 20 substantially matches the pattern of the insulating layer 17, but may match the pattern of the metallic contact layer 11. For example, a laminated structure made of Au/AuGe—Ni alloy/Au can be used as the surface electrode layer 20.

(h) Next, by performing the double frost process according to the wet etching process, a surface process is performed on the n-type window/contact layer 12 excluding a portion of the n-type window/contact layer 12 directly below the surface electrode layer 20. The conditions for the double frost process according to the wet etching may be the same as in the first embodiment.

As the material of the metal buffer layer 42, for example, it is possible to use a tungsten (W) barrier metal, a platinum (Pt) barrier metal, or the like, as alternatives of the titanium alloy.

As illustrated in FIG. 36, by the above-mentioned description, the semiconductor light emitting device according to the sixth modified example of the second embodiment using the GaAs substrate 10 formed with the plurality of the grooves 40 on the surface is completed.

Furthermore, in the method of manufacturing the semiconductor light emitting device according to the seventh modified example of the second embodiment, as illustrated in FIG. 37, after the double frost process is performed on the entire surface of the n-type window/contact layer 12 using the double frost process technique according to the wet etching, the transparent electrode layer 24 made of ITO is formed. Furthermore, by forming the surface electrode layer 20 on the transparent electrode layer 24, it is possible to form the structure of FIG. 37.

(Plane Pattern Configuration)

Figure 38:
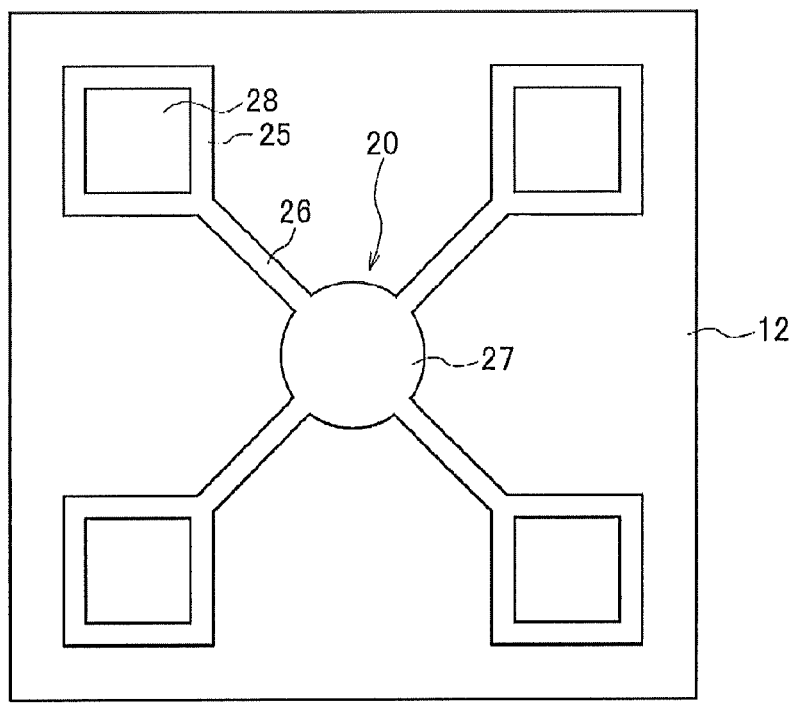
FIG. 38 schematically illustrates a plane pattern configuration (first configuration example) of the semiconductor light emitting device according to the sixth modified example of the second embodiment.
Figure 39:
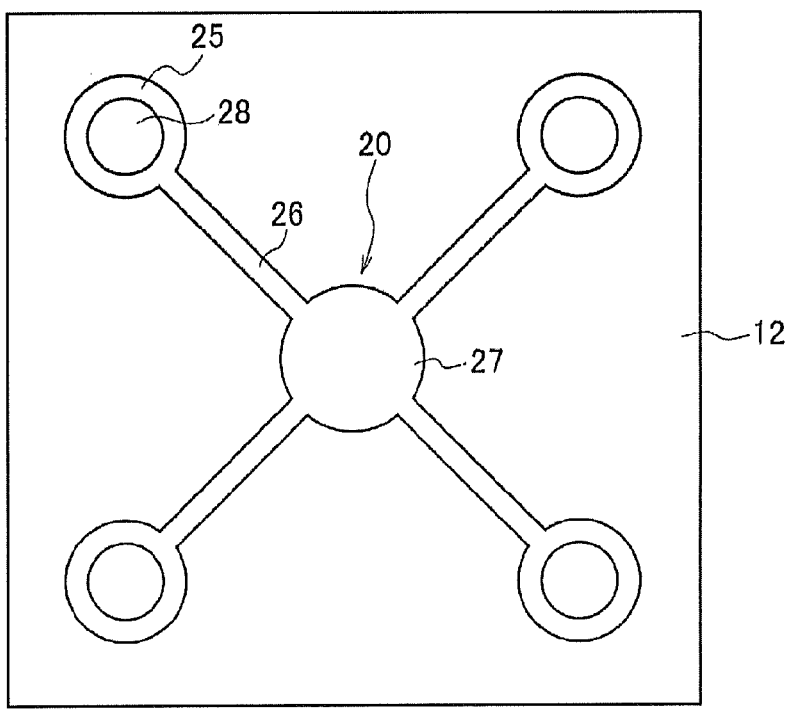
FIG. 39 schematically illustrates another plane pattern configuration (second configuration example) of the semiconductor light emitting device according to the sixth modified example of the second embodiment.
Figure 40:
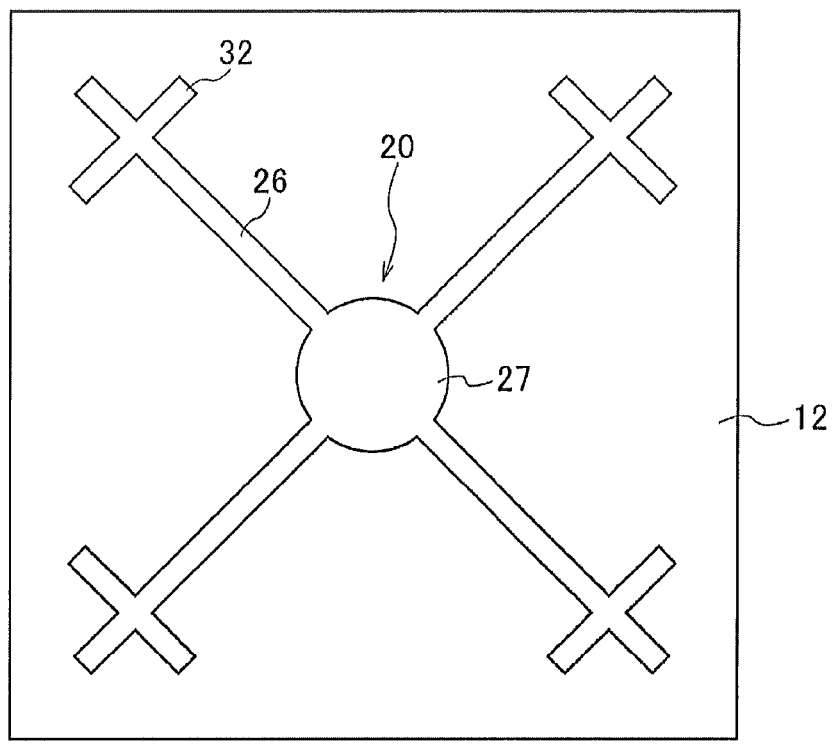
FIG. 40 schematically illustrates still another plane pattern configuration (third configuration example) of the semiconductor light emitting device according to the sixth modified example of the second embodiment.

FIGS. 38 to 40 schematically illustrate plane pattern configuration examples of the semiconductor light emitting device according to the sixth modified example of the second embodiment.

As illustrated in FIG. 38, the n-type window/contact layer 12 has, for example, a rectangular plane pattern, the surface electrode layer 20 includes a center electrode 27 disposed in the central portion on the rectangular plane pattern, coupling electrodes 26 are connected to the center electrode 27 and extend from the center electrode 27 in diagonal directions of the rectangle, and peripheral electrodes 25 are connected to the coupling electrodes 26 and disposed at four corners of the rectangle.

The peripheral electrodes 25 have openings 28. In the example of FIG. 38, the openings 28 are rectangular.

FIG. 39 illustrates another plane pattern configuration of the surface electrode layer in the semiconductor light emitting device according to the sixth modified example of the second embodiment. Furthermore, FIG. 40 illustrates still another plane pattern configuration of the surface electrode layer in the semiconductor light emitting device according to the sixth modified example of the second embodiment.

As illustrated in FIG. 39, the openings 28 may be of a perfect circle shape, a substantial circle shape, an elliptical shape, an oval shape, or the like.

Furthermore, as illustrated in FIG. 40, the peripheral electrode 32 may include a portion perpendicular to the coupling electrode 26. Moreover, a plurality of peripheral electrodes 32 may be used. Further, when the plurality of peripheral electrodes 32 is used, the lengths of the peripheral electrodes 32 may be different from one another.

Furthermore, although it is not illustrated here, the peripheral electrodes 32 may be disposed in a structure of a fractal diagram.

(Plane Pattern Structure of Metallic Contact Layer 11)

Figure 41:
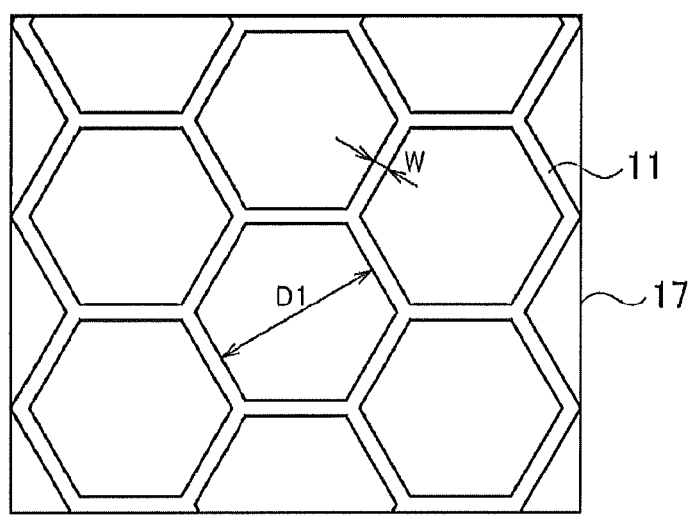
FIG. 41 schematically illustrates a plane pattern configuration (first configuration example) of a metallic contact layer and an insulating layer in the semiconductor light emitting device according to the sixth modified example of the second embodiment.
Figure 42:
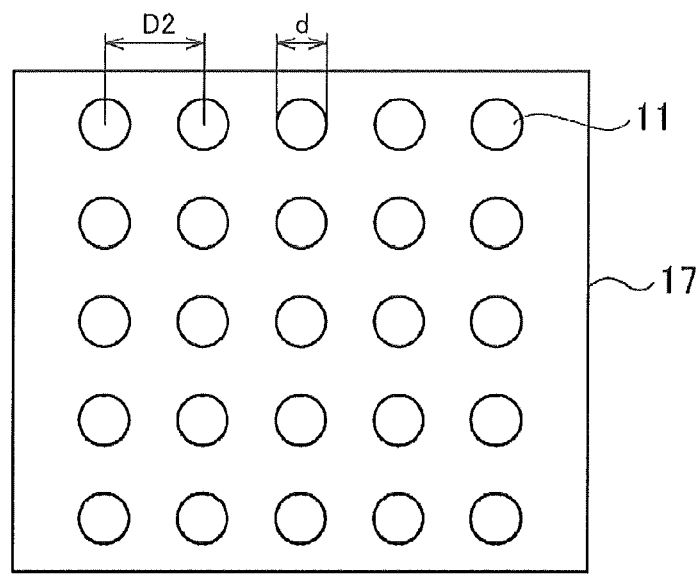
FIG. 42 schematically illustrates another plane pattern configuration (second configuration example) of the metallic contact layer and the insulating layer in the semiconductor light emitting device according to the sixth modified example of the second embodiment.

FIGS. 41 and 42 schematically illustrate plane pattern configurations of the metallic contact layer 11 and the insulating layer 17 in the semiconductor light emitting device according to the sixth modified example of the second embodiment.

If a pattern width of the metallic contact layer 11 is wide, a substantial light emitting region is limited and thus, area efficiency and luminous efficiency decrease. On the other hand, if the pattern width of the metallic contact layer 11 is narrow, area resistance of the metallic contact layer 11 increases and a forward voltage Vf of the LED increases. In light of the above, the pattern width W and the pattern pitch D1 can be optimized. Some pattern examples include a honeycomb pattern structure based on a hexagon and a circular dot pattern structure based on a circular dot shape as basic structures.

For example, as illustrated in FIG. 41, the schematic plane pattern structure of the metallic contact layer 11 employed in the semiconductor light emitting device according to the sixth modified example of the second embodiment has a honeycomb pattern structure having a hexagon as a basic structure. In FIG. 41, for example, a shape portion indicated by a pattern width W corresponds to a pattern of the metallic contact layer 11 formed as a AuBe layer, an alloy layer of AuBe and Ni, or the like in FIG. 36, while a hexagonal pattern having a width D1 corresponds to a portion of the insulating layer 17 in FIG. 36 and illustrates a region to which the light emitted from the LED is optically guided. For example, the width D1 is approximately 100 μm and the pattern width W ranges from approximately 11 μm to approximately 5 μm.

For example, as illustrated in FIG. 42, another schematic plane pattern structure of the metallic contact layer 11 employed in the semiconductor light emitting device according to the sixth modified example of the second embodiment has a dot pattern structure based on a circular dot shape. In FIG. 42, for example, a shape portion illustrated by a width d and disposed at a pattern pitch having a width D2 corresponds to a pattern of the metallic contact layer 11 formed as a AuBe layer, an alloy layer of AuBe and Ni, or the like in FIG. 36. In FIG. 42, a region other than the circular pattern portions having the width d and the pattern pitch D2 corresponds to a portion of the insulating layer 17 and illustrates a region to which the light emitted from the LED is optically guided. For example, the pattern pitch D2 is approximately 100 μm and the width d ranges from approximately 5 μm to approximately 11 μm.

Furthermore, as the schematic plane pattern structure of the metallic contact layer 11 employed in the semiconductor light emitting device according to the sixth modified example of the second embodiment, it is also possible to employ a random pattern in which a triangular pattern, a rectangular pattern, a hexagonal pattern, an octagonal pattern, a circular dot pattern, or the like is disposed randomly, without being limited to a hexagonal honeycomb pattern and a circular dot pattern.

The schematic plane pattern structure of the metallic contact layer 11 employed in the semiconductor light emitting device according to the sixth modified example of the second embodiment may be able to secure the metal wiring pattern width to the extent that the light emission brightness from the LED is not lowered and the forward voltage Vf of the LED does not increase by securing the area of the optical guiding region.

According to the sixth modified example of the second embodiment, the double frost-processed layer 30DF having an uneven shape is formed on the surface of the n-type window/contact layer 12 using the double frost process technique. Thus, it becomes possible to stick the GaAs substrate structure and the LED structure by using the bonding technique while maintaining great adhesion between the two structures. Furthermore, in order to prevent absorption of light into the GaAs substrate, the light may be totally reflected by a metal as the reflective layer for preventing the absorption into the GaAs substrate, which makes it possible to reflect the light of all angles. Accordingly, it is possible to provide a semiconductor light emitting device having improved efficiency of light extraction.

The second embodiment and the first to seventh modified examples may be formed with conductivity types opposite to those described above.

In the second embodiment and the first to seventh modified examples, although the examples have been disclosed in which the GaAs substrate is primarily employed as the substrate 10, it is also possible to employ a silicon substrate, a SiC substrate, a GaP substrate, a sapphire substrate, or the like.

Third Embodiment

Device Structure

Figure 43A:
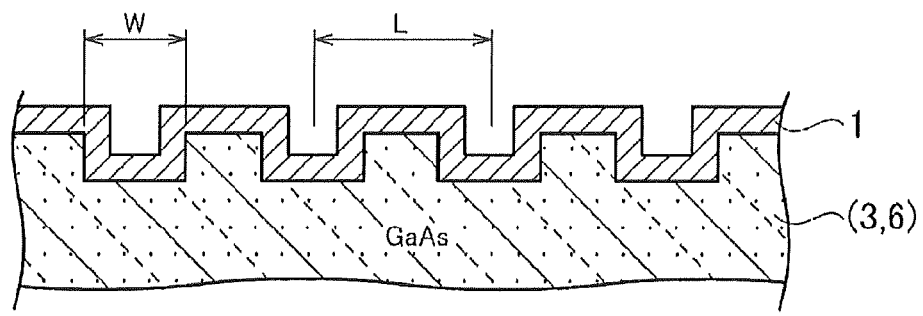
FIG. 43A is a view for explaining a principle of a semiconductor light emitting device according to a third embodiment in which a GaAs substrate structure is schematically illustrated.
Figure 43B:
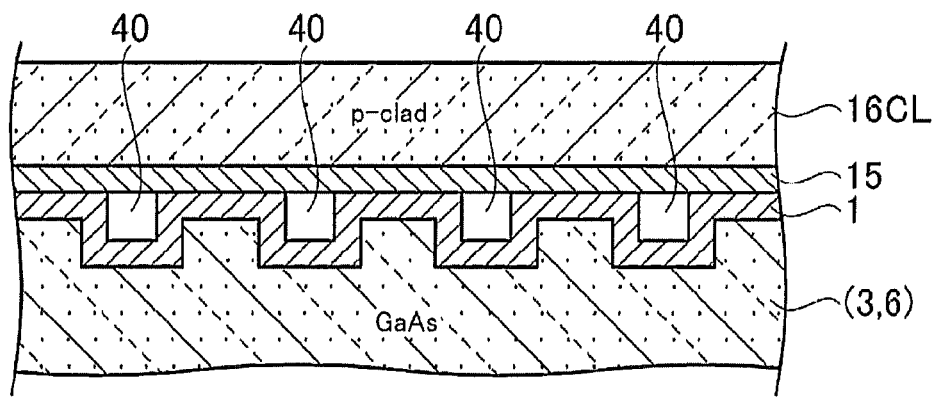
FIG. 43B is a view for explaining a principle of the semiconductor light emitting device according to the third embodiment in which a structure after wafer bonding is schematically illustrated.
Figure 43C:
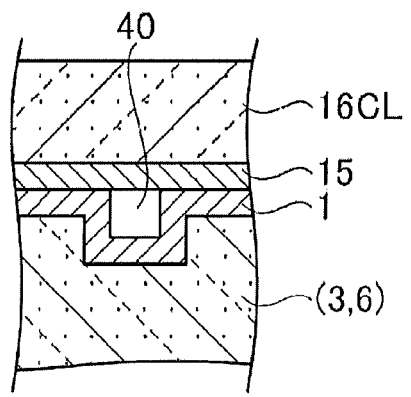
FIG. 43C is a view for explaining a principle of a semiconductor light emitting device according to a third embodiment in which a structure after chipping is schematically illustrated.

FIGS. 43A to 43C are views for explaining a principle of a semiconductor light emitting device according to a third embodiment. FIG. 43A schematically illustrates a structure of the GaAs substrate, in a cross-sectional view.

As illustrated in FIG. 43A, a p-type or n-type GaAs substrate employed in the semiconductor light emitting device according to the third embodiment includes a p-type or n-type GaAs layer 3 or 6 and a metal layer 1 disposed on the surface of the p-type or n-type GaAs layer 3 or 6 having stripe-shaped grooves with a pitch L and a width W. The width W of the stripe grooves is, for example, approximately 10 μm, approximately 30 μm, or approximately 60 μm, and the pitch L is, for example, approximately 100 μm, approximately 200 μm, approximately 410 μm, approximately 1,000 μm, or approximately 2,000 μm. The grooves are not limited to a stripe shape, and may be a lattice shape, a dot shape, a spiral shape, a hexagonal pattern shape, or the like. In addition, a depth of the grooves may be the same level as that of the width W of the stripe, or may be shallower.

FIG. 43B schematically illustrates a structure of a semiconductor light emitting device formed by adhering the GaAs substrate illustrated in FIG. 43A and the LED using the wafer bonding technique, in a cross-sectional view. The LED side is illustrated with the p-type clad layer 16CL formed by, for example, epitaxial growth, and the metal layer 15 formed on the p-type clad layer 16CL, while other active layers and the like are not illustrated. The GaAs substrate and the LED are adhered using the metal layer 1 disposed on the surface of the GaAs layer 3 or 6 and thus, air gaps (i.e., an aperture) 40 are formed in the grooves between the metal layer 1 and the metal layer 15.

Thus, by forming the grooves on the GaAs substrate surface, an escape of air is formed when the LED is adhered to the GaAs substrate using the wafer bonding technique, which makes it possible to relive stress caused by thermal expansion during high temperature heating. As a result, it is possible to prevent peeling among the layers due to the difference in thermal expansion coefficients of the semiconductor substrate, the insulating film, and the metal layer.

FIG. 43C schematically illustrates a structure after chipping, in a cross-sectional view. The air gap 40 in the stripe-shaped groove formed on the surface of the p-type or n-type GaAs substrate 3 or 6 is included in the completed chip. If the pitch L is large, in some cases, the air gap 40 may not be included in the completed chip.

Figure 44:
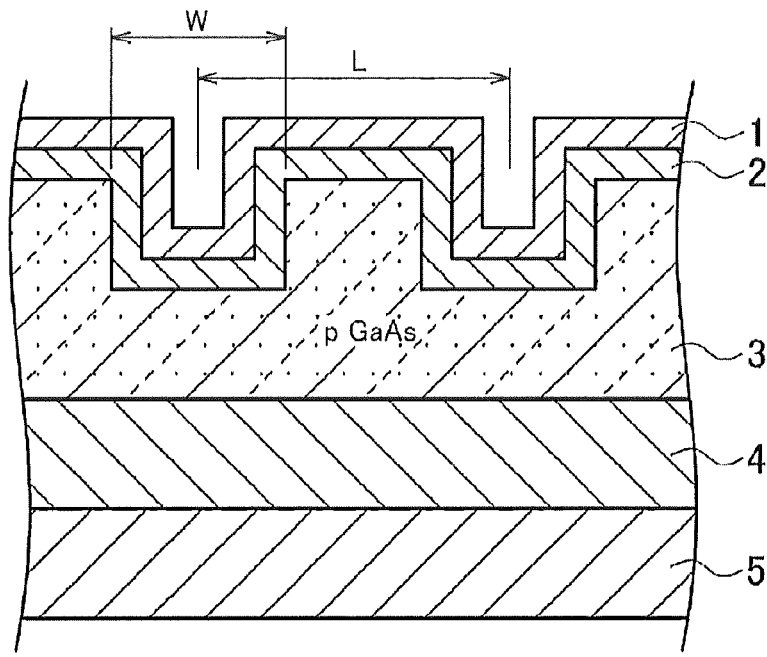
FIG. 44 schematically illustrates a structure of a p-type GaAs substrate employed in the semiconductor light emitting device according to the third embodiment, in a cross-sectional view.
Figure 45:
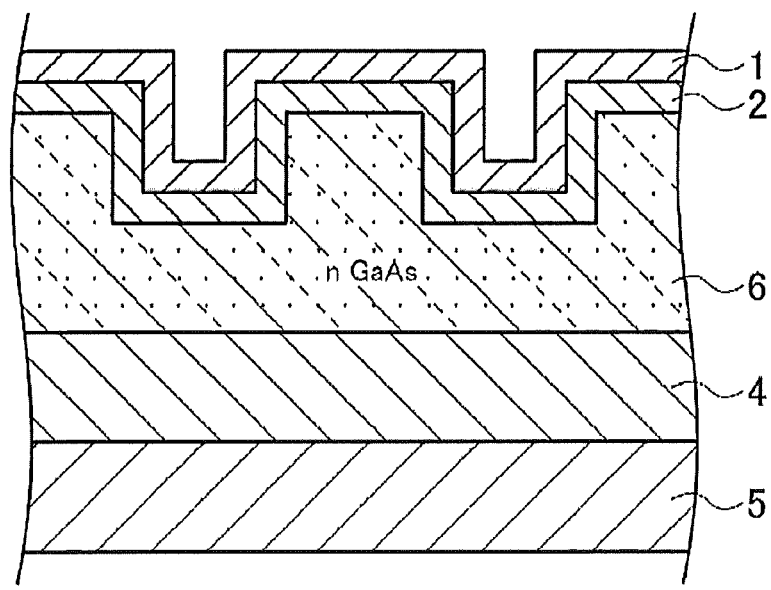
FIG. 45 schematically illustrates a structure of an n-type GaAs substrate employed in the semiconductor light emitting device according to the third embodiment, in a cross-sectional view.

The conductivity type of the GaAs substrate employed in the semiconductor light emitting device according to the third embodiment may be any of the p-type and the n-type. FIG. 44 illustrates a schematic cross-sectional structure of the p-type GaAs substrate structure employed in the semiconductor light emitting device according to the third embodiment, and FIG. 45 illustrates a schematic cross-sectional structure of the n-type GaAs substrate structure. Furthermore, FIG. 46 illustrates a schematic cross-sectional structure of the LED employed in the semiconductor light emitting device according to the third embodiment.

Figure 46:
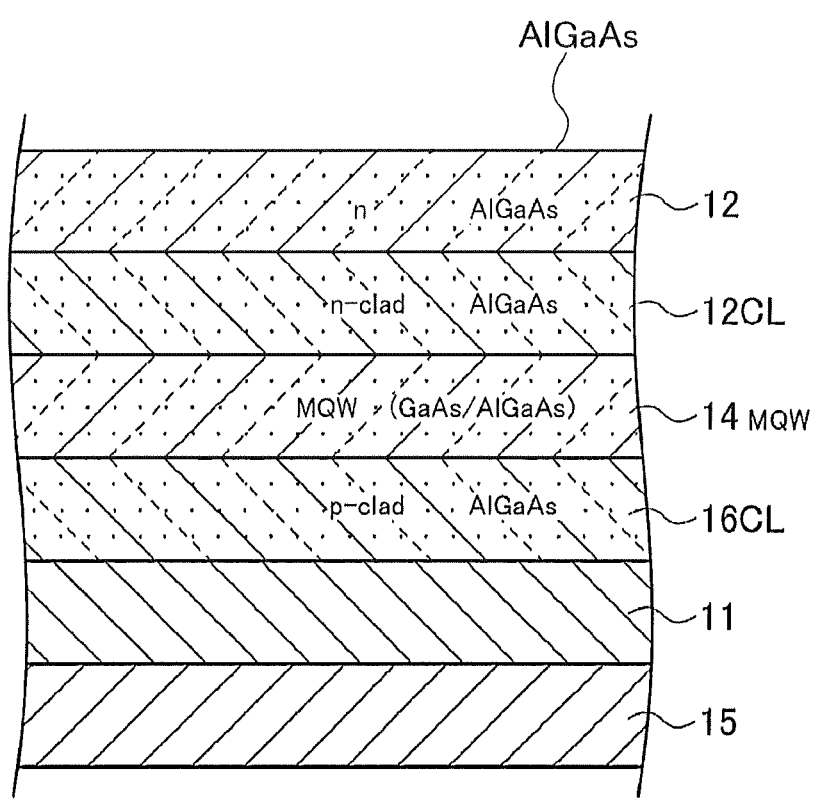
FIG. 46 schematically illustrates a structure of an LED employed in the semiconductor light emitting device according to the third embodiment, in a cross-sectional view.
Figure 47:
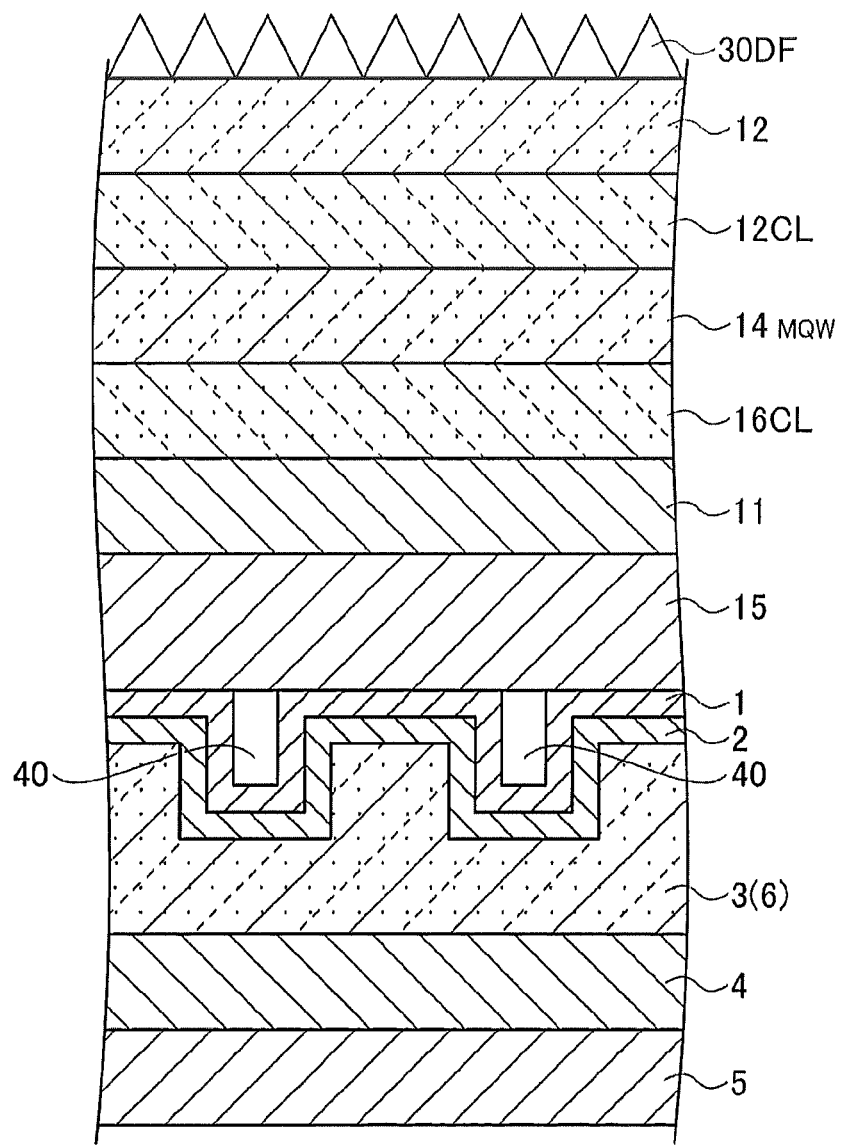
FIG. 47 schematically illustrates a structure of the semiconductor light emitting device according to the third embodiment, in a cross-sectional view.

FIG. 47 schematically illustrates, in a cross-sectional view, a structure of the semiconductor light emitting device according to the third embodiment which is formed by sticking the p-type or n-type GaAs substrate 3 (or 6) illustrated in FIGS. 44 and 45 and the LED illustrated in FIG. 46 using the wafer bonding technique.

As illustrated in FIG. 44, the p-type GaAs substrate structure employed in the semiconductor light emitting device according to the third embodiment includes the p-type GaAs layer 3 having grooves on its surface, the metal buffer layer 2 which is disposed on the surface of the p-type GaAs layer 3, the side walls of the grooves, and the bottom surfaces of the grooves, the metal layer 1 disposed on the metal buffer layer 2, the metal buffer layer 4 disposed on the back side of the p-type GaAs layer 3, and the metal layer 5 disposed on the surface of the metal buffer layer 4 opposite to the p-type GaAs layer 3.

As illustrated in FIG. 45, the n-type GaAs substrate structure employed in the semiconductor light emitting device according to the third embodiment includes the n-type GaAs layer 6 having grooves on its surface, the metal buffer layer 2 which is disposed on the surface of the n-type GaAs layer 6, the side walls of the grooves, and the bottom surfaces of the grooves, the metal layer 1 disposed on the metal buffer layer 2, the metal buffer layer 4 disposed on the back side of the n-type GaAs layer 6, and the metal layer 5 disposed on the surface of the metal buffer layer 4 opposite to the n-type GaAs layer 6.

In the structure of FIG. 44, both the metal layers 1 and 5 may be formed as Au layers and the metal buffer layer 2 and 4 may be formed as, for example, AuBe layers making contact with the p-type GaAs layer 3. In addition, in the structure of FIG. 45, both the metal layers 1 and 5 may be formed as Au layers and the metal buffer layers 2 and 4 may be formed by, for example, AuGe layers making contact with the n-type GaAs layer 6.

As illustrated in FIG. 46, the schematic cross-sectional structure of the LED employed in the semiconductor light emitting device according to the third embodiment includes the metal layer 15, the metallic contact layer 11 disposed on the metal layer 15, the p-type clad layer 16CL disposed on the metallic contact layer 11, the MQW layer 14 disposed on the p-type clad layer 16CL, the n-type clad layer 12CL disposed on the MQW layer 14, and the n-type window/contact layer 12 disposed on the n-type clad layer 12CL.

In the structure of FIG. 46, the metal layer may be is formed as, for example, a Au layer. Further, the metallic contact layer 11 may be formed as, for example, a AuBe layer, an alloy layer of AuBe and Ni, or the like. The p-type clad layer 16CL may be formed as, for example, an AlGaAs layer or a multi-layer structure of an AlGaAs layer having the conductivity type assumed to be a p⁻ type, and an AlGaAs layer having the conductivity type assumed to be a p⁺ type, with a thickness of, for example, approximately 0.1 µm. For example, the MQW layer 14 may be formed as a multi-quantum well structure obtained by stacking approximately 100 heterojunction pairs made of the GaAs/AlGaAs layers, with a thickness of, for example, approximately 1.6 µm. The n-type clad layer 12CL may be formed by, for example, an n-type AlGaAs layer with a thickness of, for example, approximately 0.1 µm. For example, the n-type window/contact layer 12 may be made of a multilayer structure of the AlGaAs layers and the GaAs layer formed on the multilayer structure of the AlGaAs layers, with an overall thickness of approximately 0.95 µm.

As illustrated in FIG. 47, the semiconductor light emitting device according to the third embodiment is formed by adhering the p-type or n-type GaAs substrate illustrated in FIGS. 44 and 45, respectively, with the LED structure illustrated in FIG. 46 using the wafer bonding technique.

As illustrated in FIG. 47, the semiconductor light emitting device according to the third embodiment includes a substrate 3 (or 6) having the grooves on its surface, the first metal layer 2 formed on the surface of the substrate 3 (or 6) having the grooves, the second metal layer 1 formed on the first metal layer 2, the third metal layer 15 formed on the second metal layer 1, the semiconductor layer (16CL, 14, 12CL, and 12) including the light emitting layer 14 formed on the third metal layer 15, and the frost-processed layer 30DF disposed on the semiconductor layer (16CL, 14, 12CL, and 12).

Further, the frost-processed layer 30DF may be formed by performing wet etching a plurality of times on the surface or the etched surface of the window/contact layer 12.

Furthermore, the frost-processed layer 30DF may be formed by performing the wet etching two times on the surface or the etched surface of the window/contact layer 12 while the etching temperature for the second frost process is set lower than the etching temperature for the first frost process.

An uneven portion that reflects the shape of the surface of the substrate 3 (or 6) having the grooves may be formed on the surface of the first metal layer 2.

In addition, a surface of the second metal layer 1 at a side of the first metal layer 2 may be planar and may be bonded at a contact surface between a convex portion of the first metal layer 2 and the second metal layer 1.

Further, the second metal layer 1 and the third metal layer 15 may also be subjected to the thermo-compression bonding.

Furthermore, the first metal layer 2 may include the metal buffer layer 4 formed on the back side of the substrate 3 (or 6) having the grooves and the fourth metal layer 5 formed on the metal buffer layer 4.

The metal buffer layer 4 may be an alloy layer containing Au and the fourth metal layer 5 may be formed of Au.

The air gaps 40 exist in the grooves between the second metal layer 1 and the third metal layer 15.

The width of the grooves may be, for example, equal to or more than approximately 10 µm and equal to or less than approximately 60 µm.

The depth of the grooves may be equal to or less than the width of the grooves.

The grooves have portions adjacent to one another, and an interval between the adjacent grooves ranges, for example, from approximately 100 µm to approximately 2,000 µm.

The pattern shape of the grooves may include a stripe shape, a lattice shape, a dot shape, a spiral shape, a hexagonal pattern shape, or the like.

The substrate 3 (or 6) may be formed of an opaque material. Furthermore, the substrate 3 (or 6) may be formed of GaAs or Si. Alternatively, the substrate 3 (or 6) may be formed of Ge, SiGe, SiC or GaN.

As such, as illustrated in FIG. 47, the semiconductor light emitting device according to the third embodiment includes the p (or n) type GaAs substrate structure that includes the p (or n) type GaAs layer 3 (or 6) having the grooves on its surface, the metal buffer layer 2 which is disposed on the surface of the p (or n) type GaAs layer 3 (or 6), the side walls of the grooves, and the bottom surfaces of the grooves, the metal layer 1 disposed on the metal buffer layer 2, the metal buffer layer 4 disposed on the back of the p (or n) type GaAs layer 3 (or 6), and the metal layer 5 disposed on the surface opposite to the p (or n) type GaAs layer 3 (or 6) of the metal buffer layer 4, and an LED structure which is disposed on the p (or n) type GaAs substrate structure and includes the metal layer 15, the metallic contact layer disposed on the metal layer 15, the p-type clad layer 16CL disposed on the metallic contact layer 11, the MQW layer 14 disposed on the p-type clad layer 16CL, the n-type clad layer 12CL disposed on the MQW layer 14, and the n-type window/contact layer 12 disposed on the n-type clad layer 12CL.

The double frost-processed layer 30DF having an uneven shape is formed through the double frost process on the surface of the n-type window/contact layer 12. Here, the multiple frost process techniques according to the same wet etching technique as in the first embodiment may be applied to the double frost process.

The p (or n) type GaAs substrate structure and the LED structure formed of the epitaxial growth layers are stuck using the metal layer 15 and the metal layer 1 disposed on the surface of the p (or n) type GaAs layer 3 (or 6). Further, the air gaps 40 exist in the grooves between the metal layer 1 and the metal layer 15. Accordingly, it is possible to maintain great adherence between the metal layer 15 and the metal layer 1 disposed on the surface of the p (or n) type GaAs layer 3 (or 6), which does not need a barrier metal, and it is possible to form a metallic reflective layer having great reflectivity.

The metallic reflective layer is formed with the metal layer 15 disposed on the side of the LED structure in advance. Since the interface between the p-type clad layer 16CL and the metal layer 15 forms a mirror surface, light emitted from the LED is reflected on the mirror surface. The metallic contact layer 11 is a layer for making an ohmic contact between the metal layer 15 and the p-type clad layer 16CL while being interposed in the interface between the metal layer 15 and the p-type clad layer 16CL to form a part of the mirror surface.

As illustrated in FIG. 47, in the semiconductor light emitting device according to the third embodiment, by forming the metal layer 1 and the metal layer 15 as Au layers, it becomes possible to adhere the metal layer 1 of the GaAs substrate side and the metal layer 15 of the LED made of the epitaxial growth layers using thermo-compression bonding.

For example, a condition for adhering may be a temperature ranging from approximately 250 degrees C. to approximately 700 degrees C., specifically, approximately 300 degrees C. to approximately 400 degrees C., and a pressure for the thermo-compression bonding may range from, for example, approximately 10 MPa to approximately 20 MPa. By providing the air gaps 40, the contact area between the metal layer 1 and the metal layer 15 decreases as compared to a structure in which the entire surfaces are brought into close-contact with each other. As a result, by providing the air gaps 40, the pressure of the thermo-compression bonding presses the contact area between the metal layer 15 and the metal layer 1 in which the contact area relatively decreases, and the sticking strength increases at the time of thermo-compression bonding of the metal layer 1 and the metal layer 15. Thus, when the p (or n) type GaAs substrate structure and the LED structure made of the epitaxial growth layers are stuck, since the air gaps 40 exist, it is possible to maintain great adhesion between the metal layer 1 and the metal layer 15 disposed on the surface of the p (or n) type GaAs layer 3 (or 6).

In the semiconductor light emitting device according to the third embodiment, by forming the double frost-processed layer 30DF having the uneven shape on the surface of the n-type window/contact layer 12 using the double frost process technique, it is possible to achieve high brightness of the LED.

Moreover, in the semiconductor light emitting device according to the third embodiment, it is possible to adhere the GaAs substrate structure and the LED structure using the wafer bonding technique while maintaining great adhesion, and it is possible to form the metallic reflective layer having great reflectivity of light in the structure of the LED side by using the metal layer 15 made of Au. Accordingly, it is possible to achieve high brightness of the LED.

First and Second Modified Examples of Third Embodiment

Device Structure

Figure 48:
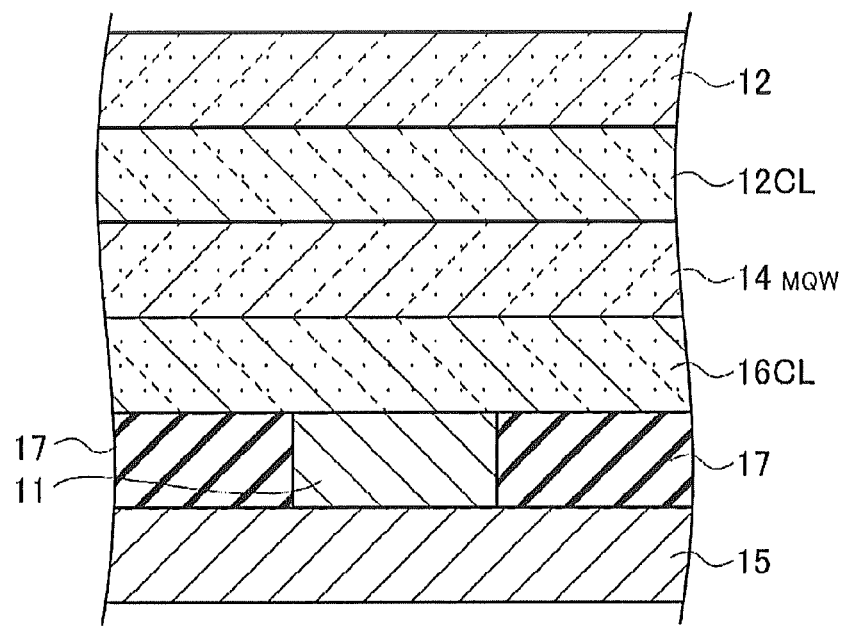
FIG. 48 schematically illustrates a structure of an LED employed in a semiconductor light emitting device according to a first modified example of the third embodiment, in a cross-sectional view.
Figure 49:
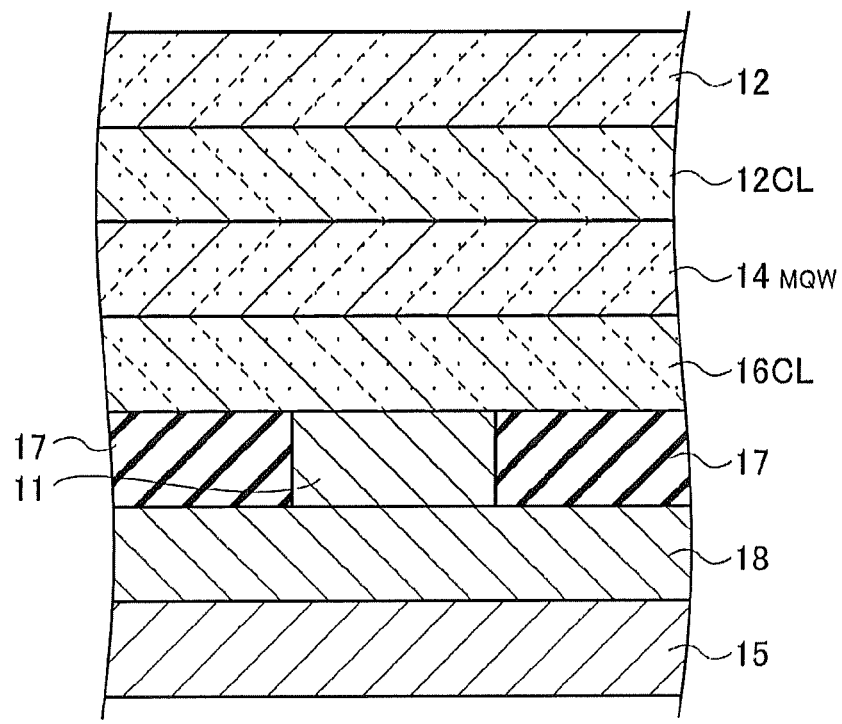
FIG. 49 schematically illustrates a structure of an LED employed in a semiconductor light emitting device according to a second modified example of the third embodiment, in a cross-sectional view.

FIG. 48 schematically illustrates a structure of an LED employed in a semiconductor light emitting device according to a first modified example of the third embodiment, in a cross-sectional view. FIG. 49 schematically illustrates a structure of an LED employed in a semiconductor light emitting device according to a second modified example of the third embodiment, in a cross-sectional view.

Figure 50:
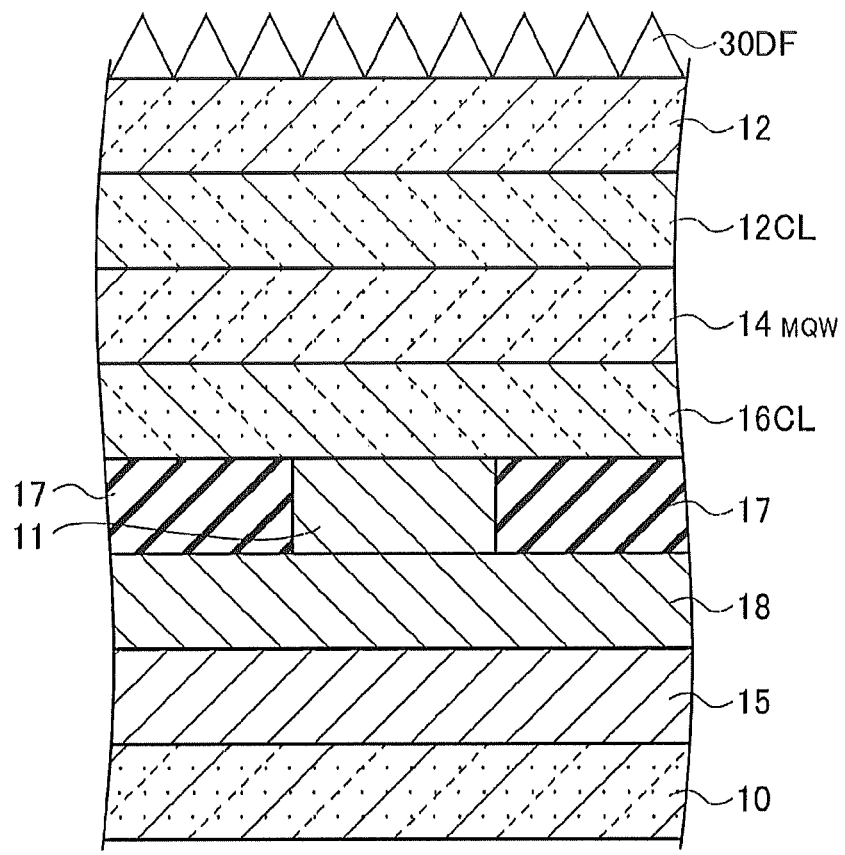
FIG. 50 schematically illustrates a structure of the semiconductor light emitting device according to the second modified example of the third embodiment, in a cross-sectional view.

FIG. 50 schematically illustrates a structure of the semiconductor light emitting device according to the first modified example of the third embodiment, in a cross-sectional view, which is formed by adhering the p-type or n-type GaAs substrate 10 and the LED illustrated in FIG. 49 by the wafer bonding technique. In FIG. 50, a metal layer made of, for example, a Au layer disposed on the GaAs substrate 10 is not illustrated. Alternatively, it is also possible to adhere the GaAs substrate 10 and the LED structure only using the metal layer 15, without disposing the metal layer such as the Au layer on the GaAs substrate 10.

As illustrated in FIG. 48, the LED employed in the semiconductor light emitting device according to the first modified example of the third embodiment includes the metal layer 15, the metallic contact layer 11 and the insulating layer 17 that are disposed and patterned on the metal layer 15, the p-type clad layer 16CL disposed on the patterned metallic contact layer 11 and insulating layer 17, the MQW layer 14 disposed on the p-type clad layer 16CL, the n-type clad layer 12CL disposed on the MQW layer 14, and the n-type window/contact layer 12 disposed on the n-type clad layer 12CL.

In the structure of FIG. 48, the metal layer 15 may be formed of, for example, a Au layer with a thickness ranging, for example, from approximately 2.5 to approximately 5 µm. Furthermore, the metallic contact layer 11 may be formed of, for example, a AuBe layer, an alloy layer of AuBe and Ni or the like, with a thickness ranging, for example, approximately the same level as that of the insulating layer 17, which is approximately 450 nm. The insulating layer 17 may be formed as, for example, a silicon oxide film, a silicon nitride film, a SiON film, a $SiO_xN_y$ film, a multilayer film thereof, or the like. The p-type clad layer 16CL may be formed as, for example, a AlGaAs layer or a multilayer structure of the AlGaAs layer having the conductivity type assumed to be a p$^-$ type and the AlGaAs layer having the conductivity type assumed to be a p$^+$ type, with a thickness of, for example, approximately 0.1 µm. The MQW layer 14 may be made of a multi-quantum well structure obtained by stacking approximately 100 heterojunction pairs made of, for example, the GaAs/GaAlAs layers, with a thickness of for example, approximately 1.6 µm. The n-type clad layer 12CL may be formed as, for example, an n-type AlGaAs layer with a thickness of, for example, approximately 0.1 µm. The n-type window/contact layer 12 may be made of, for example, a multilayer structure of an AlGaAs layer and a GaAs layer formed on the multilayer structure of the AlGaAs layer, with an overall thickness of approximately 0.95 µm.

As illustrated in FIG. 49, the LED employed in the semiconductor light emitting device according to the second modified example of the third embodiment includes the metal layer 15, the metal buffer layer 18 disposed on the metal layer 15, the metallic contact layer 11 and the insulating layer 17 that are disposed and patterned on the metal buffer layer 18, the p-type clad layer 16CL disposed on the patterned metallic contact layer 11 and insulating layer 17, the MQW layer 14 disposed on the p-type clad layer 16CL, the n-type clad layer 12CL disposed on the MQW layer 14, and the n-type window/contact layer 12 disposed on the n-type clad layer 12CL.

In the structure of FIG. 49, the metal buffer layer 18 may be formed as, for example, a Ag, Al, Ni, Cr, or W layer. Since the metal layer 15 made of a Au layer absorbs blue light and ultraviolet light, it may be necessary to include the metal buffer layer 18 made of Ag, Al or the like, in order to reflect light of a short wavelength. In the structure of FIG. 49, since each layer other than the metal buffer layer 18 is formed in the same manner as the structure of FIG. 48, repeated descriptions are omitted.

As illustrated in FIG. 50, the semiconductor light emitting device according to the second modified example of the third embodiment is formed by sticking the LED structure illustrated in FIG. 49 and the GaAs substrate 10 by the wafer bonding technique.

As illustrated in FIG. 50, the semiconductor light emitting device according to the second modified example of the third embodiment includes an LED structure that includes the GaAs substrate 10, the metal layer 15 disposed on the GaAs substrate 10, the metal buffer layer 18 disposed on the metal layer 15, the metallic contact layer 11 and the insulating layer 17 that are disposed and patterned on the metal buffer layer 18, the p-type clad layer 16CL disposed on the patterned metallic contact layer 11 and insulating layer 17, the MQW layer 14 disposed on the p-type clad layer 16CL, the n-type clad layer 12CL disposed on the MQW layer 14, and the n-type window/contact layer 12 disposed on the n-type clad layer 12CL.

The double frost-processed layer 30DF having an uneven shape is formed through the double frost process on the surface of the n-type window/contact layer 12. Here, the multiple frost process techniques according to the same wet etching technique as in the first embodiment may be applied to the double frost process.

By adhering the GaAs substrate 10 and the LED structure made of the epitaxial growth layers using the metal layer 15, it becomes possible to form the metallic reflective layer having great reflectivity. The metallic reflective layer is formed with the metal layer 15 disposed on the LED structure side in advance. Since the mirror surface is formed with the interface between the insulating layer 17 and the metal layer 15 or the metal buffer layer 18, the light emitted from the LED is reflected on the mirror surface. The metallic contact layer 11, which is a layer for making ohmic contact between the metal layer 15 or the metal buffer layer 18 and the p-type clad layer 16CL, is inserted in the interface between the metal layer 15 and the p-type clad layer 16CL and has a thickness of the same level as that of the insulating layer 17.

If a pattern width of the metallic contact layer 11 is wide, a substantial light emitting region is limited and thus, area efficiency and luminous efficiency decrease. On the other hand, if a pattern width of the metallic contact layer 11 is narrow, area resistance of the metallic contact layer 11 increases and thus, a forward voltage Vf of the LED increases. In light of the above, the pattern width and the pattern structure can be optimized. Some pattern examples include a honeycomb pattern structure based on a hexagon and a circular dot pattern structure based on a circular dot shape. The pattern shapes may be the same as those described in FIGS. 41 and 42 in association with the second embodiment.

As illustrated in FIG. 47, in the semiconductor light emitting device according to the third embodiment, by forming a metal layer disposed on the GaAs substrate and the metal layer 15 disposed on the LED side as Au layers, it becomes possible to adhere the metal layer (not illustrated) of the GaAs substrate side and the metal layer 15 of the LED structure side made of the epitaxial growth layer by the thermo-compression bonding.

A condition for adhering may be a temperature ranging from approximately 250 degrees C. to approximately 700 degrees C., specifically, from approximately 300 degrees C. to approximately 400 degrees C. and a pressure for the thermo-compression bonding may range from approximately 10 MPa to approximately 20 MPa.

In the semiconductor light emitting device according to the first and the second modified examples of the third embodiment, by forming the transparent insulating layer 17 between the metal layer 15 or the metal buffer layer 18 serving as the metallic reflective layer, and a semiconductor layer such as the p-type clad layer 16CL, the contact between the semiconductor layer such as the p-type clad layer 16CL and the metal layer 15 is configured to prevent absorption of light, which makes it possible to form the metallic reflective layer having great reflectivity.

In order to form a patterned transparent insulating layer 17 and make the ohmic contact, the metallic contact layer 11 made of AuBe or the like is deposited by lift-off.

Thereafter, the Au layer used for sticking the GaAs substrate 10 onto the insulating layer 17 is deposited to form the metal layer 15.

In the semiconductor light emitting device according to the first and the second modified examples of the third embodiment, by forming the double frost-processed layer 30DF having the uneven shape on the surface of the n-type window/contact layer 12 using the double frost process technique, it is possible to achieve high brightness of the LED.

In the semiconductor light emitting device according to the first and the second modified examples of the third embodiment, by installing the transparent insulating layer 17 between the metallic reflective layer and the semiconductor layer, the contact between the semiconductor layer such as the p-type clad layer 16CL and the metal layer 15 is configured to prevent the absorption of light, which makes it possible to form a metallic reflective layer having great reflectivity. Accordingly, it is possible to achieve high brightness of the LED.

Moreover, in the semiconductor light emitting device according to the second modified example of the third embodiment, by forming the metal buffer layer 18 made of Ag, Al, or the like between the insulating layer 17 and the metal layer 15, it becomes possible to efficiently reflect the light of the short wavelength such as an ultraviolet ray, which is reflected by Au with low reflectivity. Accordingly, it is possible to achieve high brightness of the LED.

Moreover, in the semiconductor light emitting device according to the first and the second modified examples of the third embodiment, since the light is not absorbed in the interface between the p-type clad layer and the metallic reflective layer, it becomes possible to achieve high brightness of the LED.

Third Modified Example of Third Embodiment

Device Structure

Figure 51:
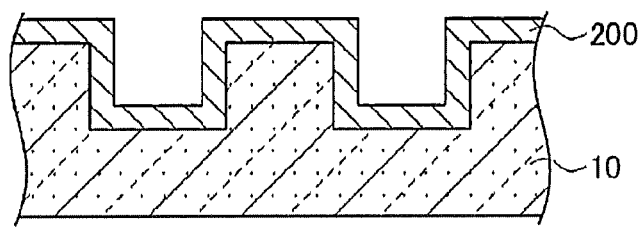
FIG. 51 schematically illustrates a GaAs substrate structure employed in a semiconductor light emitting device according to a third modified example of the third embodiment, in a cross-sectional view.
Figure 52:
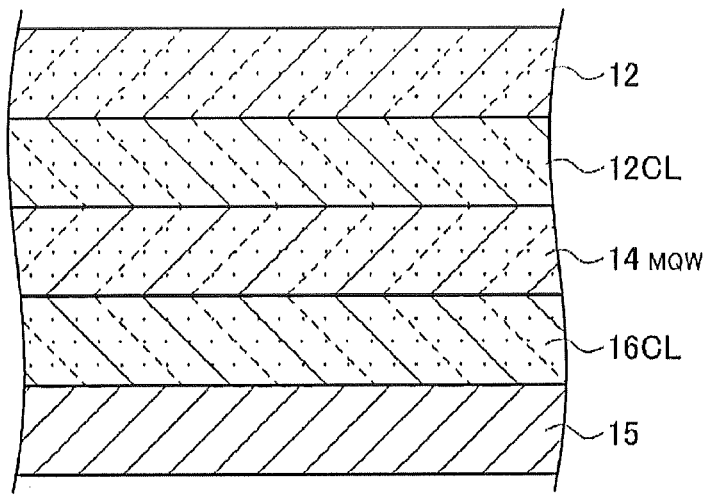
FIG. 52 schematically illustrates an LED structure employed in the semiconductor light emitting device according to the third modified example of the third embodiment, in a cross-sectional view.

FIG. 51 schematically illustrates a GaAs substrate structure employed in a semiconductor light emitting device according to a third modified example of the third embodiment, in a cross-sectional view. FIG. 52 schematically illustrates an LED structure employed in the semiconductor light emitting device according to the third modified example of the third embodiment, in a cross-sectional view.

Figure 53:
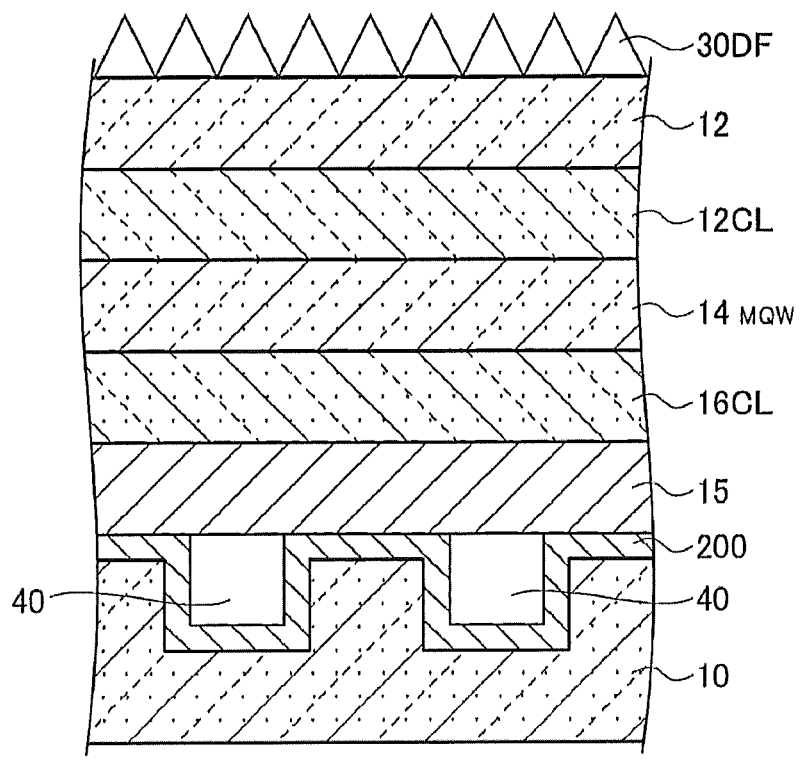
FIG. 53 schematically illustrates a structure of the semiconductor light emitting device according to the third modified example of the third embodiment, in a cross-sectional view.

FIG. 53 schematically illustrates a structure of the semiconductor light emitting device according to the third modified example of the third embodiment, in a cross-sectional view, which is formed by adhering the GaAs substrate 10 including a metal layer 200 illustrated in FIG. 51 with the LED illustrated in FIG. 52 by the wafer bonding technique.

As illustrated in FIG. 51, a p-type or n-type GaAs substrate structure employed in the semiconductor light emitting device according to the third modified example of the third embodiment includes the GaAs substrate 10 having grooves on its surface and the metal layer 200 that is disposed on the surface of the GaAs substrate 10, the side walls of the grooves, and the bottom surfaces of the grooves.

In the structure of FIG. 51, the metal layer 200 may be formed as, for example, a Au layer.

As illustrated in FIG. 52, the schematic cross-sectional structure of the LED employed in the semiconductor light emitting device according to the third modified example of the third embodiment includes the metal layer 15, the p-type clad layer 16CL disposed on the metal layer 15, the MQW layer 14 disposed on the p-type clad layer 16CL, the n-type clad layer 12CL disposed on the MQW layer 14, and the n-type window/contact layer 12 disposed on the n-type clad layer 12CL.

In the structure of FIG. 52, the metal layer 15 may be formed as, for example, an Au layer, with a thickness of, for example, approximately 1 µm. Furthermore, the p-type clad layer 16CL may be formed as, for example, an AlGaAs layer or a multilayer structure of the AlGaAs layer having the conductivity type assumed to be a p⁻ type and the AlGaAs layer having the conductivity type assumed to be a p⁺ type, with an overall thickness of, for example, approximately 0.1 µm. The MQW layer 14 may be made of a multi-quantum well structure obtained by stacking approximately 80 to 100 heterojunction pairs made of, for example, GaAs/GaAlAs layers, with an overall thickness of, for example, approximately 1.6 µm. The n-type clad layer 12CL may be formed as, for example, an n-type AlGaAs layer with a thickness of, for example, approximately 0.1 µm. The n-type window/contact layer 12 may be made of, for example, a multilayer structure of an AlGaAs layer and a GaAs layer formed on the multilayer structure of the AlGaAs layer, with an overall thickness of approximately 0.95 µm.

As illustrated in FIG. 53, the semiconductor light emitting device according to the third modified example of the third embodiment is formed by adhering the p-type or n-type GaAs substrate illustrated in FIG. 51 and the LED structure illustrated in FIG. 52 by the wafer bonding technique.

Specifically, as illustrated in FIG. 53, the semiconductor light emitting device according to the third modified example of the third embodiment includes a GaAs substrate structure that includes the GaAs substrate 10 having grooves on the surface, and the metal layer 200 that is disposed on the surface of the GaAs substrate 10, the side walls of the grooves, and the bottom surfaces of the grooves, and the LED structure that is disposed on the GaAs substrate structure and includes the metal layer 15, the p-type clad layer 16CL disposed on the metal layer 15, the MQW layer 14 disposed on the p-type clad layer 16CL, the n-type clad layer 12CL disposed on the MQW layer 14, and the n-type window/contact layer 12 disposed on the n-type clad layer 12CL.

The double frost-processed layer 30DF of an uneven shape is formed through the double frost process on the surface of the n-type window/contact layer 12. Here, the multiple frost process techniques according to the same wet etching technique as in the first embodiment may be applied to the double frost process.

The metallic reflective layer is formed with the metal layer 15 disposed on the LED structure side in advance. Since the mirror surface is formed with the interface between the p-type clad layer 16CL and the metal layer 15, the light emitted from the LED is reflected on the mirror surface.

As illustrated in FIG. 53, in the semiconductor light emitting device according to the third modified example of the third embodiment, by forming the metal layer 200 and the metal layer 15 as the Au layers, the metal layer 200 of the GaAs substrate side and the metal layer 15 of the LED structure side made of the epitaxial growth layer are adhered using the thermo-compression bonding, and thus, the air gaps 40 exist in the grooves between the metal layer 200 and the metal layer 15.

For example, a condition for the adhering may be a temperature ranging from approximately 250 degrees C. to approximately 700 degrees C., specifically, from approximately 300 degrees C. to approximately 400 degrees C. and a pressure for the thermo-compression bonding may range from approximately 10 MPa to approximately 20 MPa. By providing the air gaps 40, the contact area between the metal layer 200 and the metal layer 15 decreases as compared to a structure in which the entire surfaces are brought into close-contact with each other. As a result, by providing the air gaps 40, the pressure of the thermo-compression bonding presses the contact area between the metal layer 41 and the metal layer 200 in which the contact area relatively decreases, and the sticking strength increases at the time of thermo-compression bonding of the metal layer 41 and the metal layer 200. Thus, when sticking the GaAs substrate 10 and the LED structure, since the air gaps 40 exist, it is possible to maintain great adhesion between the metal layer 41 disposed on the surface of the GaAs substrate 10 and the metal layer 200.

The semiconductor light emitting device and the method of manufacturing the same according to the third modified example of the third embodiment are characterized in that, in order to prevent the absorption of light into the GaAs substrate, while maintaining the great adhesion between the metal layer 200 and the metal layer 15, the absorption to the GaAs substrate is prevented by totally reflecting the light by using a metal in the metallic reflective layer. As the materials of the semiconductor substrate to be adhered, opaque semiconductor substrate materials such as GaAs and Si are used.

When the Au layer is used as the metal layer 200 of the GaAs substrate 10, the Au layer is also used as the metal layer 15 of the LED side including the epitaxial growth layer. The metal layer 15 adheres to the metal layer 200, and the metal layer 15 used for adhering serves as the reflective layer of light as the metallic reflective layer.

According to the semiconductor light emitting device according to the third modified example of the third embodiment, it is possible to adhere the GaAs substrate and the LED structure using the wafer bonding technique while maintaining the great adhesion between the two structures. Furthermore, the light may be totally reflected using a metal in the metallic reflective layer to prevent the absorption to the GaAs substrate, which makes it possible to reflect the light of all angles. Accordingly, it is possible to achieve high brightness of the LED.

According to the semiconductor light emitting device according to the third modified example of the third embodiment, by forming the double frost-processed layer 30DF having the uneven shape on the surface of the n-type window/contact layer 12 using the double frost process technique, it is possible to achieve high brightness of the LED.

Fourth Modified Example of Third Embodiment

Device Structure

Figure 54:
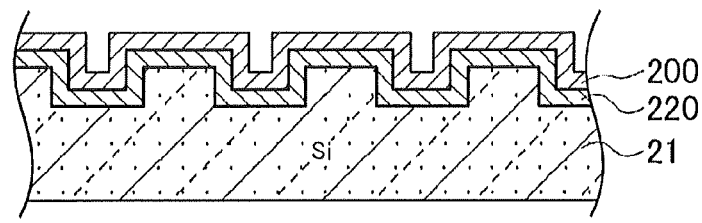
FIG. 54 schematically illustrates a Si substrate structure employed in a semiconductor light emitting device according to a fourth modified example of the third embodiment, in a cross-sectional view.
Figure 55:
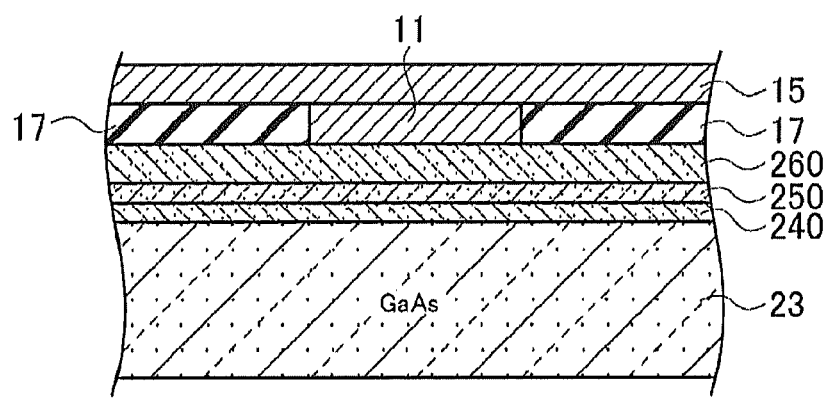
FIG. 55 schematically illustrates an LED structure employed in the semiconductor light emitting device according to the fourth modified example of the third embodiment, in a cross-sectional view.

FIG. 54 schematically illustrates a Si substrate structure employed in a semiconductor light emitting device according to a fourth modified example of the third embodiment, in a cross-sectional view. FIG. 55 schematically illustrates an LED structure employed in the semiconductor light emitting device according to the fourth modified example of the third embodiment, in a cross-sectional view.

As illustrated in FIG. 54, the silicon substrate structure employed in the semiconductor light emitting device according to the fourth modified example of the third embodiment includes a silicon substrate 21 having a plurality of grooves on its surface, a titanium (Ti) layer 220 that is disposed on the surface of the silicon substrate 21, the side walls of the grooves, and the bottom surfaces of the grooves, and a metal layer 200 disposed on the surface of the titanium (Ti) layer 220.

In the structure of FIG. 54, a thickness of the silicon substrate 21 may be, for example, approximately 130 µm, and the metal layer 200 may be formed as, for example, an Au layer with a thickness of approximately 2.5 µm.

As illustrated in FIG. 55, the LED structure employed in the semiconductor light emitting device according to the fourth modified example of the third embodiment includes a GaAs substrate 23, an AlInGaP layer 240 disposed on the GaAs substrate 23, an n-type GaAs layer 250 disposed on the AlInGaP layer 240, an epitaxial growth layer 260 disposed on the n-type GaAs layer 250, a metallic contact layer 11 and an insulating layer 17 that are disposed and patterned on the epitaxial growth layer 260, and a metal layer 15 disposed on the patterned metallic contact layer 11 and insulating layer 17.

In the structure of FIG. 55, a thickness of the GaAs substrate 23 may be, for example, approximately 300 µm, and a thickness of the AlInGaP layer 240 may be, for example, approximately 350 nm. Furthermore, the n-type GaAs layer 250 serves as a contact layer between the GaAs substrate 23 and the epitaxial growth layer 260 via the AlInGaP layer 240, and a thickness thereof is, for example, approximately 500 nm. The epitaxial growth layer 260 includes an n-type window layer and an n-type clad layer made of AlGaAs layers, an MQW layer made of a plurality of pairs of heterojunction of GaAs/AlGaAs, an n-type clad layer made of an AlGaAs layer, and a p-type window layer made of AlGaAs layer/GaP layer. For example, the MQW layer is made of a multi-quantum well structure obtained by stacking approximately 100 heterojunction pairs made of GaAs/GaAlAs layers, with a thickness of, for example, approximately 1.6 µm.

Furthermore, the metallic contact layer 11 may be formed of, for example, a AuBe layer, an alloy layer of AuBe and Ni, or the like, with a thickness of, for example, approximately the same as the insulating layer 17, which is approximately 450 nm.

For example, the metallic contact layer 11 may be formed as a laminated structure, such as Au/AuBe—Ni alloy/Au. For example, the insulating layer 17 may be formed of a silicon oxide film, a silicon nitride film, a SiON film, a $SiO_xN_y$ film, a multilayer film thereof, or the like.

The metal layer 15 may be formed as, for example, a Au layer with a thickness ranging, for example, from approximately 2.5 to approximately 5 µm. For example, the p-type clad layer in the epitaxial growth layer 260 may be formed as an AlGaAs layer or a multilayer structure of an AlGaAs layer having the conductivity type assumed to be a $p^-$ type and an AlGaAs layer having the conductivity type assumed to be $p^+$ type, with a thickness of, for example, approximately 0.1 µm. For example, the n-type clad layer in the epitaxial growth layer 260 may be formed as an n-type AlGaAs layer with a thickness of, for example, approximately 0.1 µm. For example, the n-type window layer may be made of a multilayer structure of an AlGaAs layer and a GaAs layer formed on the multilayer structure of the AlGaAs layer, with an overall thickness of, for example, approximately 0.95 µm. For example, the p-type window layer may be made of a multilayer structure of an AlGaAs layer and a GaP layer formed on the multilayer structure of the AlGaAs layer, with an overall thickness of, for example, approximately 0.32 µm.

Figure 61:
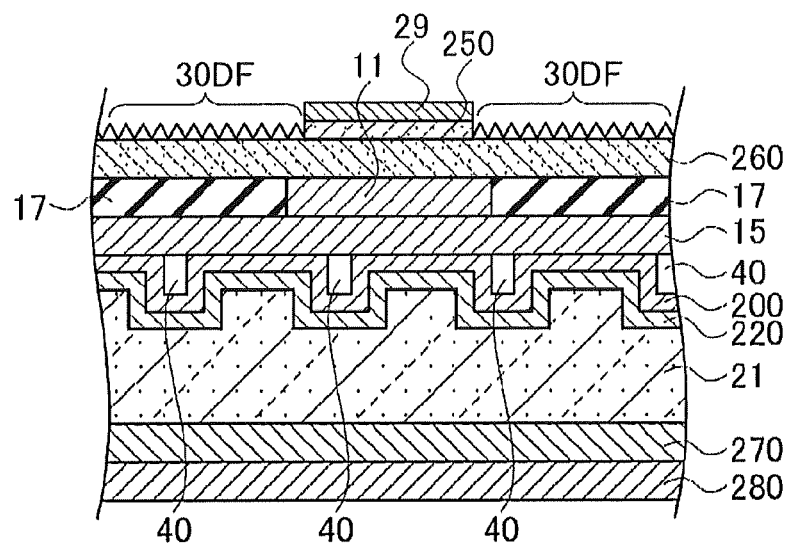
FIG. 61 schematically illustrates a structure for describing a process in the method of manufacturing the semiconductor light emitting device according to the fourth modified example of the third embodiment, in a cross-sectional view.

As illustrated in FIG. 61, the semiconductor light emitting device according to the fourth modified example of the third embodiment is formed by sticking the silicon substrate structure illustrated in FIG. 54 and the LED structure illustrated in FIG. 55 by the wafer bonding technique.

Figure 62:
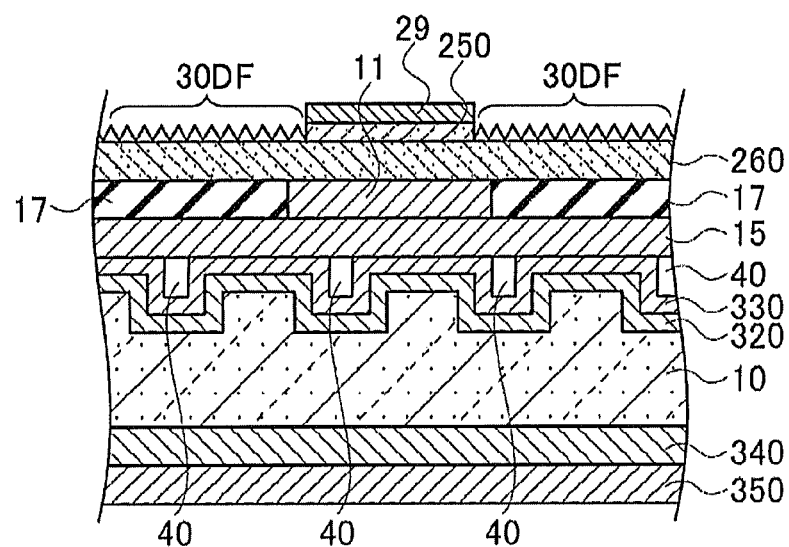
FIG. 62 schematically illustrates a structure for describing a process in a method of manufacturing a semiconductor light emitting device according to a fifth modified example of the third embodiment, in a cross-sectional view.
Figure 63:
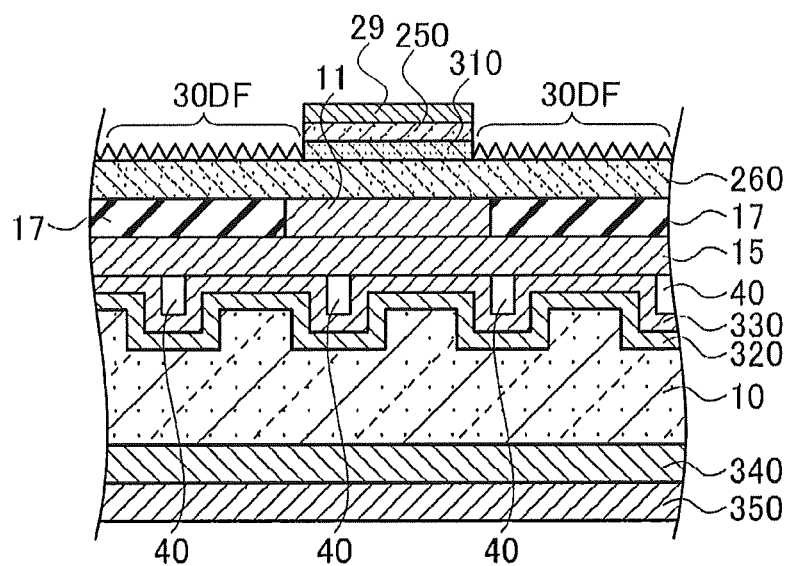
FIG. 63 schematically illustrates a structure for describing a process in a method of manufacturing a semiconductor light emitting device according to a sixth modified example of the third embodiment, in a cross-sectional view.

That is, as illustrated in FIG. 61, the semiconductor light emitting device according to the fourth modified example of the third embodiment includes a silicon substrate structure that includes a silicon substrate 21 formed with a plurality of grooves on the surface, a titanium layer 220 disposed on the surface of the silicon substrate 21, the bottom surfaces of the grooves, and the side walls of the grooves, and a metal layer 200 disposed on the titanium layer 220, and an LED structure that includes a metal layer 15 disposed on the metal layer 200, a metallic contact layer 11 and an insulating layer 17 that are disposed and patterned on the metal layer 15, an epitaxial growth layer 260 that are disposed on the patterned metallic contact layer 11 and insulating layer 17, and has a double frost-processed layer 30DF (a region formed by performing the frost process of the exposed n-type GaAs layer 250) on the exposed surface, an n-type GaAs layer 250 that is disposed and patterned on the epitaxial growth layer 260, and a surface electrode layer 29 that is disposed and patterned on the n-type GaAs layer 250 similarly. In addition, in the silicon substrate structure, a titanium layer 270, and a back electrode layer 280 are disposed on the back of the silicon substrate 21. Furthermore, as illustrated in FIGS. 62 and 63 that will be described below, a blocking layer 310 for preventing the current concentration may be disposed between the epitaxial growth layer 260 and the n-type GaAs layer 250. As the material of the blocking layer 310 in this case, GaAs can be applied, and the thickness thereof is, for example, approximately 500 nm.

As illustrated in FIG. 61, in the semiconductor light emitting device according to the fourth modified example of the third embodiment, since the silicon substrate structure and the LED structure made of the epitaxial growth layer are stuck using the metal layer 15 and the air gaps 40 exist in the grooves between the metal layer 200 and the metal layer 15, it is possible to maintain great adhesion between the metal layer 200 disposed on the surface of the silicon substrate 21 and the metal layer 15 and thus, it is also possible to form a metallic reflective layer having great reflectivity.

By providing the air gaps 40, the contact area between the metal layer 200 and the metal layer 15 decreases as compared to a structure in which the entire surfaces come into close-contact with each other. As a result, by providing the air gaps 40, the pressure of the thermo-compression bonding presses the contact area between the metal layer 200 and the metal layer 15 in which the contact area relatively decreases, and the sticking strength increases at the time of thermo-compression bonding of the metal layer 200 and the metal layer 15. Thus, when adhering the silicon substrate structure and the LED structure, since the air gaps 40 exist, it is possible to maintain great adhesion between the metal layer 200 disposed on the surface of the silicon substrate and the metal layer 15.

According to the semiconductor light emitting device according to the fourth modified example of the third embodiment, by forming the double frost-processed layer 30DF having the uneven shape on the surface of the epitaxial growth layer 260 using the double frost process technique, it is possible to achieve high brightness of the LED.

According to the semiconductor light emitting device according to the fourth modified example of the third embodiment, it is possible to adhere the silicon substrate structure and the LED structure using the wafer bonding technique while maintaining great adhesion. In addition, it is possible to form the metallic reflective layer having great light reflectivity in the structure of the LED side by using the metal layer 15 made of Au. Accordingly, it is possible to achieve high brightness of the LED.

The metallic reflective layer is formed with the metal layer 15 disposed on the LED structure side in advance. Since a mirror surface is formed with the interface between the insulating layer 17 and the metal layer 15, the light emitted from the LED is reflected on the mirror surface. The metallic contact layer 11, which is a layer for making an ohmic contact between the metal layer 15 and the epitaxial growth layer 260, is inserted in the interface between the metal layer 15 and the epitaxial growth layer 260 and has a thickness of the same level as that of the insulating layer 17.

(Plane Pattern Structure)

As the schematic plane pattern structure of the LED employed in the semiconductor light emitting device and the method of manufacturing the same according to the third embodiment, it is also possible to employ the structure similar to that in FIG. 41 or 42.

(Manufacturing Method)

A method of manufacturing the semiconductor light emitting device according to the fourth modified example of the third embodiment will be described below.

FIGS. 56 to 61 illustrate schematic cross-sectional structures illustrating a process of the method of manufacturing the semiconductor light emitting device according to the fourth modified example of the third embodiment.

(a) First, the silicon substrate structure to be adhered as illustrated in FIG. 54 and the LED structure to be adhered as illustrated in FIG. 55 are prepared.

Stripe-shaped grooves having a pitch L and a width W are formed on the surface of the silicon substrate 21 by RIE or wet etching. A width W of the stripe-shaped grooves may be, for example, approximately 10 µm, approximately 30 µm, or approximately 60 µm, and a pitch L may be, for example, approximately 100 µm, approximately 200 µm, approximately 410 µm, approximately 1,000 µm, or approximately 2,000 µm. In addition, the grooves may be a lattice shape, a dot shape, a swirl shape, a hexagonal pattern shape, or the like, without being limited to the stripe shape. In addition, a depth of the grooves may be the same level as that of the width W of the stripe or may be shallower. The grooves may be formed at a predetermined depth, by employing a cutting technique of a dicer, a cutting technique using a laser beam, or the like, which uses a YAG laser, instead of the etching technique.

In the silicon substrate structure, the titanium layer 220 and the metal layer 200 made of Au or the like are sequentially formed on the silicon substrate 21 having a plurality of grooves on its surface, by using a sputtering method, a vacuum deposition method, or the like.

In the LED structure, the AlInGaP layer 240, the n-type GaAs layer 250, and the epitaxial growth layer 260 are sequentially formed on the GaAs substrate 23 using an MBE method, a MOCVD method, or the like. Next, on the epitaxial growth layer 260, the metallic contact layer 11 and the metal layer 15 are formed with respect to the patterned insulating layer 17, using a lift-off method.

Figure 56:
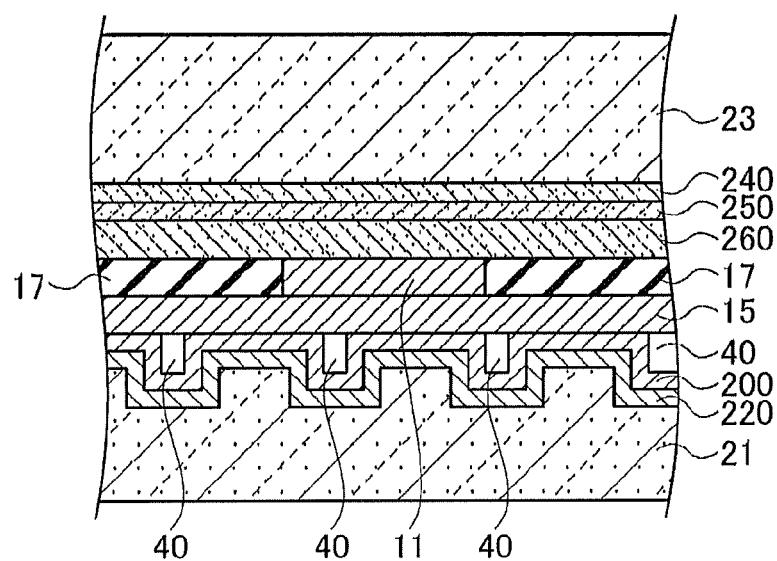
FIG. 56 schematically illustrates a structure for describing a process in a method of manufacturing the semiconductor light emitting device according to the fourth modified example of the third embodiment, in a cross-sectional view.

(b) Next, as illustrated in FIG. 56, the silicon substrate structure as illustrated in FIG. 54 and the LED structure for adhering illustrated in FIG. 55 are adhered to each other. For example, the adhering is performed in conditions of approximately 340 degrees C. as a thermo-compression bonding temperature, approximately 18 MPa as a thermo-compression bonding pressure, and approximately 10 minutes as a thermo-compression bonding time, for example, using a presser.

As a result, as illustrated in FIG. 56, the air gaps 40 are formed in the grooves between the metal layer 200 and the metal layer 15.

Figure 57:
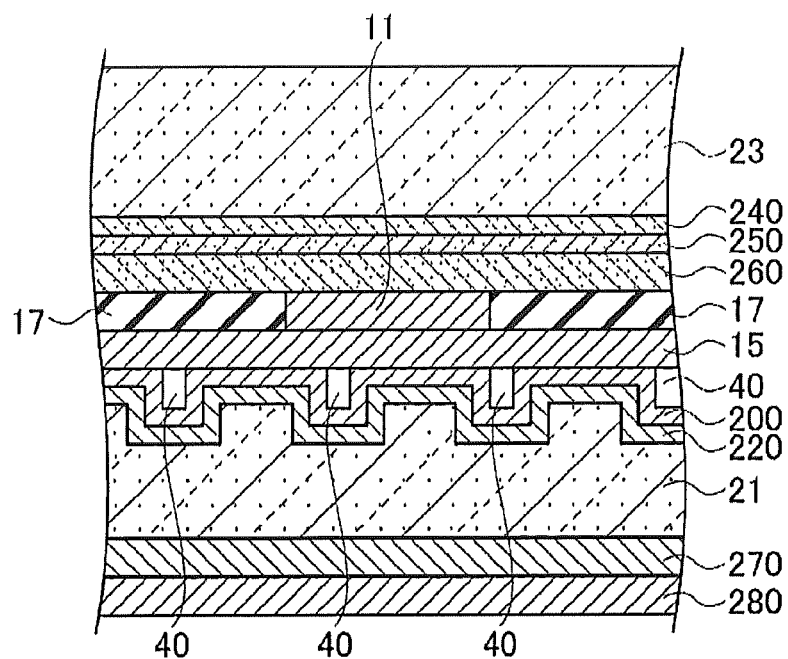
FIG. 57 schematically illustrates a structure for describing a process in the method of manufacturing the semiconductor light emitting device according to the fourth modified example of the third embodiment, in a cross-sectional view.

(c) Next, as illustrated in FIG. 57, the titanium layer 270 and the back electrode layer 280 made of Au or the like are sequentially formed on the back side of the silicon substrate 21, using a sputtering method, a vacuum deposition method, or the like. In a case in which the titanium layer 270 is not inserted between the Au layer and the silicon substrate 21, if sintering is performed to make an ohmic contact, Au of the joint between the silicon substrate 21 and the Au layer becomes AuSi silicide, and reflectivity decreases. Therefore, the titanium layer 270 is a metal for bonding the silicon substrate 21 and the Au layer. In order to prevent the AuSi silicidation, tungsten (W) is required as a barrier metal. As a structure of this case, it is necessary to form a metal layer with the silicon substrate/Ti/W/Au from the substrate side.

Figure 58:
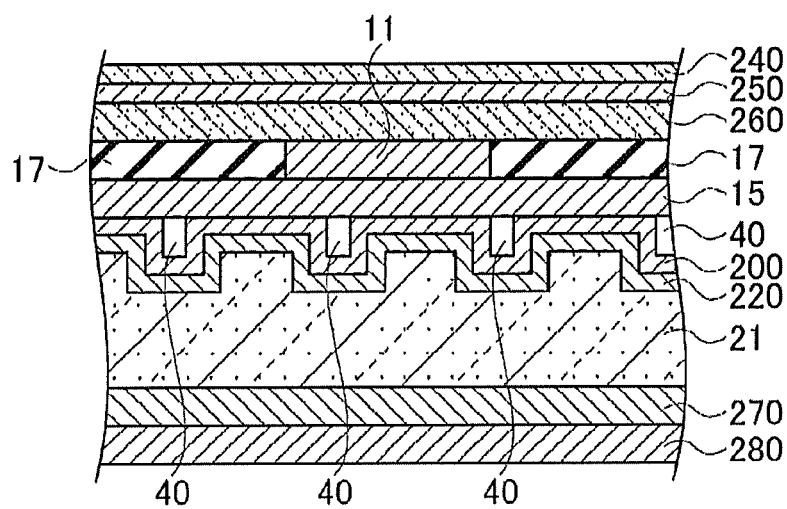
FIG. 58 schematically illustrates a structure for describing a process in the method of manufacturing the semiconductor light emitting device according to the fourth modified example of the third embodiment, in a cross-sectional view.

(d) Next, as illustrated in FIG. 58, after the back electrode layer 280 is protected by resist or the like, the GaAs substrate 23 is removed by etching. For example, etchant including ammonia/hydrogen peroxide is used, and the etching time is approximately 65 to 85 minutes. Here, the AlInGaP layer 240 serves as an etching stopper.

Figure 59:
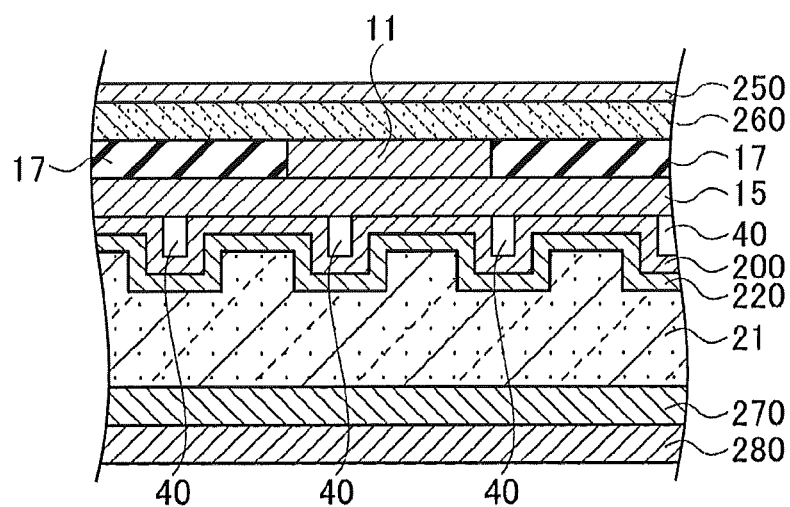
FIG. 59 schematically illustrates a structure for describing a process in the method of manufacturing the semiconductor light emitting device according to the fourth modified example of the third embodiment, in a cross-sectional view.

(e) Next, as illustrated in FIG. 59, the AlInGaP layer 240 is removed using a hydrochloric acid-based etchant. For example, the etching time is approximately one and a half minutes.

Figure 60:
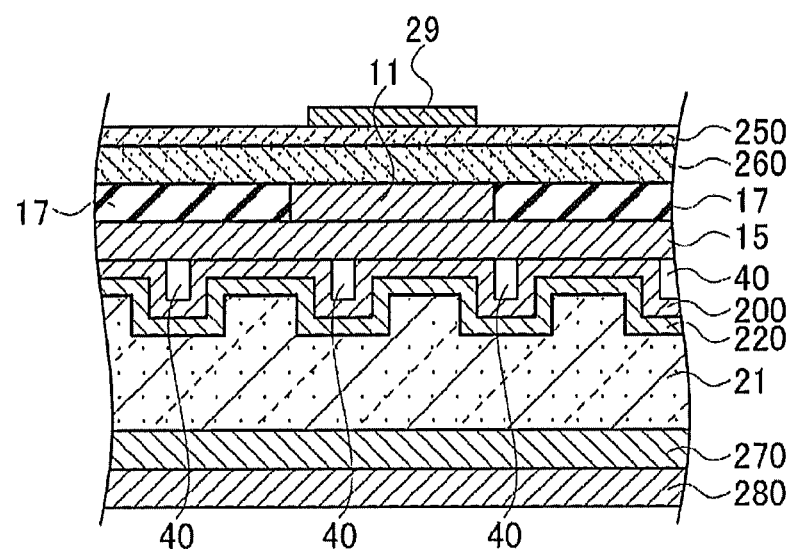
FIG. 60 schematically illustrates a structure for describing a process in the method of manufacturing the semiconductor light emitting device according to the fourth modified example of the third embodiment, in a cross-sectional view.

(f) Next, as illustrated in FIG. 60, after the surface electrode layer 29 is formed by a sputtering method, a vacuum deposition method, or the like, the surface electrode layer 29 is patterned. The pattern of the surface electrode layer 29 is made to substantially match the pattern of the metallic contact layer 11. As a material of the surface electrode layer 29, it is possible to use a laminated structure made of, for example, Au/AuGe—Ni alloy/Au. Here, the n-type GaAs layer 250 has a function of preventing peeling of the surface electrode layer 29.

(g) Next, as illustrated in FIG. 61, the double frost process is performing by the wet etching technique. As a result, the n-type GaAs layer 250, excluding a portion of the n-type GaAs layer 250 below the surface electrode layer 29, is removed, and the double frost-processed layer 30DF is formed on the surface of the epitaxial growth layer 260. The double frost process conditions may be carried out in the same manner as the first embodiment.

For example, it is also possible to use a tungsten (W) barrier metal, a platinum (Pt) barrier metal or the like as alternatives of the titanium layer 220 and the titanium layer 270.

As illustrated in FIG. 61, the semiconductor light emitting device according to the fourth modified example of the third embodiment using the silicon substrate 21 having a plurality of grooves on the surface is completed by the above-mentioned description.

Fifth and Sixth Modified Examples of Third Embodiment

FIG. 62 schematically illustrates a structure for describing a process in a method of manufacturing a semiconductor light emitting device according to a fifth modified example of the third embodiment, in a cross-sectional view. FIG. 63 schematically illustrates a structure for describing a process in a method of manufacturing a semiconductor light emitting device according to a sixth modified example of the third embodiment, in a cross-sectional view.

As illustrated in FIG. 62, the semiconductor light emitting device according to the fifth modified example of the third embodiment is formed by adhering the GaAs substrate structure having the same structure as the silicon substrate structure illustrated in FIG. 54 and the LED structure illustrated in FIG. 55 by the wafer bonding technique.

Specifically, as illustrated in FIG. 62, the semiconductor light emitting device according to the fifth modified example of the third embodiment includes a GaAs substrate structure that includes a GaAs substrate 10 formed with a plurality of grooves on the surface, a metal buffer layer (e.g., a AuGe—Ni alloy layer) 320 that is disposed on the surface of the GaAs substrate 10, the side walls of the grooves, and the bottom surfaces of the grooves, and a metal layer (e.g., a Au layer) 330 disposed on the metal buffer layer 320, and an LED structure that includes the metal layer 15 disposed on the metal layer 330, the metallic contact layer 11 and the insulating layer 17 that are disposed and patterned on the metal layer 15, the epitaxial growth layer 260 that is disposed on the patterned metallic contact layer 11 and insulating layer 17 and has a double frost-processed layer 30DF (i.e., a layer formed by performing the double frost process on the exposed n-type GaAs layer 250) on its exposed surface, the n-type GaAs layer 250 that is disposed and patterned on the epitaxial growth layer 260, and a surface electrode layer 29 that is disposed and patterned on the n-type GaAs layer 250.

In addition, in the GaAs substrate structure, a metal buffer layer (e.g., a AuGe—Ni alloy layer) 340 and a back electrode layer 350 are disposed on the back side of the GaAs substrate 10. Furthermore, as illustrated in FIG. 63, a blocking layer 310 for preventing the current concentration may be disposed between the epitaxial growth layer 260 and the n-type GaAs layer 250. As the materials of the blocking layer 310 in this case, for example, GaAs can be applied, and its thickness may be, for example, approximately 500 nm.

In the semiconductor light emitting device according to the fifth modified example of the third embodiment, as illustrated in FIG. 62, the GaAs substrate structure and the LED structure made of the epitaxial growth layers are stuck using the metal layer (i.e., the Au layer) 330 on the surface of the GaAs substrate 10 and the metal layer 15. Since the air gaps 40 exist in the grooves between the metal layer 330 and the metal layer 15, it is possible to maintain great adhesion between the metal layer 330 disposed on the surface of the GaAs substrate 10 and the metal layer 15, and it is also possible to form a metallic reflective layer having great reflectivity. By providing the air gaps 40, the contact area between the metal layer 330 and the metal layer 15 decreases as compared to a structure in which the entire surfaces are brought into close-contact with each other. As a result, by providing the air gaps 40, the pressure of the thermo-compression bonding presses the contact area between the metal layer 330 and the metal layer 15 in which the contact area relatively decreases, and the adhesion strength increases at the time of thermo-compression bonding of the metal layer 330 and the metal layer 15.

Thus, when adhering the GaAs substrate structure and the LED structure, since the air gaps 40 are provided, it is possible to maintain great adhesion between the metal layer 330 disposed on the surface of the GaAs substrate and the metal layer 15.

The metallic reflective layer is formed with the metal layer 15 disposed on the LED structure side in advance. Since a mirror surface is formed with the interface between the insulating layer 17 and metal layer 15, the light emitted from the LED is reflected on the mirror surface. The metallic contact layer 11, which is a layer for making an ohmic contact between the metal layer 15 and the epitaxial growth layer 260, is inserted in the interface between the metal layer 15 and the epitaxial growth layer 260 and has a thickness of the same level as that of the insulating layer 17.

In the structures of FIGS. 62 and 63, the metal buffer layer 340 on the back side of the GaAs substrate 10 may be formed as for example, an AuGe—Ni alloy layer with a thickness of approximately 100 nm. Furthermore, the back electrode layer 350 may be formed as an Au layer with a thickness of approximately 500 nm. For example, the metal buffer layer 320 on the surface of the GaAs substrate 10 may be formed as an AuGe—Ni alloy layer with a thickness of approximately 100 nm. Furthermore, the metal layer 330 may be formed as an Au layer with a thickness of approximately 1 μm.

Since each process of the method of manufacturing the semiconductor light emitting device according to the fourth modified example of the third embodiment illustrated in FIGS. 54 to 61 is similar to that in the method of manufacturing the semiconductor light emitting device according to the fifth and sixth modified examples of the third embodiment, descriptions therefor will be omitted.

As the schematic plane pattern structure of the LED employed in the semiconductor light emitting device and the method of manufacturing the same according to the fifth and sixth modified examples of the third embodiment, it is also possible to employ the structure similar to that in FIG. 41 or 42.

According to the semiconductor light emitting device according to the fifth and sixth modified examples of the third embodiment, by forming the double frost-processed layer 30DF having the uneven shape on the surface of the epitaxial growth layer 260 using the double frost process technique, it is possible to achieve high brightness of the LED.

In the semiconductor light emitting device according to the fifth and sixth modified examples of the third embodiment, the GaAs substrate structure and the LED structure can be adhered using the wafer bonding technique while maintaining great adhesion, and the metallic reflective layer having great reflectivity of light can be formed in the structure of the LED side by using the metal layer 15 made of Au. Accordingly, it is possible to achieve high brightness of the LED.

Furthermore, in the semiconductor light emitting device according to the fourth modified example and the fifth and sixth modified examples of the third embodiment, it is also effective to form the metal buffer layer 18 made of Ag or Al (see FIG. 49) between the insulating layer 17 and the metal layer 15, as described in the second modified example of the third embodiment. This is because the metal buffer layer 18 made of Al or Ag may efficiently reflect light of a short wavelength such as ultraviolet rays, which is reflected by Au with low reflectivity.

According to the semiconductor light emitting device and the method of manufacturing the same according to the fourth modified example and the fifth and sixth modified examples of the third embodiment, by forming the transparent insulating layer 17 between the metallic reflective layer and the semiconductor layer, the contact between the epitaxial growth layer 260 and the metal layer 15 is configured to prevent absorption of light, which makes it possible to form a metallic reflective layer having great reflectivity. Accordingly, it is possible to achieve high brightness of the LED.

Furthermore, in the semiconductor light emitting device and the method of manufacturing the same according to the fourth modified example and the fifth and sixth modified examples of the third embodiment, by forming the metal buffer layer formed of Ag, Al, or the like between the insulating layer 17 and the metal layer 15 or 200, it becomes possible to efficiently reflect the light of the short wavelength such as ultraviolet rays, which is reflected by Au with low reflectivity. Thus, it is possible to achieve high brightness of the LED.

Furthermore, in the semiconductor light emitting device and the method of manufacturing the same according to the fourth modified example and the fifth and sixth modified examples of the third embodiment, since the contact between the epitaxial growth layer 260 and the metal layer 15 is avoided and light is not absorbed in the interface between the epitaxial growth layer 260 and the metallic reflective layer, it is possible to achieve high brightness of the LED.

In the semiconductor light emitting device and the method of manufacturing the same according to the fourth modified example and the fifth and sixth modified examples of the third embodiment. light may be totally reflected by a metal in the reflective layer in order to prevent absorption of light into the silicon substrate or the GaAs substrate, which makes it possible to reflect the light of all angles. Accordingly, it is possible to achieve high brightness of the LED.

Fourth Embodiment

Device Structure

Figure 64:
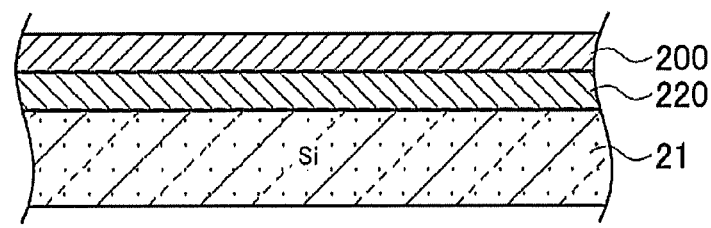
FIG. 64 schematically illustrates a Si substrate structure employed in the semiconductor light emitting device according to the fourth embodiment, in a cross-sectional view.

FIG. 64 schematically illustrates a Si substrate structure employed in the semiconductor light emitting device according to the fourth embodiment, in a cross-sectional view. Furthermore, since the schematic cross-sectional structure of the LED portion employed in the semiconductor light emitting device according to the fourth embodiment is similar to that of FIG. 55, the structure is not illustrated.

As illustrated in FIG. 64, the silicon substrate 21 employed in the semiconductor light emitting device according to the fourth embodiment includes the silicon substrate 21, the titanium (Ti) layer 220 disposed on the surface of the silicon substrate 21, and the metal layer 200 disposed on the surface of the titanium (Ti) layer 220.

In the structure of FIG. 64, a thickness of the silicon substrate 21 may be, for example, approximately 130 µm, and the metal layer 200 may be formed as, for example, an Au layer with a thickness of approximately 2.5 µm.

Figure 70:
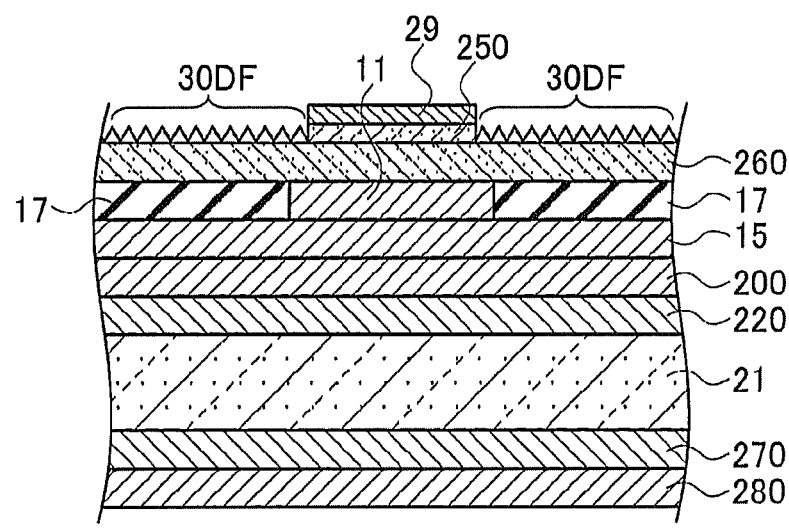
FIG. 70 schematically illustrates a structure for describing a process in the method of manufacturing the semiconductor light emitting device according to the fourth embodiment, in a cross-sectional view.

As illustrated in FIG. 70, the semiconductor light emitting device according to the fourth embodiment is formed by adhering the silicon substrate structure illustrated in FIG. 64 and the LED structure illustrated in FIG. 55 using the wafer bonding technique.

Figure 71:
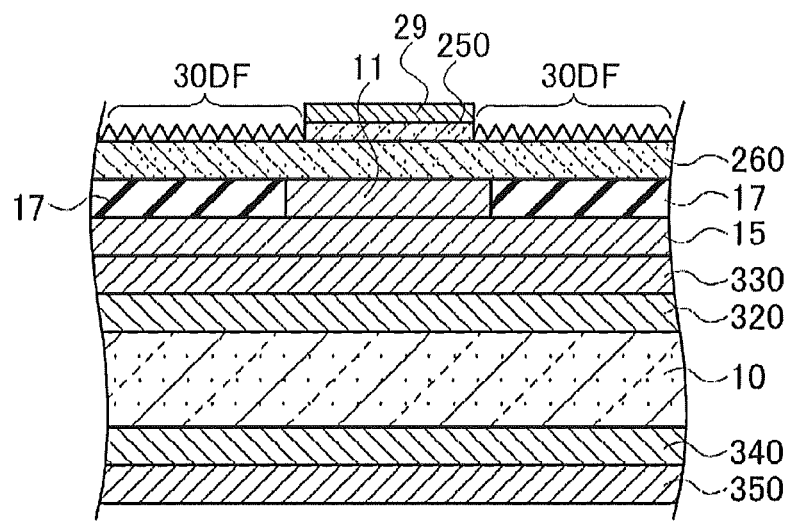
FIG. 71 schematically illustrates a structure for describing a process in a method of manufacturing a semiconductor light emitting device according to a first modified example of the fourth embodiment, in a cross-sectional view.
Figure 72:
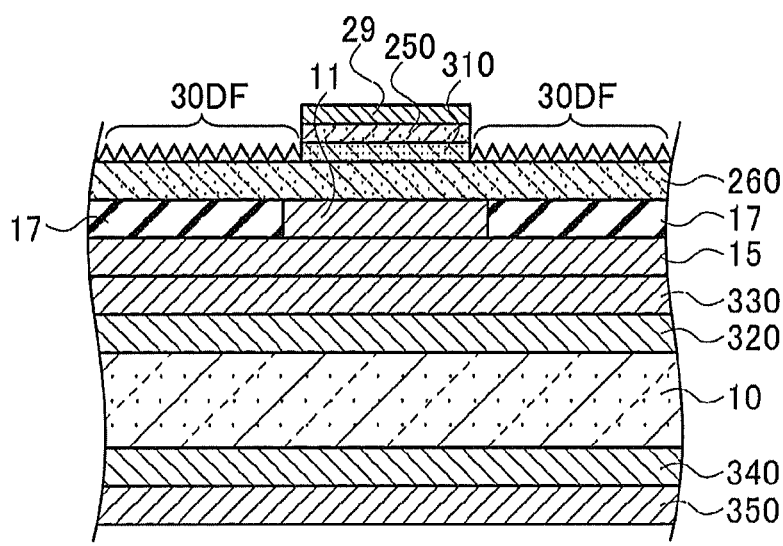
FIG. 72 schematically illustrates a structure for describing a process in a method of manufacturing a semiconductor light emitting device according to a second modified example of the fourth embodiment, in a cross-sectional view.

That is, as illustrated in FIG. 70, the semiconductor light emitting device according to the fourth embodiment includes a silicon substrate structure that includes the silicon substrate 21, the titanium layer 220 disposed on the silicon substrate 21, and the metal layer 200 disposed on the titanium layer 220, and the LED structure that includes the metal layer 15 disposed on the metal layer 200, the metallic contact layer 11 and the insulating layer 17 that are disposed and patterned on the metal layer 15, the epitaxial growth layer 260 that is disposed on the exposed metallic contact layer 11 and insulating layer 17 and has the double frost-processed layer 30DF (i.e., a layer formed by performing the double frost process on the exposed n-type GaAs layer 250) on its exposed surface, the n-type GaAs layer 250 that is disposed and patterned on the epitaxial growth layer 260, and the surface electrode layer 29 that is disposed and patterned on the n-type GaAs layer 250. In addition, in the silicon substrate structure, the titanium layer 270 and the back electrode layer 280 are disposed on the back side of the silicon substrate 21. Furthermore, as illustrated in FIGS. 71 and 72 that will be described below, the blocking layer 310 for preventing the current concentration may be disposed between the epitaxial growth layer 260 and the n-type GaAs layer 250. As the material of the blocking layer 310 in this case, GaAs can be applied, and the thickness thereof is, for example, approximately 500 nm.

Furthermore, as illustrated in FIG. 70, in the semiconductor light emitting device according to the fourth embodiment, by adhering the silicon substrate structure and the LED structure made of the epitaxial growth layers using the metal layer 15, it becomes possible to form the metallic reflective layer having great reflectivity. The metallic reflective layer is formed with the metal layer 15 disposed on the LED structure side in advance. Since a mirror surface is formed with the interface between the insulating layer 17 and the metal layer 15, the light emitted from the LED is reflected on the mirror surface. The metallic contact layer 11, which is a layer for taking an ohmic contact between the metal layer 15 and the epitaxial growth layer 260, is inserted in the interface between the metal layer 15 and the epitaxial growth layer 260 and has a thickness of the same level as that of the insulating layer 17.

(Plane Pattern Structure)

As the schematic plane pattern structure of the LED employed in the semiconductor light emitting device and the method of manufacturing the same according to the fourth embodiment, it is also possible to employ the structure similar to that in FIG. 41 or 42.

(Manufacturing Method)

A method of manufacturing the semiconductor light emitting device according to the fourth embodiment will be described below.

FIGS. 65 to 70 illustrate schematic cross-sectional structures illustrating a process of the method of manufacturing the semiconductor light emitting device according to the fourth embodiment.

(a) First, the silicon substrate structure as illustrated in FIG. 64, and the adhered to LED structure as illustrated in FIG. 55 are prepared.

In the silicon substrate structure, the titanium layer 220 and the metal layer 200 made of Au or the like are sequentially formed on the silicon substrate 21 using a sputtering method, a vacuum deposition method, or the like.

In the LED structure, the AlInGaP layer 240, the n-type GaAs layer 250, and the epitaxial growth layer 260 are successively formed on the GaAs substrate 23 using an MBE method, a MOCVD method, or the like. Next, on the epitaxial growth layer 260, the metallic contact layer 11 and the metal layer 15 are formed with respect to the patterned insulating layer 17, using a lift-off method.

Figure 65:
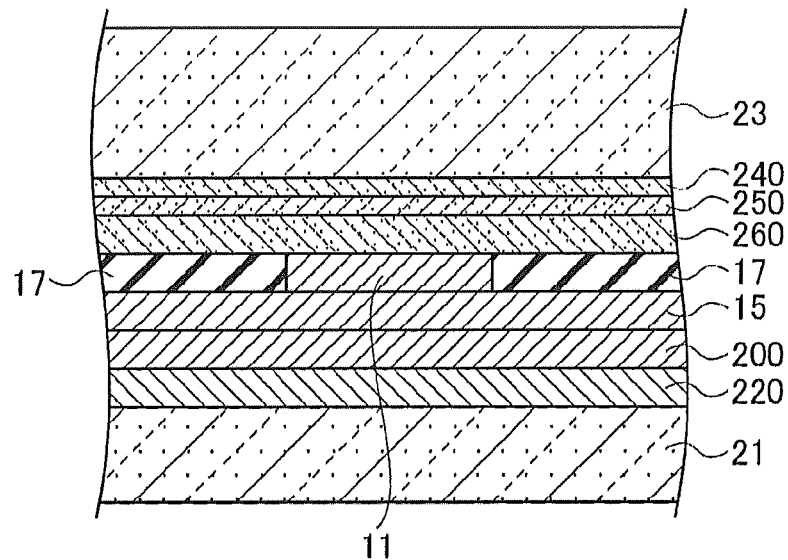
FIG. 65 schematically illustrates a structure for describing a process in the method of manufacturing the semiconductor light emitting device according to the fourth embodiment, in a cross-sectional view.

(b) Next, as illustrated in FIG. 65, the silicon substrate structure illustrated in FIG. 64 and the LED structure illustrated in FIG. 55 are adhered to each other. In the adhering process, the adhering is performed in conditions of approximately 340 degrees C. as a thermo-compression bonding temperature, approximately 18 MPa as a thermo-compression bonding pressure, and approximately 10 minutes as a thermo-compression bonding time, for example, using a presser.

Figure 66:
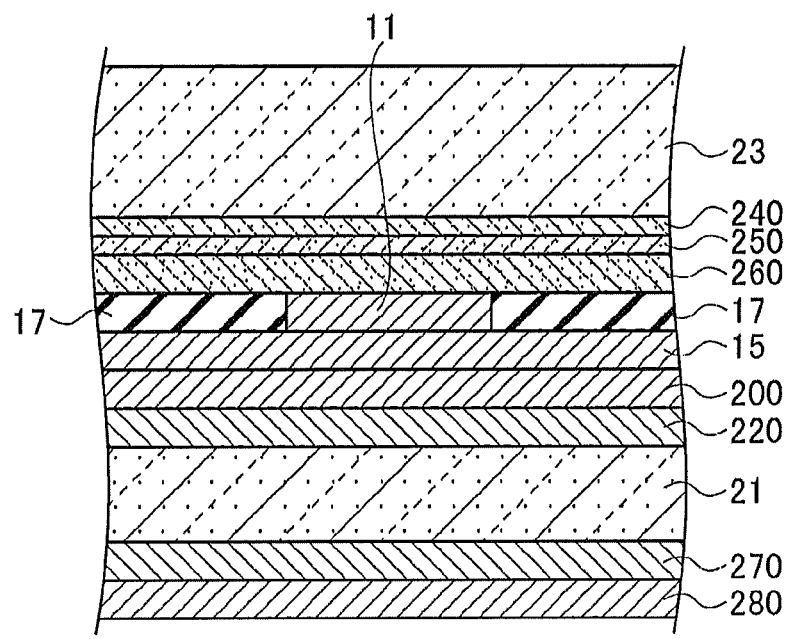
FIG. 66 schematically illustrates a structure for describing a process in the method of manufacturing the semiconductor light emitting device according to the fourth embodiment, in a cross-sectional view.

(c) Next, as illustrated in FIG. 66, the titanium layer 270 and the back electrode layer 280 made of Au or the like are sequentially formed on the back side of the silicon substrate 21, using a sputtering method, a vacuum deposition method, or the like. In a case in which the titanium layer 270 is not inserted between the Au layer and the silicon substrate 21, if sintering is not performed to make an ohmic contact, Au of a joint between the silicon substrate 21 and the Au layer becomes AuSi silicide, and reflectivity decreases. Therefore, the titanium layer 270 is a metal for bonding the silicon substrate 21 and the Au layer. In order to prevent the AuSi silicidation, tungsten (W) is required as a barrier metal. As a structure of this case, it is necessary to form a metal layer with the silicon substrate/Ti/W/Au from the substrate side.

Figure 67:
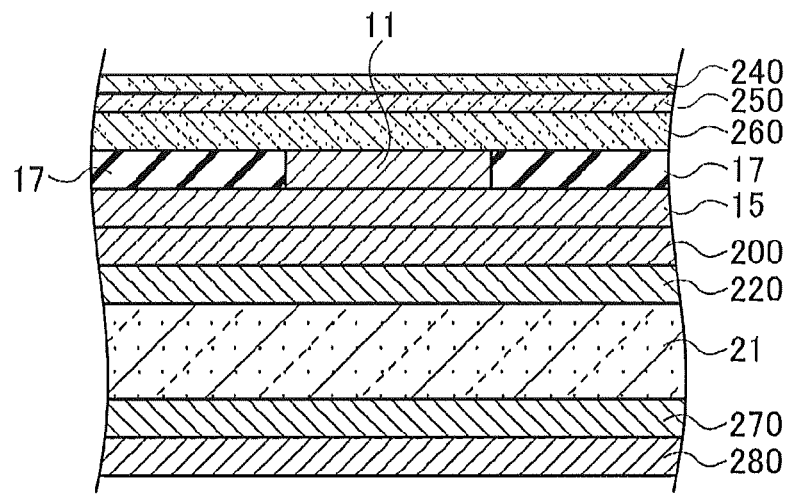
FIG. 67 schematically illustrates a structure for describing a process in the method of manufacturing the semiconductor light emitting device according to the fourth embodiment, in a cross-sectional view.

(d) Next, as illustrated in FIG. 67, after the back electrode layer 280 is protected by resist or the like, the GaAs substrate 23 is removed by etching. For example, an etchant including ammonia/hydrogen peroxide is used, and the etching time is approximately 65 to 85 minutes. Here, the AlInGaP layer 240 serves as an etching stopper.

Figure 68:
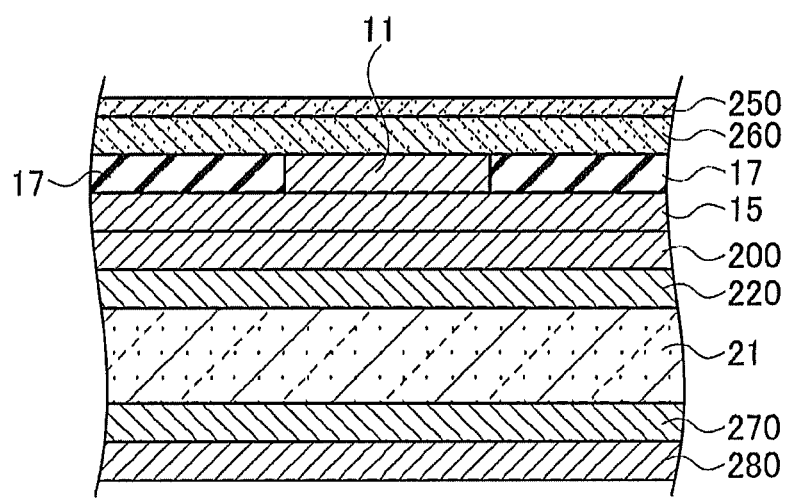
FIG. 68 schematically illustrates a structure for describing a process in the method of manufacturing the semiconductor light emitting device according to the fourth embodiment, in a cross-sectional view.

(e) Next, as illustrated in FIG. 68, the AlInGaP layer 240 is removed using the hydrochloric acid-based etchant. For example, the etching time is approximately one and a half minutes.

Figure 69:
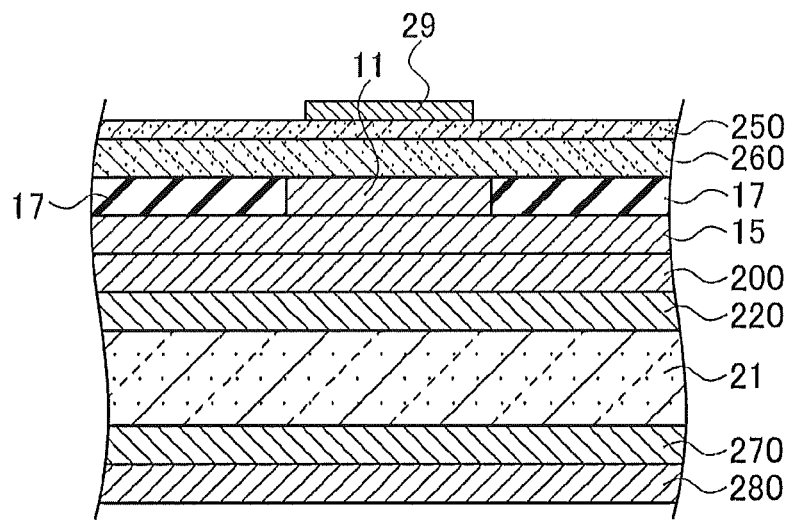
FIG. 69 schematically illustrates a structure for describing a process in the method of manufacturing the semiconductor light emitting device according to the fourth embodiment, in a cross-sectional view.

(f) Next, as illustrated in FIG. 69, after the surface electrode layer 29 is formed by a sputtering method, a vacuum deposition method, or the like, the surface electrode layer 29 is patterned. The pattern of the surface electrode layer 29 is made to substantially match the pattern of the metallic contact layer 11. As a material of the surface electrode layer 29, it is possible to use a laminated structure made of, for example, Au/AuGe—Ni alloy/Au. Here, the n-type GaAs layer 250 has a function of preventing peeling of the surface electrode layer 29.

(g) Next, as illustrated in FIG. 70, the n-type GaAs layer 250 excluding a portion of the n-type GaAs layer 250 below the surface electrode layer 29 is removed by performing the frost process, and the double frost-processed layer 30DF is formed on the surface of the epitaxial growth layer 260. The double frost process conditions can be performed in the same manner as the first embodiment.

For example, it is also possible to use a tungsten (W) barrier metal, a platinum (Pt) barrier metal or the like as alternatives of the titanium layer 220 and the titanium layer 270.

As illustrated in FIG. 70, the semiconductor light emitting device according to the fourth embodiment of the present disclosure using the silicon substrate 21 is completed by the above-mentioned description.

According to the semiconductor light emitting device according to the fourth embodiment, by forming the double frost-processed layer 30DF having the uneven shape on the surface of the epitaxial growth layer 260 by the use of the double frost process technique, it is possible to achieve high brightness of the LED.

First and Second Modified Examples of Fourth Embodiment

FIG. 71 schematically illustrates a structure for describing a process in a method of manufacturing a semiconductor light emitting device according to a first modified example of the fourth embodiment, in a cross-sectional view. FIG. 72 schematically illustrates a structure for describing a process in a method of manufacturing a semiconductor light emitting device according to a second modified example of the fourth embodiment, in a cross-sectional view.

As illustrated in FIG. 72, the semiconductor light emitting device according to the first modified example of the fourth embodiment is formed by adhering the silicon substrate structure illustrated in FIG. 64 and the LED structure illustrated in FIG. 55 using the wafer bonding technique.

Specifically, as illustrated in FIG. 70, the semiconductor light emitting device according to the first modified example of the fourth embodiment includes a GaAs substrate structure that includes the GaAs substrate 10, the metal buffer layer (e.g., a AuGe—Ni alloy layer) 320 disposed on the GaAs substrate 10, and the metal layer (e.g., a Au layer) 330 disposed on the metal buffer layer 320, and an LED structure that includes the metal layer 15 disposed on the metal layer 330, the metallic contact layer 11 and the insulating layer 17 that are disposed and patterned on the metal layer 15, the epitaxial growth layer 260 that is disposed on the patterned metallic contact layer 11 and insulating layer 17 and has the double frost-processed layer 30DF (i.e., a region formed by performing the double frost process on the exposed n-type GaAs layer 250) on its exposed surface, an n-type GaAs layer 250 that is disposed and patterned on the epitaxial growth layer 260, and the surface electrode layer 29 that is disposed and patterned on the n-type GaAs layer 250. In addition, in the GaAs substrate structure, the metal buffer layer (a AuGe—Ni alloy layer) 340 and the back electrode layer 350 are disposed on the back side of the GaAs substrate 10. Furthermore, as illustrated in FIG. 72, the blocking layer 310 for preventing the current concentration may be disposed between the epitaxial growth layer 260 and the n-type GaAs layer 250. As the materials of the blocking layer 310 in this case, for example, GaAs can be applied, and its thickness may be, for example, approximately 500 nm.

In the semiconductor light emitting device according to the first modified example of the fourth embodiment, as illustrated in FIG. 71, the GaAs substrate structure and the LED structure made of the epitaxial growth layers are adhered using the metal layer 15 and thus, it becomes possible to form a metallic reflective layer having great reflectivity. The metallic reflective layer is formed with the metal layer 15 disposed on the LED structure side in advance. Since a mirror surface is formed with the interface between the insulating layer 17 and the metal layer 15, the light emitted from the LED is reflected on the mirror surface. The metallic contact layer 11, which is a layer for taking an ohmic contact between the metal layer 15 and the epitaxial growth layer 260, is interposed in the interface between the metal layer 15 and the epitaxial growth layer 260, and has a thickness of the same level as that of the insulating layer 17.

In the structure of FIGS. 71 and 72, the metal buffer layer 340 on the back side of the GaAs substrate 10 may be formed as, for example, a AuGe—Ni alloy layer with a thickness of approximately 100 nm. Furthermore, the back electrode layer 350 may be formed as a Au layer with a thickness of approximately 500 nm. The metal buffer layer 320 on the surface of the GaAs substrate 10 may be formed as, for example, a AuGe—Ni alloy layer with a thickness of approximately 100 nm. Furthermore, the metal layer 330 is formed as a Au layer with a thickness of approximately 1 µm.

Each process of the method of manufacturing the semiconductor light emitting device according to the fourth embodiment illustrated in FIGS. 65 to 70 is also similar in the method of manufacturing the semiconductor light emitting device according to the first and second modified examples of the fourth embodiment.

As the schematic plane pattern structure of the LED employed in the semiconductor light emitting device according to the first and second modified examples of the fourth embodiment, it is also possible to employ the structure similar to that in FIG. 41 or 42.

Furthermore, in the semiconductor light emitting device according to the fourth embodiment and its modified examples, it is also effective to form the metal buffer layer 18 made of Ag, Al, or the like (see FIG. 49) between the insulating layer 17 and the metal layer 15, as described in the modified examples of the second embodiment. By forming the metal buffer layer 18 made of Ag, Al, or the like, it becomes possible to effectively reflect light of a short wavelength such as ultraviolet rays, which is reflected by Au with low reflectivity. Thus, it is possible to achieve high brightness of the LED.

In the semiconductor light emitting device according to the fourth embodiment and the modified examples thereof, by forming the transparent insulating layer 17 between the metallic reflective layer and the semiconductor layer, the contact between the epitaxial growth layer 260 and the metal layer 15 is configured to prevent absorption of light, which makes it possible to form a metallic reflective layer having great reflectivity. Accordingly, it is possible to achieve high brightness of the LED.

In the semiconductor light emitting device according to the fourth embodiment and the first and second modified examples thereof, since the contact between the epitaxial growth layer 260 and the metal layer 15 is avoided and light is not absorbed in the interface between the epitaxial growth layer 260 and the metallic reflective layer, it is possible to achieve high brightness of the LED.

In the semiconductor light emitting device according to the first and second modified examples of the fourth embodiment, by forming the double frost-processed layer 30DF having the uneven shape on the surface of the epitaxial growth layer 260 using the double frost process technique, it is possible to achieve high brightness of the LED.

In the semiconductor light emitting device according to the first and second modified examples of the fourth embodiment, the light may be totally reflected by using the metal in the reflective layer in order to prevent the absorption of light into the silicon substrate or the GaAs substrate, which makes it possible to reflect light of all angles. Accordingly, it is possible to achieve high brightness of the LED.

In the first to fourth embodiments, an example of performing the frost process two times was described as the double frost process DF, but it is not limited to two times. The frost process may be performed a plurality of times. In this case, the frost process becomes a multi-frost process MF mode. Furthermore, in the MF process mode, the etching process mode EM and the frost process mode FM may also be repeated a plurality of times.

As described above, according to the present disclosure, by performing the multiple frost process on the LED device surface, it is possible to provide a semiconductor light emitting device having improved brightness.

OTHER EMBODIMENTS

As described above, although the present disclosure has been described based on the first to fourth embodiments, the description and drawings which constitute a part of this disclosure should not be understood as limiting the present disclosure. Forms of various alternative embodiments, examples and operational techniques will be apparent to those skilled in the art from this disclosure.

In the semiconductor light emitting device and the method of manufacturing the same according to the first to fourth embodiments of the present disclosure, although the silicon substrate and the GaAs substrate are mainly described as examples of the semiconductor substrate, it is also possible to sufficiently use a Ge substrate, a SiGe substrate, a SiC substrate, a GaN substrate, a GaN epitaxial substrate on SiC or the like.

As the semiconductor light emitting device according to the first to fourth embodiments of the present disclosure, although the LED is described mainly as an example, a laser diode (LD Laser Diode) may be employed and in that case, a Distributed Feedback (DFB) LD, a Distributed Bragg Reflector (DBR) LD, a surface-emitting LD or the like may be configured.

Thus, the present disclosure includes various embodiments which are not described here. Accordingly, the technical scope of the present disclosure is intended to be defined only by the appropriate specific matters according to the claims from the above-mentioned description.

The semiconductor light emitting device of the present disclosure can be applied to general LEDs, and can be used in LED devices having a transparent substrate such as a GaAs substrate or a Si substrate, and the general semiconductor light emitting devices such as LD devices.

According to the present disclosure in some embodiments, it is possible to provide a semiconductor light emitting device having improved brightness by performing the multiple frost process on the LED device surface.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor light emitting device, comprising:
    a substrate structure that includes a substrate and an adhering layer formed on the substrate, the adhering layer being a metal layer disposed on the substrate;
    a semiconductor layer disposed on the substrate structure, the semiconductor layer including a light emitting layer, the substrate being stuck to the semiconductor layer using the adhering layer; and
    an electrode formed on a surface of the semiconductor layer,
    wherein a relatively coarse uneven portion and a relatively fine uneven portion are formed by a frost process on a surface of the semiconductor layer at a side of the electrode.

2. The semiconductor light emitting device of claim 1, wherein a region in which the relatively fine uneven portion is formed overlaps a region in which the relatively coarse uneven portion is formed.

3. The semiconductor light emitting device of claim 2, wherein the relatively fine uneven portion is formed on a surface of the relatively coarse uneven portion.

4. The semiconductor light emitting device of claim 1, wherein the relatively coarse uneven portion is formed by performing the frost process under a first condition, and
wherein the relatively fine uneven portion is formed by performing the frost process under a second condition that is different from the first condition.

5. The semiconductor light emitting device of claim 4, wherein the relatively coarse uneven portion and the relatively fine uneven portion are formed by wet etching a plurality of times while changing a condition for the wet etching.

6. The semiconductor light emitting device of claim 5, wherein each of the relatively coarse uneven portion and the relatively fine uneven portion is formed by performing wet etching, and
wherein the relatively coarse uneven portion is formed by performing the wet etching at a relatively high temperature and the relatively fine uneven portion is formed by performing the wet etching at a relatively low temperature.

7. A semiconductor light emitting device, comprising:
a substrate structure;
a semiconductor layer disposed on the substrate structure, the semiconductor layer including:
    a first clad layer of a first conductivity type disposed on the substrate structure;
    a multi-quantum well layer as a light emitting layer disposed on the first clad layer;
    a second clad layer of a second conductivity type disposed on the multi-quantum well layer;
    a window layer of the second conductivity type disposed on the second clad layer; and
    a contact layer of the second conductivity type disposed on the window layer;
an electrode formed on a surface of the semiconductor layer, wherein a relatively coarse uneven portion and a relatively fine uneven portion are formed by a frost process on a surface of the semiconductor layer at a side of the electrode; and
a frost-processed layer disposed on a surface or an etched surface of the contact layer or the window layer.

8. The semiconductor light emitting device of claim 7, wherein the frost-processed layer is formed by wet etching a plurality of times.

9. The semiconductor light emitting device of claim 7, wherein the frost-processed layer is formed by wet etching two times and an etching temperature for a second frost process is lower than an etching temperature for a first frost process.

10. The semiconductor light emitting device of claim 7, wherein the frost-processed layer is formed as an AlInGaP layer.

11. The semiconductor light emitting device of claim 7, wherein the frost-processed layer is formed as an AlGaAs layer.

12. The semiconductor light emitting device of claim 7, wherein the frost-processed layer is formed as a GaP layer.

13. The semiconductor light emitting device of claim 7, wherein a distributed Bragg reflector layer is disposed between the substrate structure and the first clad layer.

14. The semiconductor light emitting device of claim 13, wherein the distributed Bragg reflector layer is formed as a GaP/AlInP pair, a GaAs/AlGaAs pair, or a GaAs/AlInP pair.

15. The semiconductor light emitting device of claim 7, further comprising a transparent electrode layer on the frost-processed layer.

16. The semiconductor light emitting device of claim 1, further comprising a metallic contact layer and an insulating layer that are disposed and patterned on the metal layer.

17. The semiconductor light emitting device of claim 1, wherein the substrate includes grooves formed on its surface, and
wherein the semiconductor light emitting device further comprises:
    a metal buffer layer disposed on the surface of the substrate, side walls of the grooves, and bottom surfaces of the grooves; and
    a metallic contact layer and an insulating layer that are disposed and patterned on the metal layer.

18. A semiconductor light emitting device, comprising:
a substrate structure that includes:
    a substrate that includes grooves formed on its surface; and
    an adhering layer formed on the substrate that includes:
        a first metal layer formed on the surface of the substrate on which the grooves are formed;
        a second metal layer formed on the first metal layer; and
        a third metal layer formed on the second metal layer;
a semiconductor layer disposed on the substrate structure, the semiconductor layer including a light emitting layer, the substrate being stuck to the semiconductor layer using the adhering layer;
an electrode formed on a surface of the semiconductor layer; and
a frost-processed layer disposed on the semiconductor layer;
wherein a relatively coarse uneven portion and a relatively fine uneven portion are formed by a frost process on a surface of the semiconductor layer at a side of the electrode; and
wherein the frost-processed layer is formed by wet etching a plurality of times.

19. The semiconductor light emitting device of claim 18, wherein an uneven portion is formed on a surface of the first metal layer, the uneven portion reflecting a shape of the surface of the substrate on which the grooves are formed.

20. The semiconductor light emitting device of claim 19, wherein a surface of the second metal layer at a side of the first metal layer is planar and bonded at a contact surface between a convex portion of the first metal layer and the second metal layer.

21. The semiconductor light emitting device of claim 18, wherein the second metal layer and the third metal layer are subjected to thermo-compression bonding.

22. The semiconductor light emitting device of claim 18, further comprising a metal buffer layer formed on a back side of the substrate including the grooves and a fourth metal layer formed on the metal buffer layer.

23. The semiconductor light emitting device of claim 22, wherein the metal buffer layer is an alloy layer containing Au and the fourth metal layer is made of Au.

24. The semiconductor light emitting device of claim 18, wherein an air gap exists in the grooves between the second metal layer and the third metal layer.

25. The semiconductor light emitting device of claim 18, wherein a width of the grooves is equal to or more than 10 μm and equal to or less than 60 μm.

26. The semiconductor light emitting device of claim 25, wherein a depth of the grooves is equal to or less than the width of the grooves.

27. The semiconductor light emitting device of claim 18, wherein an interval between adjacent grooves among the grooves ranges from 100 μm to 2,000 μm.

28. The semiconductor light emitting device of claim 18, wherein a pattern shape of the grooves includes at least one of a stripe shape, a lattice shape, a dot shape, a spiral shape, and a hexagonal pattern shape.

29. The semiconductor light emitting device of claim 18, wherein the substrate is made of an opaque material.

30. The semiconductor light emitting device of claim 29, wherein the substrate is made of GaAs or Si.

31. The semiconductor light emitting device of claim 18, wherein the substrate includes Ge, SiGe, SiC, or GaN.

* * * * *